United States Patent
Kurita et al.

(10) Patent No.: US 9,922,854 B2
(45) Date of Patent: Mar. 20, 2018

(54) VERTICAL INLINE CVD SYSTEM

(75) Inventors: Shinichi Kurita, San Jose, CA (US); Jozef Kudela, San Jose, CA (US); Suhail Anwar, San Jose, CA (US); John M. White, Hayward, CA (US); Dong-Kil Yim, Sungnam (KR); Hans Georg Wolf, Erlensee (DE); Dennis Zvalo, Santa Clara, CA (US); Makoto Inagawa, Palo Alto, CA (US); Ikuo Mori, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 381 days.

(21) Appl. No.: 13/098,253

(22) Filed: Apr. 29, 2011

(65) Prior Publication Data

US 2012/0031333 A1 Feb. 9, 2012

Related U.S. Application Data

(60) Provisional application No. 61/416,532, filed on Nov. 23, 2010, provisional application No. 61/354,230,
(Continued)

(51) Int. Cl.
*C23C 16/458* (2006.01)
*C23C 16/46* (2006.01)
(Continued)

(52) U.S. Cl.
CPC .... *H01L 21/67712* (2013.01); *C23C 16/4587* (2013.01); *C23C 16/46* (2013.01);
(Continued)

(58) Field of Classification Search
USPC ........... 118/718, 719, 723 MW; 156/345.31, 156/345.32, 345.41; 414/217–222.01,
(Continued)

(56) References Cited

U.S. PATENT DOCUMENTS 4,576,830 A * 3/1986 Kiss .............................. 427/569
4,776,918 A    10/1988 Otsubo et al.
(Continued)

FOREIGN PATENT DOCUMENTS

DE    19628954 A1    1/1998
DE    19739894 A1    3/1999
(Continued)

OTHER PUBLICATIONS

Kanoh et al., "Inductively Coupled Plasma Source with Internal Straight Antenna", Jpn, J. Appl. Phys. vol. 40 (2001) pp. 5419-5423 Part 1, No. 9A, Sep. 2001—© 2001 The Japan Society of Applied Physics.
(Continued)

*Primary Examiner* — Karla A Moore
(74) *Attorney, Agent, or Firm* — Patterson + Sheridan LLP

(57) ABSTRACT

The present invention generally relates to a vertical CVD system having a processing chamber that is capable of processing multiple substrates. The multiple substrates are disposed on opposite sides of the processing source within the processing chamber, yet the processing environments are not isolated from each other. The processing source is a horizontally centered vertical plasma generator that permits multiple substrates to be processed simultaneously on either side of the plasma generator, yet independent of each other. The system is arranged as a twin system whereby two identical processing lines, each with their own processing chamber, are arranged adjacent to each other. Multiple robots are used to load and unload the substrates from the processing system. Each robot can access both processing lines within the system.

10 Claims, 41 Drawing Sheets

Related U.S. Application Data filed on Jun. 13, 2010, provisional application No. 61/330,296, filed on Apr. 30, 2010.

(51) Int. Cl.
| | |
|---|---|
| *C23C 16/511* | (2006.01) |
| *C23C 16/54* | (2006.01) |
| *H01J 37/32* | (2006.01) |
| *H01L 21/67* | (2006.01) |
| *H01L 21/677* | (2006.01) |

(52) U.S. Cl.
CPC .......... *C23C 16/463* (2013.01); *C23C 16/511* (2013.01); *C23C 16/54* (2013.01); *H01J 37/3222* (2013.01); *H01J 37/32192* (2013.01); *H01L 21/6719* (2013.01); *H01L 21/67126* (2013.01); *H01L 21/67173* (2013.01); *H01L 21/67201* (2013.01); *H01J 37/32513* (2013.01); *H01J 37/32522* (2013.01); *H01J 37/32889* (2013.01); *H01J 37/32899* (2013.01); *H01L 21/67098* (2013.01)

(58) Field of Classification Search
USPC .................................................. 414/935–941
See application file for complete search history.

(56) References Cited

U.S. PATENT DOCUMENTS

| | | | | |
|---|---|---|---|---|
| 5,097,794 | A | * | 3/1992 | Mahler et al. ................ 118/719 |
| 5,814,196 | A | * | 9/1998 | Hollars et al. ............ 204/298.15 |
| 6,251,191 | B1 | * | 6/2001 | Matsuse .................. C23C 16/54 |
| | | | | 118/719 |
| 6,517,692 | B1 | * | 2/2003 | Zeberinsh ............. C23C 14/568 |
| | | | | 118/500 |
| 2002/0084033 | A1 | * | 7/2002 | Schieve et al. .......... 156/345.32 |
| 2003/0205328 | A1 | | 11/2003 | Kinnard et al. |
| 2005/0211169 | A1 | | 9/2005 | Choi et al. |
| 2006/0008342 | A1 | | 1/2006 | Putzi |
| 2006/0177288 | A1 | | 8/2006 | Parker et al. |
| 2007/0137793 | A1 | * | 6/2007 | Lee et al. ................. 156/345.31 |
| 2009/0004874 | A1 | | 1/2009 | Sant |
| 2009/0014127 | A1 | | 1/2009 | Shah et al. |
| 2009/0324368 | A1 | * | 12/2009 | Koparal et al. .......... 414/222.01 |
| 2010/0055807 | A1 | | 3/2010 | Srivastava et al. |
| 2010/0243163 | A1 | * | 9/2010 | Ino et al. ................. 156/345.31 |
| 2010/0272550 | A1 | * | 10/2010 | Ishihara et al. ............... 414/777 |
| 2011/0100297 | A1 | * | 5/2011 | Shimizu et al. .......... 118/723 E |

FOREIGN PATENT DOCUMENTS

| | | | |
|---|---|---|---|
| DE | 10114115 A1 | | 10/2002 |
| JP | 06069316 A | * | 3/1994 |
| JP | 2001-126899 A | | 5/2001 |
| JP | 2001126899 A | * | 5/2001 |
| JP | 2003086581 A | | 3/2003 |
| JP | 2004-186531 A | | 7/2004 |
| JP | 2005206852 A | * | 8/2005 |
| JP | 2005340425 A | * | 12/2005 |
| JP | 2006-128000 A | | 5/2006 |
| JP | 2006-278643 A | | 10/2006 |
| JP | 2009-054997 A | | 3/2009 |
| JP | 2009-130154 A | | 6/2009 |
| KR | 10-2003-0081074 | | 10/2003 |
| KR | 10-2004-0010228 | | 1/2004 |
| KR | 10-2004-0049271 | | 6/2004 |
| KR | 10-0667866 B1 | * | 1/2007 |
| KR | 10-0667886 B1 | * | 1/2007 |
| KR | 667886 | * | 1/2007 |
| WO | WO 2009044526 A1 | * | 4/2009 |
| WO | WO 2009050849 A1 | * | 4/2009 |
| WO | 2009/117229 A2 | | 9/2009 |
| WO | WO 2009148081 A1 | * | 12/2009 |
| WO | WO 2010000503 A1 | * | 1/2010 |

OTHER PUBLICATIONS

Walker, et al., "Silicon oxide films from the Plasmodul®", Vacuum 57 (2000) 387-397.
Kyong et al., Characteristics of Parallel Internal-Type Inductively Coupled Plasmas for Large Area Flat Panel Dsiplay Processing, Japanese Journal of Appliced Physics, vol. 43, No. 7A, 2004, pp. 4373-4375—© 2004 The Japan Society of Applied Physics.
E. Räuchle, "Duo-plasmaline, a surface wave sustained linearly extended discharge", *J. Phys. IV France 8 (1998)*, Pr7-99.
Moisan, et al., "The Development and Use of Surface-Wave Sustained Discharges for Applications", *Groupe de physique des plasmas, Université de Montreàl H3C 3J7*, Québec.
Sugai, et. al, "High-density flat plasma production based on surface waves", Plasma Sources Sci. Technol. 7 (1998) 192-205. Printed in the UK.
Andre Anders, "Plasma and Ion Sources in Large Area Coatings: A Review", Lawrence Berkeley National Laboratory, Year 2005, Paper LBNL57127.
Takeuchi et al., Characteristics of Very-High-Frequency-Excited $SiH_4$ Plasmas using a Ladder-Shaped Electrode, Jpn. J. Appl. Phys. vol. 40 (2001) pp. 3405-3408, Part 1, No. 5A, May 2001, © 2001 The Japan Society of Applied Physics.
International Search Report and Written Opinion for PCT/US2011/034623 dated Dec. 19, 2011.
International Search Report and Written Opinion for PCT/US2011/034619 dated Jan. 12, 2012.
Chinese Office Action dated Jan. 26, 2016, for Chinese Patent Application No. 2011800216142.
Korean Office Action dated May 11, 2017, for Korean Patent Application No. 10-2012-7031556.
Korean Office Action dated May 23, 2017, for Korean Patent Application No. 10-2012-7031554.

* cited by examiner

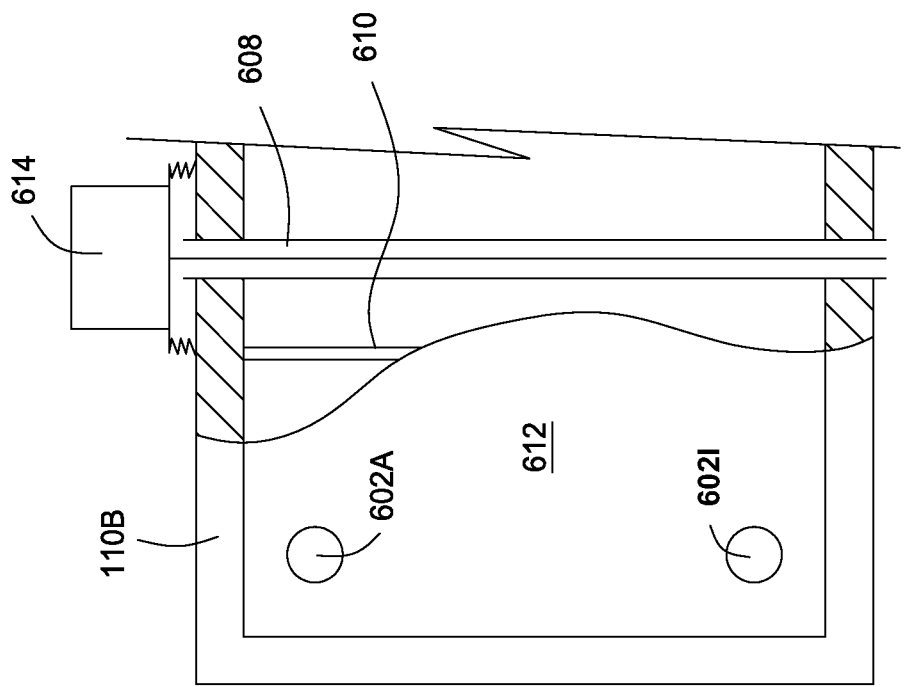
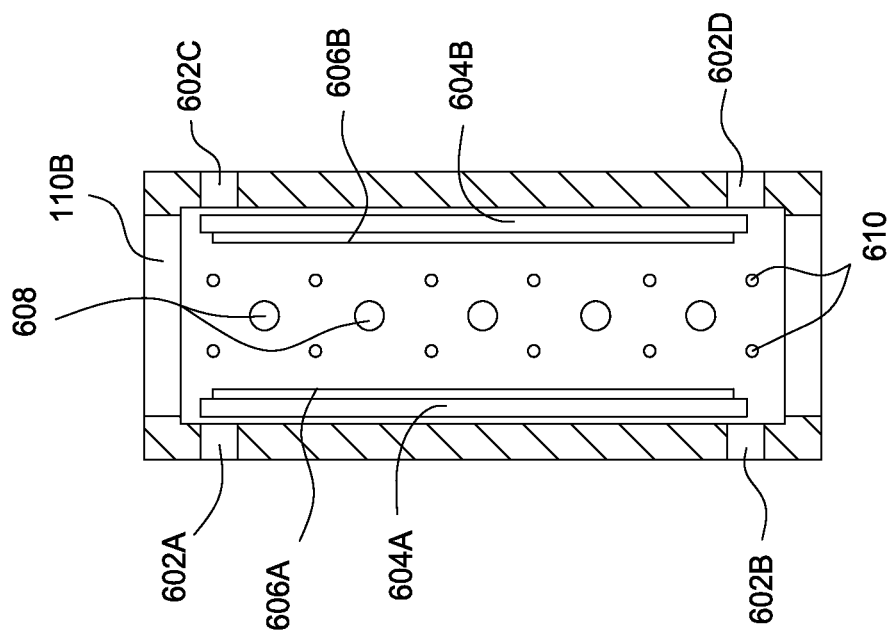
FIG. 6B
FIG. 6A

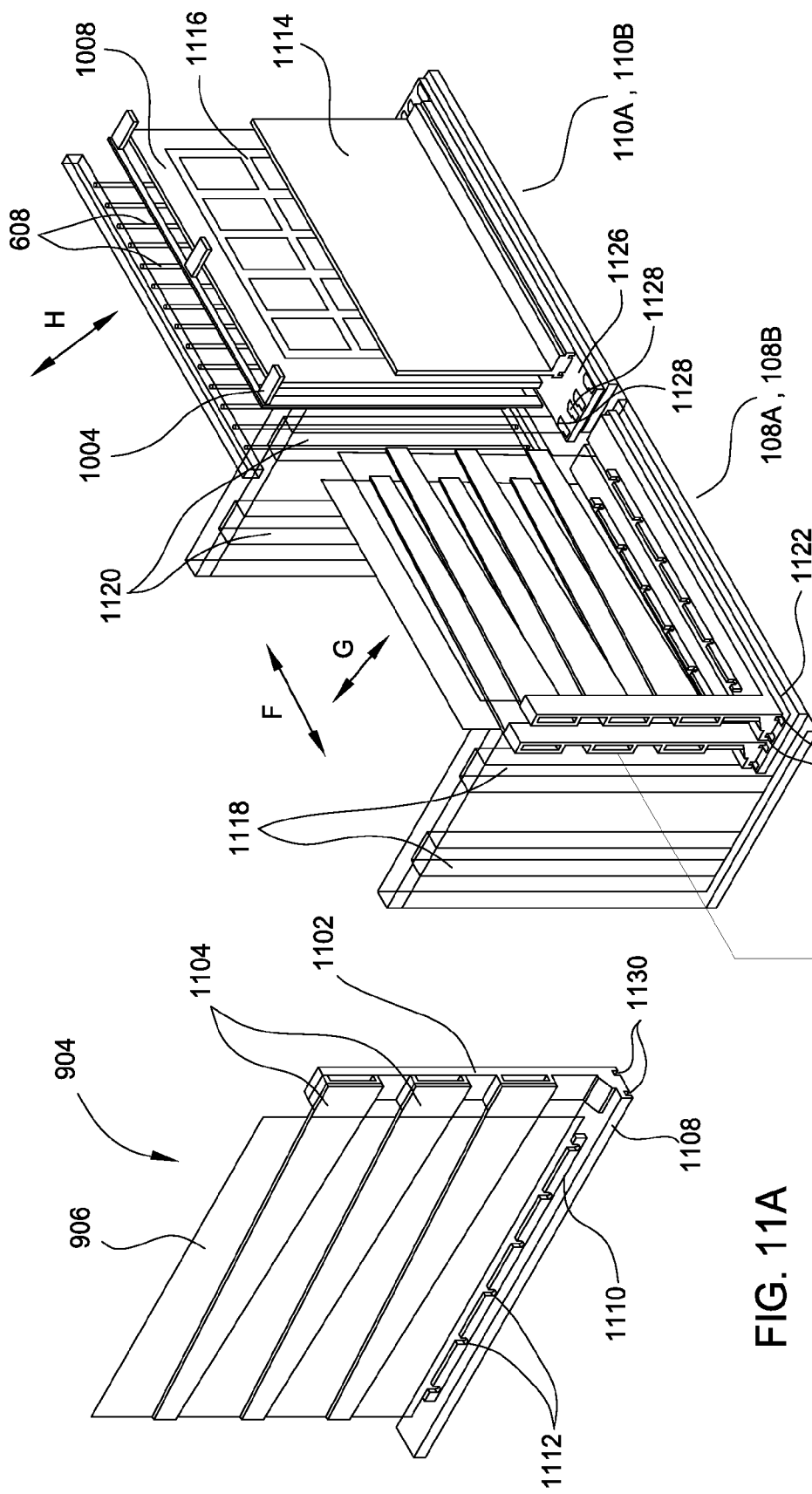

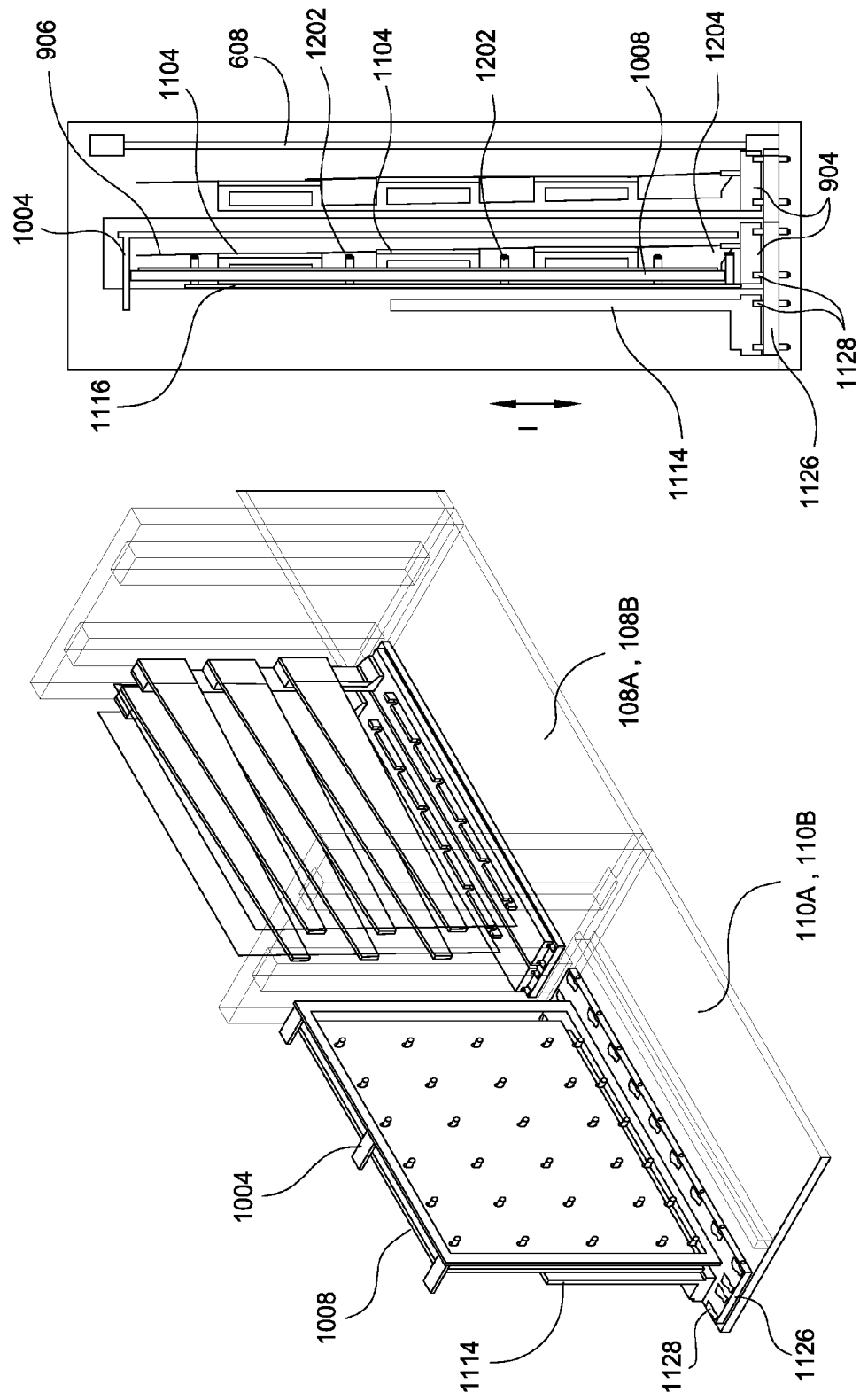

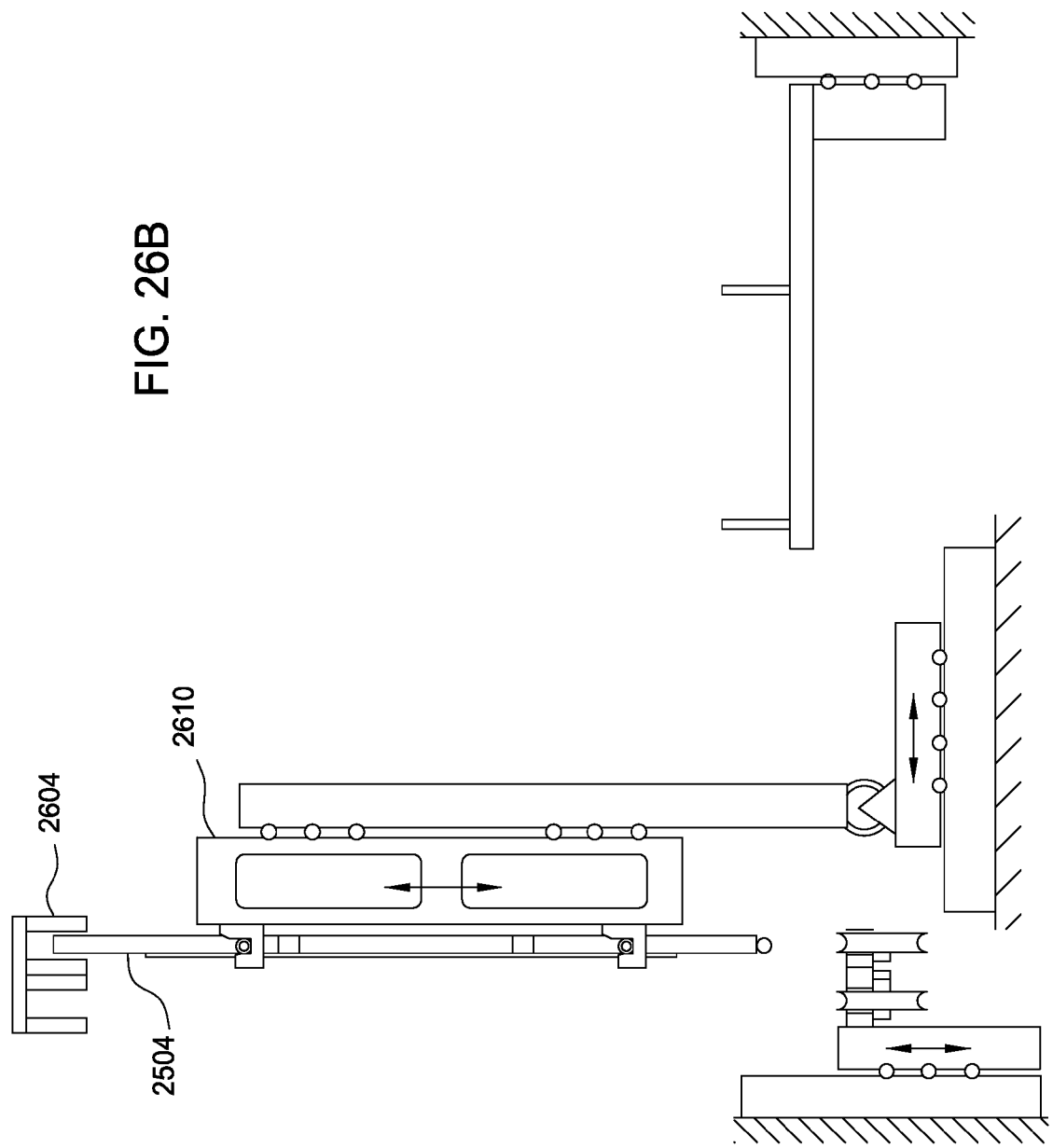

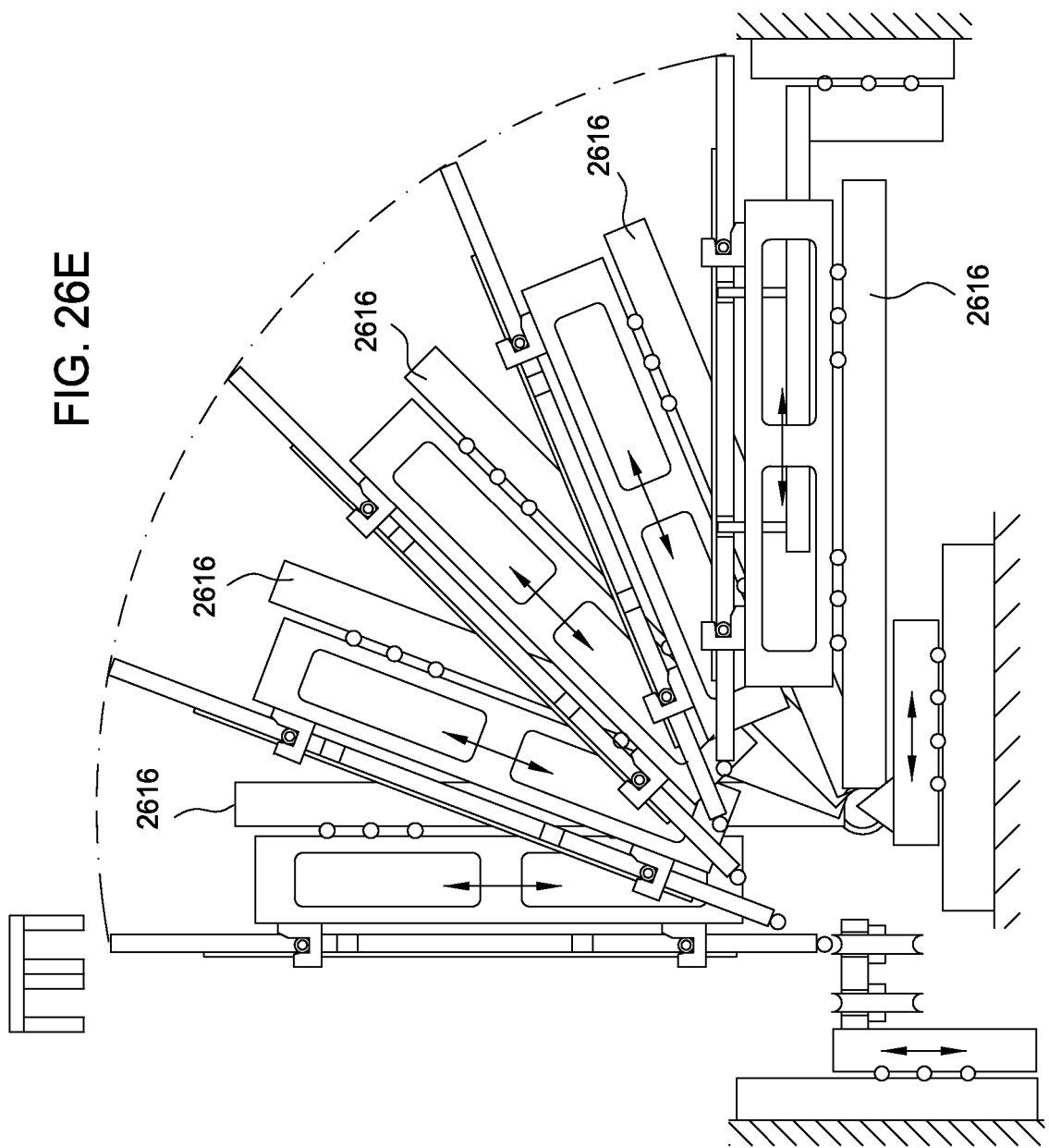

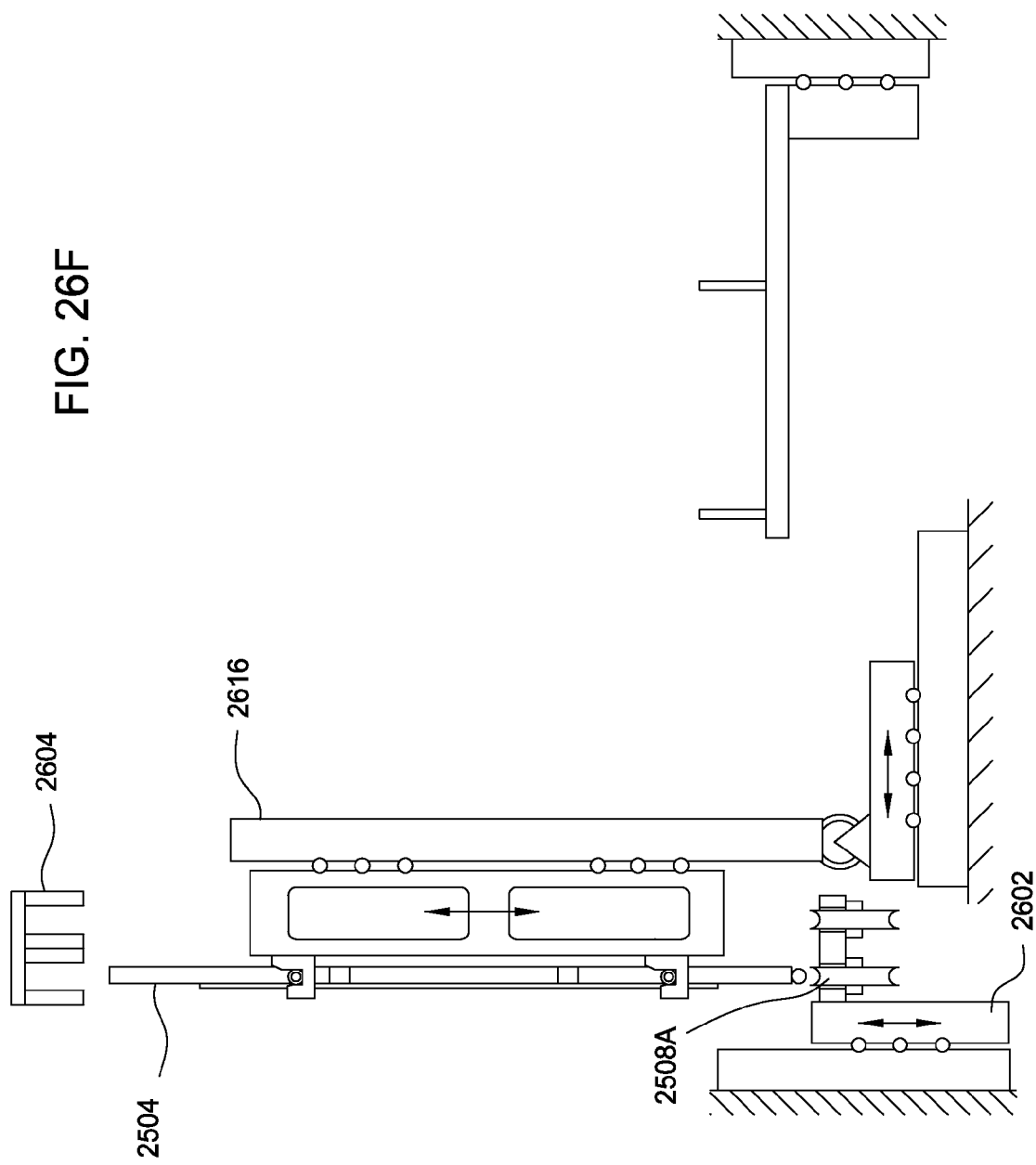

VERTICAL INLINE CVD SYSTEM

CROSS REFERENCE TO RELATED APPLICATION

This application claims priority to U.S. Provisional Patent Application Ser. No. 61/416,532, filed Nov. 23, 2010, U.S. Provisional Patent Application Ser. No. 61/354,230, filed Jun. 13, 2010, and U.S. Provisional Patent Application Ser. No. 61/330,296, filed Apr. 30, 2010 each of which are incorporated by reference in their entirety.

BACKGROUND OF THE INVENTION

Field of the Invention

Embodiments of the present invention generally relate to a vertical chemical vapor deposition (CVD) system.

Description of the Related Art

CVD is a process whereby chemical precursors are introduced into a processing chamber, chemically react to form a predetermined compound or material, and deposited onto a substrate within the processing chamber. There are several CVD processes. One CVD process is plasma enhanced chemical vapor deposition (PECVD) whereby a plasma is ignited in the chamber to enhance the reaction between the precursors. PECVD may be accomplished by utilizing an inductively coupled plasma source or a capacitively coupled plasma source.

The CVD process may be used to process large area substrates, such as flat panel displays or solar panels. CVD may be used to deposit layers such as silicon based films for transistors. There is a need in the art for a method and apparatus that reduces the cost of manufacturing flat panel display devices.

SUMMARY OF THE INVENTION

The present invention generally relates to a vertical CVD system having a processing chamber that is capable of processing multiple substrates. The multiple substrates are disposed on opposite sides of the processing source within the processing chamber, yet the processing environments are not isolated from each other. The processing source is a horizontally centered vertical plasma generator that permits multiple substrates to be processed simultaneously on either side of the plasma generator, yet independent of each other. The system is arranged as a twin system whereby two identical processing lines, each with their own processing chamber, are arranged adjacent to each other. Multiple robots are used to load and unload the substrates from the processing system. Each robot can access both processing lines within the system.

In one embodiment, an apparatus is disclosed. The apparatus includes a substrate loading station, a robot operable to retrieve a substrate from a substrate stacking module and to place the substrate into the substrate loading station, a load lock chamber coupled to the substrate loading station. The load lock chamber has two substrate locations that are disposed on opposite sides of a center wall and a processing chamber coupled to the load lock chamber. The substrate loading station has two substrate loading locations that are disposed on opposite sides of a center wall. The processing chamber has two substrate loading locations that are disposed on opposite sides of one or more processing sources.

In another embodiment, an apparatus is disclosed. The apparatus includes two substrate loading stations, two robots operable to retrieve a substrate from a substrate stacking module, two load lock chambers, and two processing chambers. Each substrate loading station has two substrate loading locations that are disposed on opposite sides of a center wall. Each robot is operable to place a substrate into each substrate loading station. Each load lock chamber is coupled to a corresponding substrate loading station, each load lock chamber having two substrate locations that are disposed on opposite sides of a center wall. Each processing station is coupled to a corresponding load lock chamber, each processing chamber having two substrate loading locations that are disposed on opposite sides of one or more processing sources.

In another embodiment, a method includes retrieving a first substrate from a first substrate stacking module using a first robot, placing the first substrate into a first substrate loading station in a first location, retrieving a second substrate from the first substrate stacking module using the first robot, placing the second substrate into a second substrate loading station in a second location separate from the first substrate loading station, retrieving a third substrate from a second substrate stacking module using a second robot, placing the third substrate into the first substrate loading station in a third location separate from the first location, retrieving a fourth substrate from the second substrate stacking module using the second robot and placing the fourth substrate into the second substrate loading station in a fourth location separate from the second location.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 6A is a schematic cross-sectional view of the processing chamber of FIG. 1.

FIG. 6B is a partial side view of the processing chamber of FIG. 1.

FIGS. 11A and 11B are schematic representations of the substrate carrier utilized in processing system of FIG. 1.

FIGS. 12A and 12B are schematic representations showing the transfer of the substrate from the load lock chamber to the processing chamber for the processing system of FIG. 1.

FIGS. 26A-G are schematic representations of an atmospheric loading/unloading station.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present invention generally relates to a vertical CVD system having a processing chamber that is capable of processing multiple substrates. The multiple substrates are disposed on opposite sides of the processing source within the processing chamber, yet the processing environments are not isolated from each other. The processing source is a horizontally centered vertical plasma generator that permits multiple substrates to be processed simultaneously on either side of the plasma generator, yet independent of each other. The system is arranged as a twin system whereby two identical processing lines, each with their own processing chamber, are arranged adjacent to each other. Multiple robots are used to load and unload the substrates from the processing system. Each robot can access both processing lines within the system.

A horizontally centered vertical plasma generator is a plasma generator that has a plasma source that is vertical within the processing chamber. By vertical it is understood that the plasma source extends from a first end near or at the bottom of the chamber to a second end at near or at the top of the chamber. By being horizontally centered it is understood that the plasma source is equally spaced between two walls or ends of the processing chamber.

The embodiments discussed herein may be practiced utilizing a vertical CVD chamber in a modified AKT Aristo system available from Applied Materials, Inc., Santa Clara, Calif. It is to be understood that the embodiments may be practiced in other systems as well, including those sold by other manufacturers.

Figure 1:
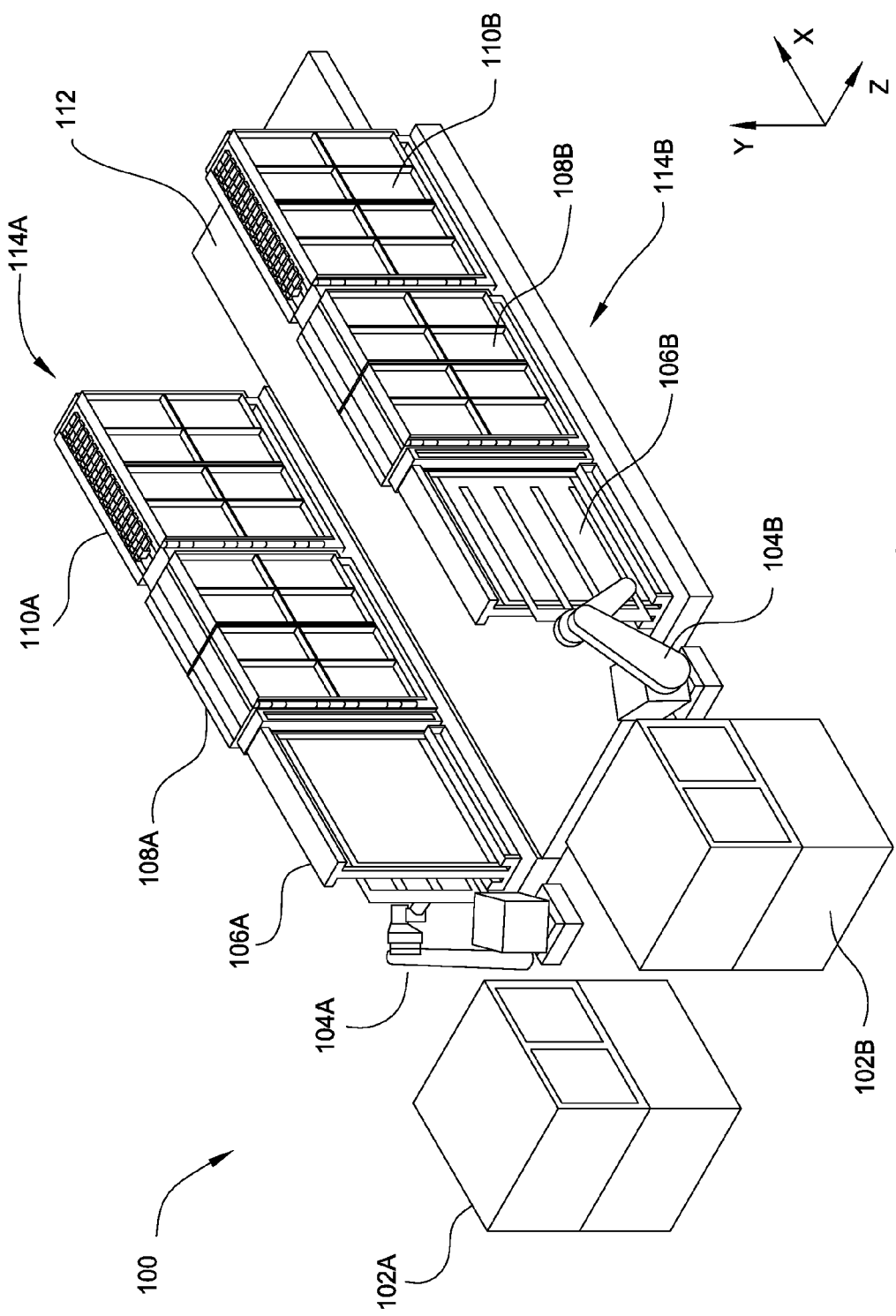
FIG. 1 is a schematic representation of a processing system according to one embodiment.

FIG. 1 is a schematic representation of a vertical, linear CVD system 100 according to one embodiment. The system 100 may be sized to process substrates having a surface area of greater than about 90,000 mm$^2$ and able to process more than 90 substrates per hour when depositing a 2,000 Angstrom thick silicon nitride film. The system 100 preferably includes two separate process lines 114A, 114B coupled together by a common system control platform 112 to form a twin process line configuration/layout. A common power supply (such as an AC power supply), common and/or shared pumping and exhaust components and a common gas panel may be used for the twin process lines 114A, 114B. Each process line 114A, 114B may process more than 45 substrates per hour for a system total of greater than 90 substrates per hour. It is also contemplated that the system may be configured using a single process line or more than two process lines.

There are several benefits to the twin processing lines 114A, 114B for vertical substrate processing. Because the chambers are arranged vertically, the footprint of the system 100 is about the same as a single, conventional horizontal processing line. Thus, within approximately the same footprint, two processing lines 114A, 114B are present, which is beneficial to the manufacturer in conserving floor space in the fab. To help understand the meaning of the term "vertical", consider a flat panel display. The flat panel display, such as a computer monitor, has a length, a width and a thickness. When the flat panel display is vertical, either the length or width extends perpendicular from the ground plane while the thickness is parallel to the ground plane. Conversely, when a flat panel display is horizontal, both the length and width are parallel to the ground plane while the thickness is perpendicular to the ground plane. For large area substrates, the length and width are many times greater than the thickness of the substrate.

Each processing line 114A, 114B includes a substrate stacking module 102A, 102B from which fresh substrates (i.e., substrates which have not yet been processed within the system 100) are retrieved and processed substrates are stored. Atmospheric robots 104A, 104B retrieve substrates from the substrate stacking modules 102A, 102B and place the substrates into a dual substrate loading station 106A, 106B. It is to be understood that while the substrate stacking module 102A, 102B is shown having substrates stacked in a horizontal orientation, substrates disposed in the substrate stacking module 102A, 102B may be maintained in a vertical orientation similar to how the substrates are held in the dual substrate loading station 106A, 106B. The fresh substrates are then moved into dual substrate load lock chambers 108A, 108B and then to a dual substrate processing chamber 1010A, 1010B. The substrate, now processed, then returns through one of the dual substrate load lock chambers 108A, 108B to one of the dual substrate loading stations 106A, 106B, where it is retrieved by one of the atmospheric robot 104A, 104B and returned to one of the substrate stacking modules 102A, 102B.

Figure 2:
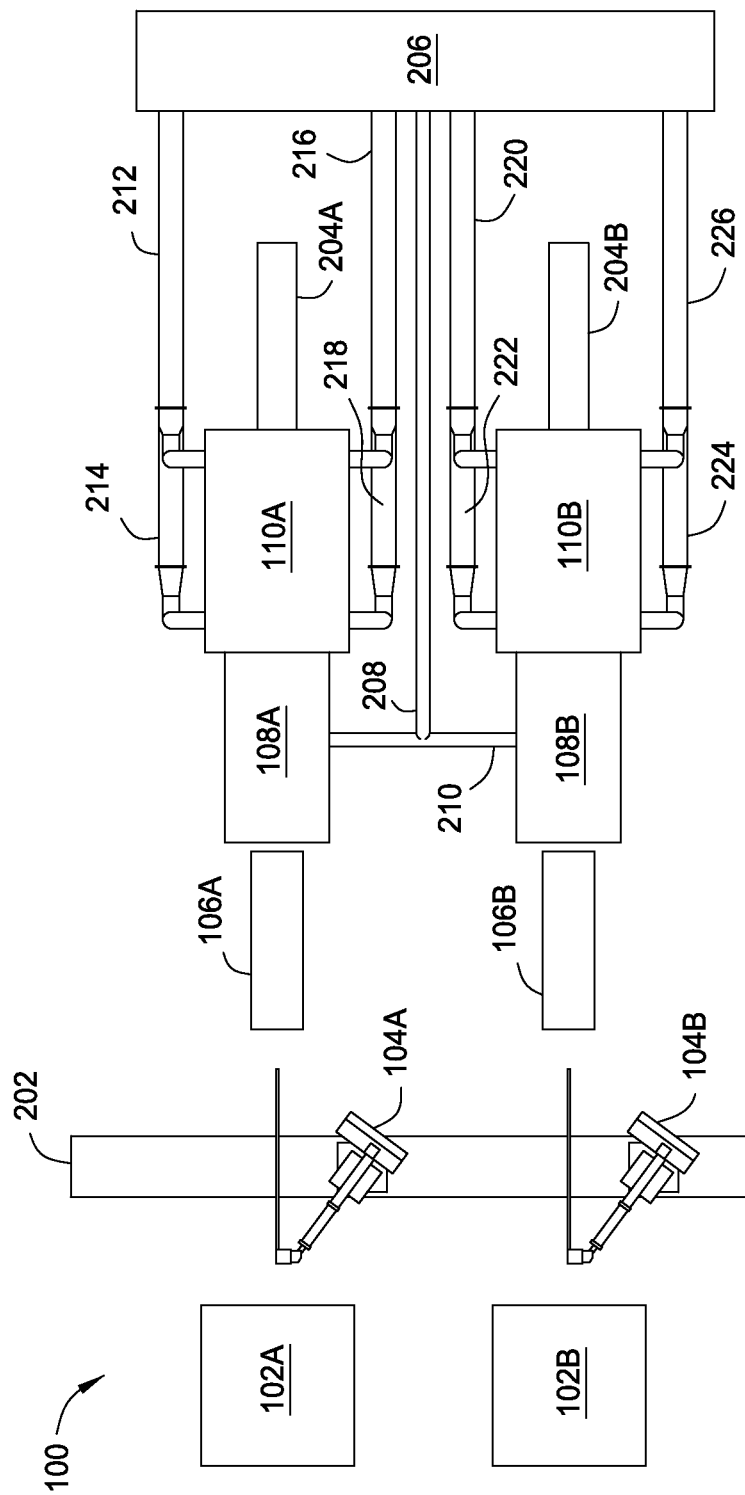
FIG. 2 is a schematic top view of the processing system of FIG. 1.

FIG. 2 is a plan view of the embodiment of FIG. 1. The sequence will be discussed in reference to both processing lines 114A, 114B at the same time even though a substrate goes down only one path. Each robot 104A, 104B may move along a common track 202. As will be discussed below, each robot 104A, 104B may access both substrate loading stations 106A, 106B. Occasionally, the substrate carrier that is used to transport the substrates through the processing lines 114A, 114B will need to be serviced for purposes of repair, cleaning, or replacement. Thus, substrate carrier service stations 204A, 204B are coupled to the processing chambers 110A, 110B along the processing lines 114A, 114B opposite the load lock chambers 108A, 108B.

To evacuate the load lock chambers 108A, 108B as well as the processing chambers 110A, 110B, one or more vacuum pumps 206 may be coupled thereto. To evacuate the load lock chambers 108A, 108B, the vacuum pump 206 draws the vacuum from an evacuation line 210 that is coupled to both load lock chambers 106A, 106B. To evacuate the processing chambers 110A, 110B, evacuation lines 212, 214, 216, 218, 220, 222, 224, 226 are coupled to the processing chambers 110A, 110B. The evacuation of the load lock chambers 108A, 108B and processing chambers 110A, 110B will be discussed further below with reference to FIG. 7.

Figure 3:
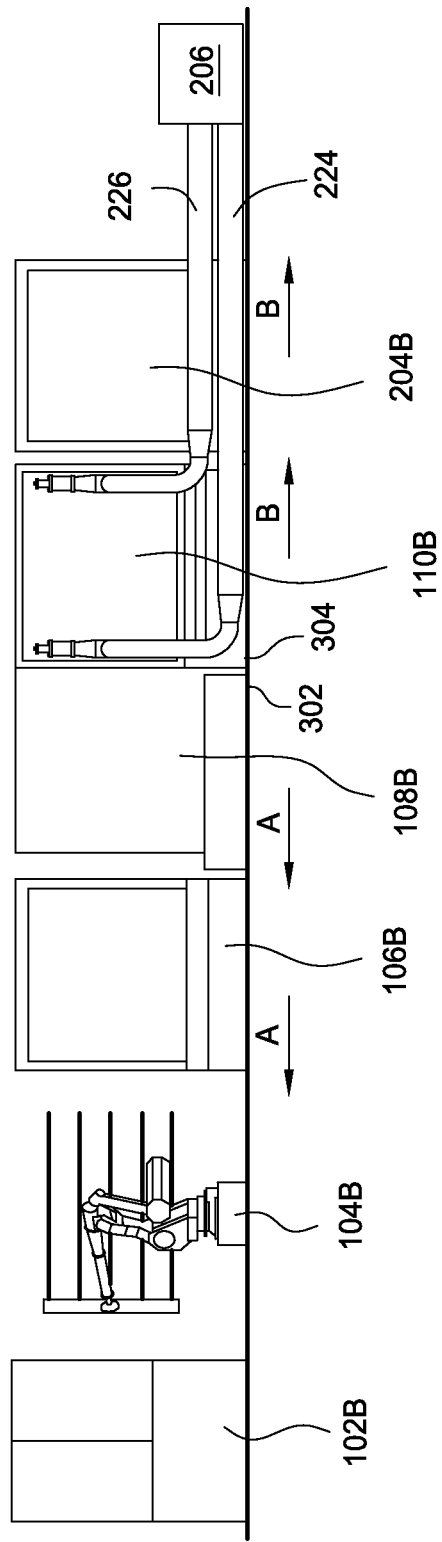
FIG. 3 is a schematic side view of the processing system of FIG. 1.

FIG. 3 is a side view of the system 100. During operation, the processing chambers 110A, 110B may raise in temperature and thus be subject to thermal expansion. Similarly, substrates with elevated temperatures may enter the load lock chambers 108A, 108B from the processing chambers 110A, 110B which may cause the load lock chambers 108A, 108B to experience thermal expansion. To compensate for the thermal expansion of the load lock chambers 108A, 108B, the load lock chambers 108A, 108B may have the end 302 that is adjacent the processing chambers 110A, 110B fixed yet permit the remainder of the load lock chamber 108A, 108B, as well as the adjacent substrate loading station 106A, 106B to move in the direction shown by arrow "A". Similarly, the processing chambers 110A, 110B may have an end 304 fixed adjacent the load lock chambers 108A, 108B while the other end of the processing chamber 110A, 110B as well as the substrate carrier service stations 204A, 204B may move in the direction shown by arrow "B" by thermal expansion. As the processing chambers 110A, 110B expand due to thermal expansion, the substrate carrier service stations 204A, 204B also move to permit the processing chambers 110A, 110B to expand. If the substrate carrier service stations 110A, 110B did not move as the processing chambers 110A, 110B expanded, the processing lines 114A, 114B could buckle much like a railroad track on a hot summer day. Similarly, as the load lock chambers 108A, 108B expand, the substrate loading stations 106A, 106B also move to permit the load lock chambers 108A, 108B to expand.

Figure 4:
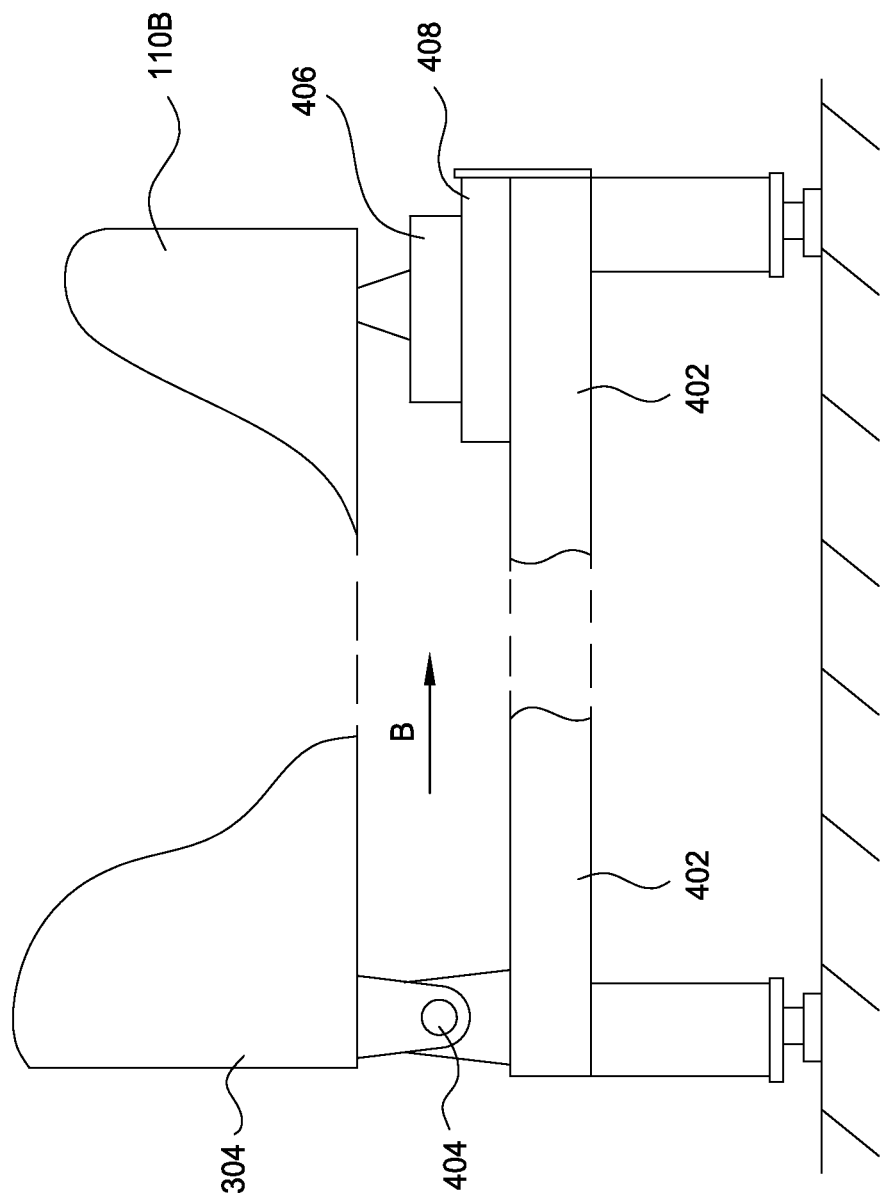
FIG. 4 is a close-up view of the processing chamber of FIG. 1.

FIG. 4 is a close-up view of the processing chamber 110B showing the equipment that permits the processing chamber 110B to move due to thermal expansion. It is to be understood that while the description will be made with reference to the processing chamber 110B, the description will be equally applicable to the load lock chamber 108B. The processing chamber 110B is disposed over a frame 402. The end 304 of the processing chamber 110B has a fixed point 404 and a foot portion 406 that may move along a piece of low friction material 408 that is disposed on the frame 402. Suitable material that may be used for the low friction material 408 includes polytetrafluoroethylene. It is to be understood that other low friction materials are also contemplated. It is to be understood that both the substrate carrier service stations 204A, 204B as well as the substrate loading stations 106A, 106B will have foot portions disposed over a frame having low friction material to permit the substrate carrier service stations 204A, 204B and the substrate loading stations 106A, 106B to move.

Figure 5:
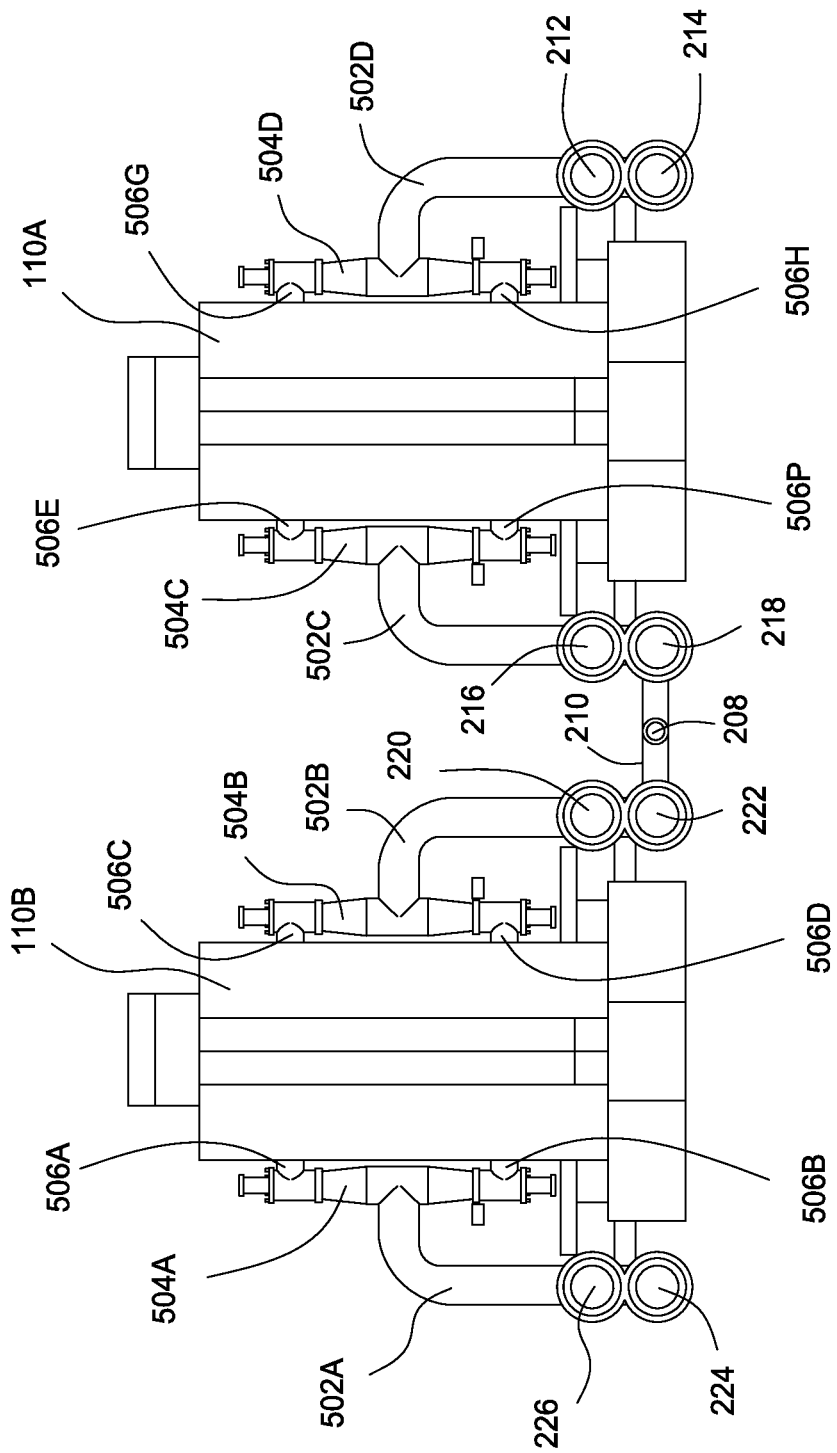
FIG. 5 is a schematic back view of the processing system of FIG. 1.

FIG. 5 is a back elevation view of the processing system 100 showing the evacuation system. FIGS. 6A and 6B are top and partial side views of the processing chamber 110B showing the evacuation locations for connecting the vacuum system thereto. The evacuation lines 212, 214, 216, 218, 220, 222, 224, 226 each have a vertical conduit 502A-502D that then couples to a splitter conduit 504A-504D. Each splitter conduit 504A-504D has two connection points 506A-506H that couple to the processing chamber 110A, 110B. Thus, there are four connection points for each side of each processing chamber 110A, 110B.

FIG. 6A shows the connection points 602A-602D for processing chamber 110B. The processing chamber 110B is shown to have two substrate carriers 604A, 604B, each having a substrate 606A, 606B thereon. Plasma generators 608 are centrally located as are the gas introduction conduit 610. The plasma generators 608 are microwave sources that generate a plasma within the processing chambers 110A, 110B for CVD. The plasma generators 608 are powered by power sources 614. As shown in FIG. 6B, the connection points 602A, 602I are disposed near the corners of the chamber lid 612. Because the connection points 602A-602D are disposed near the corners of the processing chamber 110B, the processing chamber 110B may be evacuated substantially uniformly in all areas of the chamber 110B. If only one evacuation point were utilized, there may be greater vacuum near the evacuation point as compared to a location further away. It is contemplated that other evacuation connections are possible, including additional connections.

Figure 7:
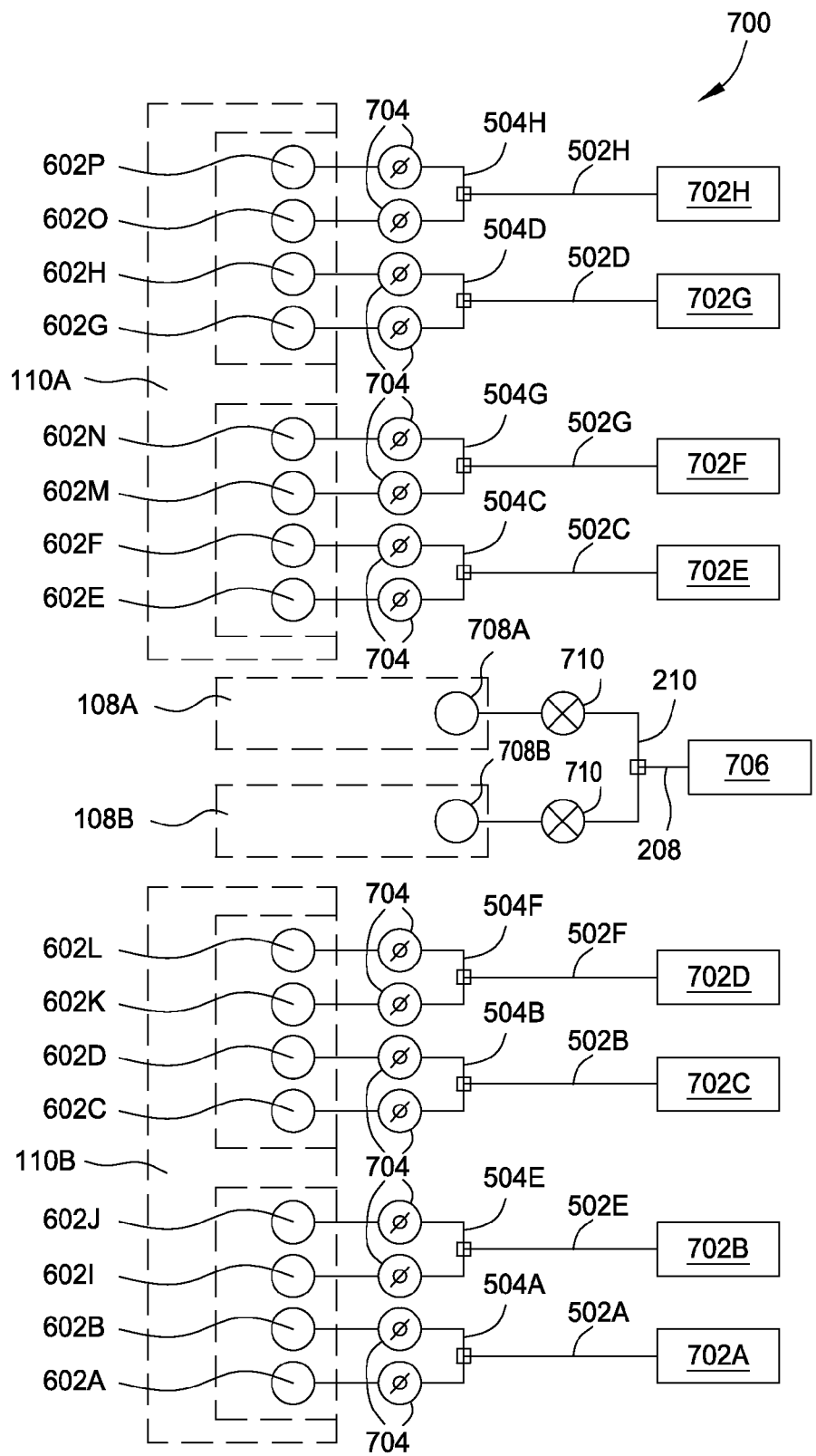
FIG. 7 is a schematic illustration of an evacuation system for the processing system of FIG. 1.

FIG. 7 is a schematic illustration of the evacuation system 700 according to one embodiment. Rather than a single vacuum pump, each processing chamber 110A, 110B may have several vacuum pumps 702A-702H. Each vertical line 502A-502H splits into the splitter conduits 504A-504H before coupling to the connection points 602A-602P. A throttle valve 704 may be positioned between the connection points 602A-602P and the splitter conduits 504A-504H to control the vacuum level for the respective processing chambers 110A, 110B. It is to be understood that the evacuation system 700 is applicable to a system with fewer vacuum pumps. If one of the vacuum pumps coupled to a processing chamber does not function, it is possible for the other vacuum pumps coupled to the processing chamber to compensate for the non-functioning pump so that the processing chamber may maintain a predetermined vacuum level.

The load lock chambers 108A, 108B may be evacuated by a common vacuum pump 706 coupled to the connection points 708A, 708B of the load lock chambers 108A, 108B. A two way valve 710 may be present between the vacuum pump 706 and the connection points 708A, 708B to control the vacuum level of the load lock chambers 108A, 108B.

Figure 8:
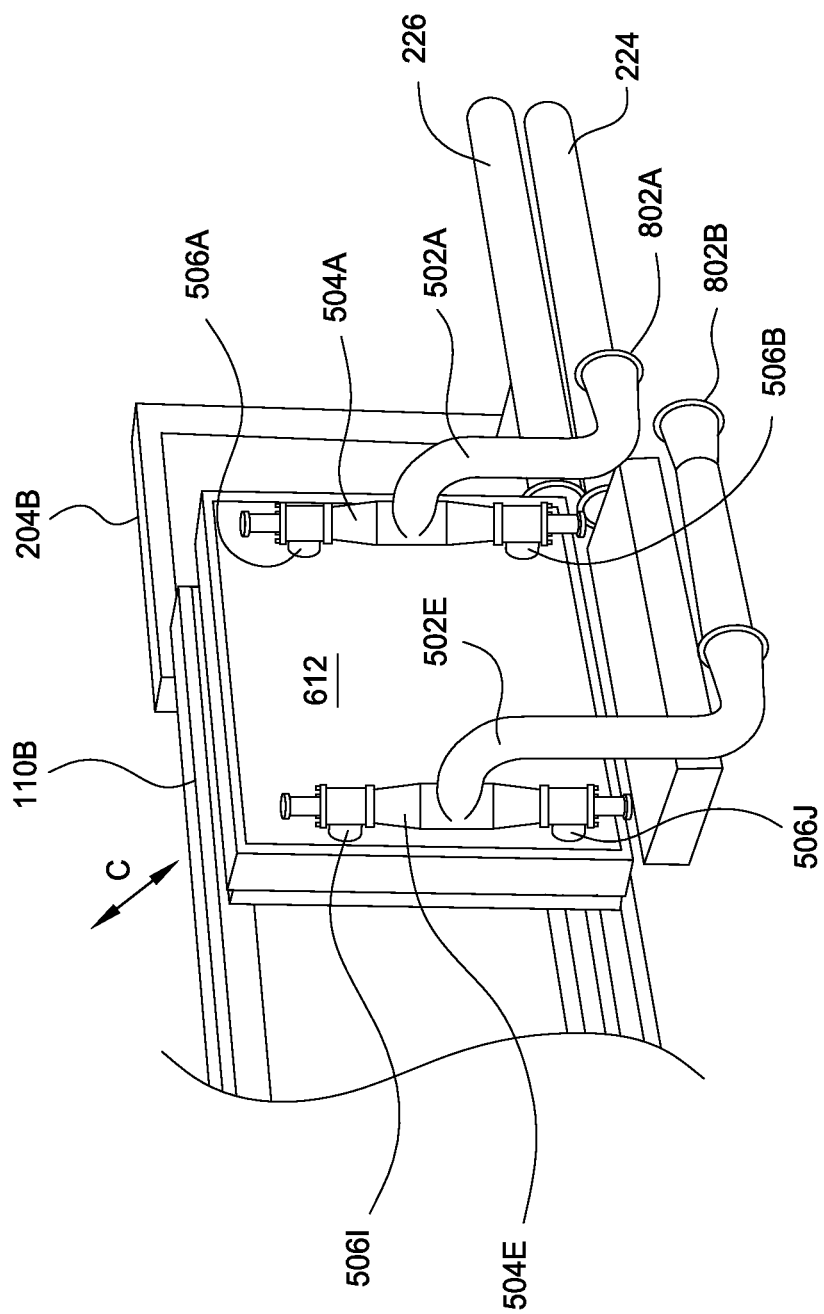
FIG. 8 is an isometric view of the processing chamber of FIG. 1.

FIG. 8 is a side perspective view of a chamber lid 612 spaced from the processing chamber 110B. In order to service the processing chamber 110B, the lid 612 may be moved as shown by arrows "C" by disconnecting the vertical conduits 502A, 502E from the evacuation lines 224, 226 at points 802A, 802B. Thus, the lid 612 may be moved without having to disassemble the entire evacuation system 700 or moving numerous, heavy system components. The lid 612 may be moved by sliding the lid 612 away from the processing chamber 110B using a movement device such as a crane or hydraulic lifts.

Figure 9:
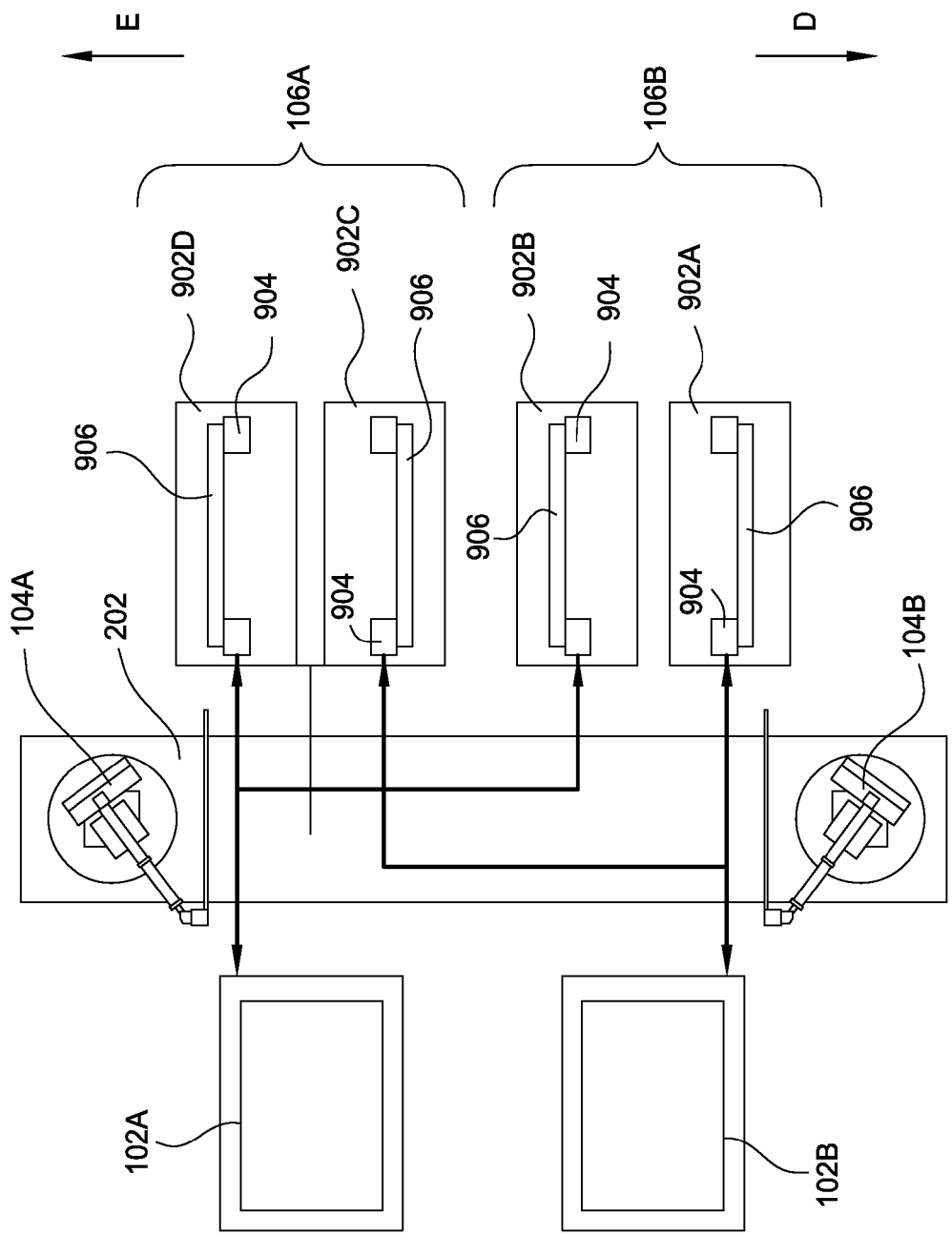
FIG. 9 is a schematic top illustration of the substrate sequencing for the processing system of FIG. 1.

FIG. 9 illustrates the sequence for the robots 104A, 104B removing substrates 906 from the substrate stacking modules 102A, 102B and placing the substrates 906 into the substrate loading station environments 902A-902D. The substrate loading stations 106A, 106B are shown to have two separate environments 902A-902D defined by a center wall 1301 (See FIG. 13). In each environment, the substrate carrier 906 faces a different direction. Thus, when the substrates 906 are disposed within the substrate loading station environments 902A-902D, the substrates 906 are spaced apart by the carriers 904 within each separate substrate loading station 106A, 106B.

Robot 104A retrieves a substrate 906 from the substrate stacking module 102A and moves along the track 202 to place the substrate 906 in either environment 902B or 902D. When the robot 104A places the substrate 906 in an environment 902B, 902D, the substrate 906 is placed on a carrier 904 such that the substrate 906 faces the direction of arrow "E" away from the carrier 904. Similarly, robot 104B retrieves a substrate 906 from the substrate stacking module 102B and moves along the track 202 to place the substrate 906 in either environment 902A, 902C. When the robot 104B places the substrate 906 in an environment 902A, 902C, the substrate 906 is placed on a carrier 904 such that the substrate 906 faces in the direction of arrow "D" away from the carrier 904. Thus, both robots 104A, 104B can access the same substrate loading station 106A, 106B and move along the same track 202. However, each robot 104A, 104B accesses a separate environment 902A-902D of the substrate loading stations 106A, 106B and can only place the substrates 906 on respective carriers 904 facing a specific direction.

Figure 10B:
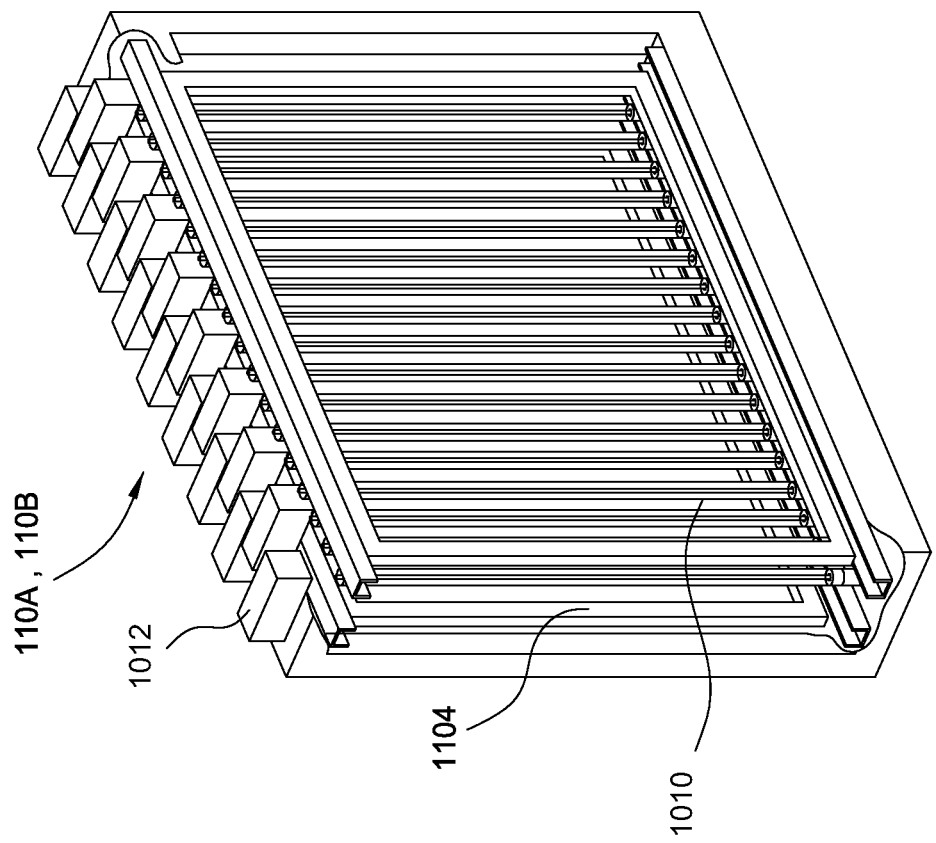
FIGS. 10A-10C are schematic representations of the processing chambers of FIG. 1.
Figure 10A:
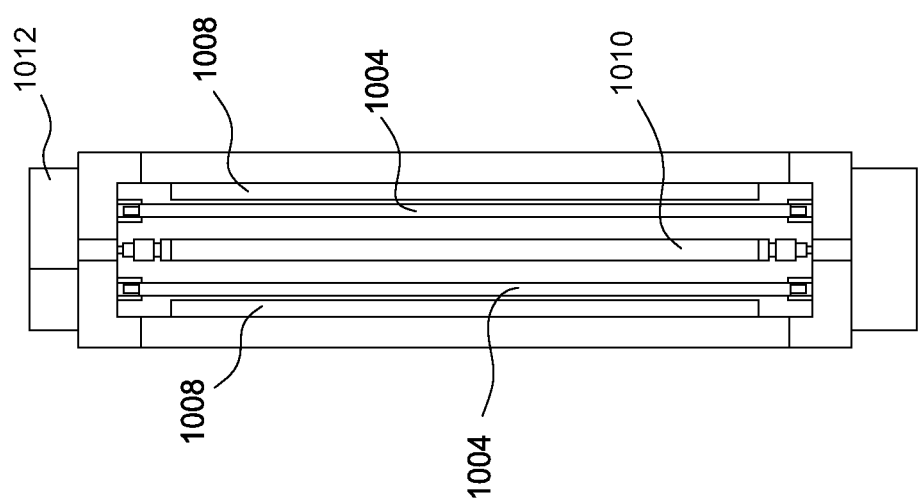
Figure 10C:
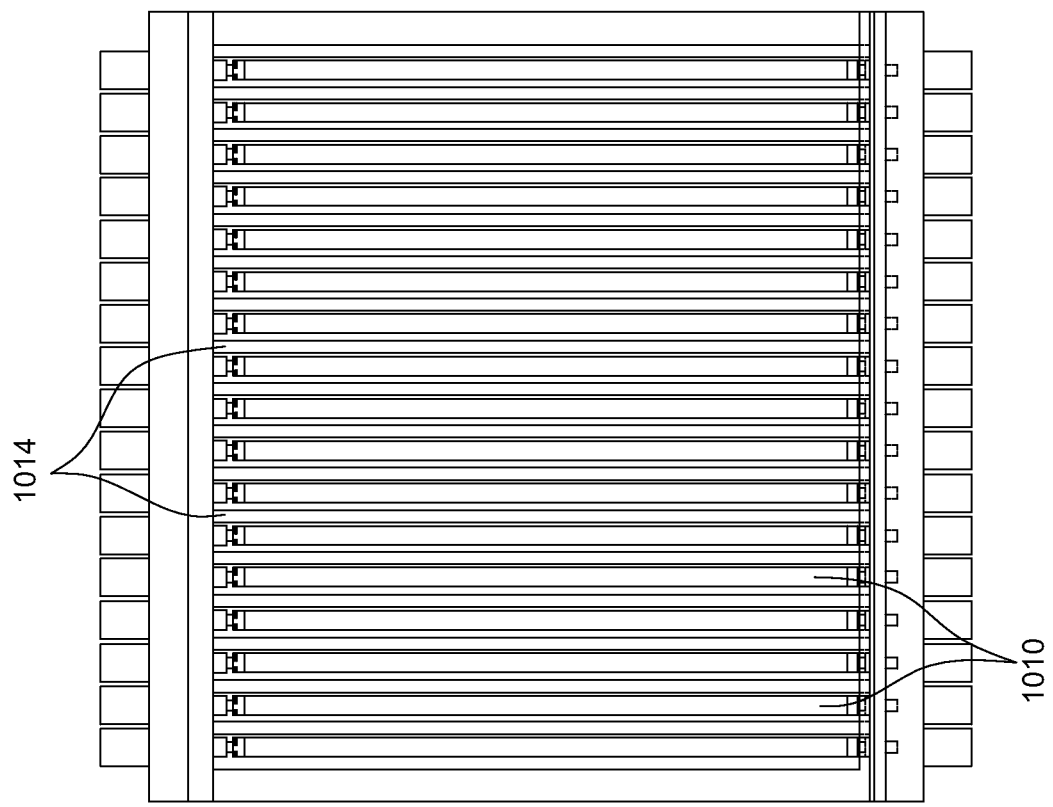

FIGS. 10A-10C are schematic representations of the dual processing chambers 110A, 110B according to one embodiment. The dual processing chambers 110A, 110B include a plurality of microwave antennas 1010 disposed in a linear arrangement in the center of each processing chamber 110A, 110B. The antennas 1010 extend vertically from a top of the processing chamber to a bottom of the processing chamber. Each microwave antenna 1010 has a corresponding microwave power head 1012 at both the top and the bottom of the processing chamber that is coupled to the microwave antenna 1010. As shown in FIG. 10B, the microwave power heads 1012 are staggered. The staggering may be due to space limitations. Power may be independently applied to the each end of the antenna 1010 through each power head 1012. The microwave antennas 1010 may operate at a frequency within a range of 300 MHz and 300 GHz.

Each of the processing chambers are arranged to be able to process two substrates, one on each side of the microwave antennas 1010. The substrates are held in place within the processing chamber by a platen 1008 and a shadow frame 1004. Gas introduction tubes may 1014 are disposed between adjacent microwave antennas 1010. The gas introduction tubes 1014 extend vertically from the bottom to the top of the processing chamber parallel to the microwave antennas 1010. The gas introduction tubes 1014 permit the introduction of processing gases, such as silicon precursors and nitrogen precursors. While not shown in FIGS. 10A-10C, the processing chambers 110A, 110B may be evacuated through a pumping port located behind the substrate carriers 1008.

FIGS. 11A and 11B are schematic illustrations of a substrate carrier 904 used to move the substrates between the load lock chambers 108A, 108B and the processing chambers 110A, 110B. A substrate 906 is placed on the substrate carrier 904 by a robot 104A, 104B while the substrate carrier 904 is in a loading station 106A, 106B. The substrate carrier 904 includes a flat bed base portion 1108 and a trunk 1102 extending perpendicular to the flat bed base portion 1108. The flat bed base portion 1108 has an alignment rail 1110 upon which the substrate 906 rests during transport. The alignment rail 1110 has a plurality of notches 1112. The notches 1112 are utilized to permit a lifting pin to engage the substrate 906 and remove the substrate 906 from the substrate carrier 904. Three fingers 1104 are present that extend perpendicular from the trunk 1102. In one embodiment, the fingers 1104 may be fabricated from carbon fiber material. The substrate 906, when carried on the substrate carrier 904, is inclined such that the substrate 904 is positioned on the carrier 904 at a position close to vertical, but not exactly vertical, such as offset 3 to 6 degrees from vertical. Because the substrate 906 is not exactly vertical, the substrate 906 leans against the fingers 1104. The flat bed base portion 1108 has two elongated slots 1130 that extend along the length of the flat bed base portion 1108. The elongated slots 1130 provide a track within which rollers 1124 used to move the substrate carrier 904 will rotate.

The substrate carrier 904 enters the load lock chambers 108A, 108B from the substrate loading stations 106A, 106B through slit valve doors that seal openings 1118 in the load lock chamber body. Within the load lock chambers 108A, 108B, the substrate carriers 904 are disposed on a carrier movement mechanism 1122 that has a plurality of rollers 1124 that are linearly arranged to engage the elongated slots 1130 of the substrate carrier 904. The substrate carriers 904 are movable linearly as shown by arrow "F" along the carrier movement mechanism 1122. Each carrier movement mechanism 1122 is sized to receive two substrate carriers 904 and moves the carriers through the system 100. The carrier movement mechanism 1122 is movable laterally as shown by arrows "G" within the load lock chambers 108A, 108B to be able to receive or deliver the substrate carriers 904 from/to the substrate loading stations 106A, 106B. Additionally, the carrier movement mechanism 1122 is movable laterally as shown by arrows "G" within the load lock chambers 108A, 108B to be able to receive or deliver the substrate carriers 904 from/to the processing chambers 110A, 110B through the slit valve openings 1120. An actuator (not shown) provides the motion to permit the carrier movement mechanism 1122 to translate laterally in the direction shown by arrows "G".

The substrate carriers 904 enter the processing chambers 110A, 110B to position the substrates 906 within the processing chambers 110A, 110B. The substrate carriers 904 then retract back into the load lock chambers 108A, 108B while the substrate 906 remains within the processing chambers 110A, 110B for processing. The substrate carriers 904 move into the processing chambers 110A, 110B on rollers 1128 present in a processing chamber carrier movement mechanism 1126. The carrier movement mechanisms 1122 include motors not shown which power the rollers 1124 that impart motion to the carriers. The rollers 1128 are linearly arranged to engage the elongated slots 1130 present in the substrate carrier 904.

The processing chamber 110A, 110B has not only the microwave antennas 608, platen 1008 and shadow frame 1004, but also the processing chamber carrier movement mechanism 1126. Similar to the carrier movement mechanism 1122 present in the load lock chambers 108A, 108B, the processing chamber carrier movement mechanism 1126 has a plurality of rollers 1128 linearly arranged to engage the elongated slots 1130 present in the bottom surface of the substrate carrier 904. The processing chamber carrier movement mechanisms 1126 include motors not shown which power the rollers 1128 that impart motion to the carriers. The processing chamber carrier movement mechanism 1126 is also capable of translating laterally as shown by arrows "H" to permit the substrate 906, once engaged by the platen 1008 and shadow frame 1004, to be moved into the processing position adjacent the microwave antennas 608. An actuator (not shown) provides the motion the permit the processing chamber carrier movement mechanism 1126 to translate laterally in the direction shown by arrows "H".

In order to be received from the substrate carrier 904, substrate 906 is lifted off of the alignment rail 1110 by a lift pin actuation system. The lift pin actuation system includes a lift pin support structure 1116 and a support structure movement mechanism 1114. The support structure movement mechanism 1114 is movable laterally and vertically on the processing chamber carrier movement mechanism 1126 as shown by arrows "H" to move the lift pin support structure 1116.

FIGS. 12A and 12B are schematic representations showing the transfer of substrates 906 from the substrate carrier 904 to the processing chambers 110A, 110B. The substrate carrier 904 enters the processing chamber 110A, 110B through the slit valve opening 1120. The substrate 906 and fingers 1104 of the substrate carrier 904 move in between the platen 1008 and the shadow frame 1004. The support structure movement mechanism 1114 moves the lift pin support structure 1116 to move the support pins 1202 and bottom pins 1204 into position to receive the substrate from the substrate carrier 904. The support pins 1202 engage the substrate 906 and move the substrate 906 from the slanted position to a substantially vertical position spaced from the fingers 1104. The bottom pins 1204, rather than engaging the substrate 906, pass through the notches 1112 of the alignment rail 1110 below the substrate. The bottom pins 1204 have an enlarged head on the tip opposite the lift pin support structure 1116. The head of the bottom pins 1204 extend beyond the substrate 906 and extend further from the lift pin support structure 1116 than support pins 1202. The lift pin support structure 1116 then moves vertically as shown by arrows "I" to lift the substrate 906 from the carrier 904. The carrier 904 may then retract from the processing chamber 110A, 110B into the load lock chamber. The shadow frame 1004 is moved by an actuator (not shown) coupled between the platen 1008 and the shadow frame 1004 towards the platen 1008 to clamp the substrate 906 between the shadow frame 1004 and platen 1008. The substrate 906 and platen 1008 are then moved laterally as shown by arrows "J" to position the substrate in the processing position adjacent the microwave antennas 608. During processing, the bottom pins 1204 may continue to support the substrate 906.

In order to process a substrate in system 100, a substrate is first retrieved from a substrate stacking module 102A, 102B by an atmospheric robot 104A, 104B and placed into a dual substrate loading station 106A, 106B. In one embodiment, the substrate may be placed on a substrate carrier 904 in a dual substrate loading station 106A, 106B. A slit valve door opens and the substrate and substrate carrier 904 then pass through an opening 1118 into a load lock chamber 108A, 108B. The load lock chamber 108A, 108B is then evacuated to approximate the vacuum level of an adjacent processing chamber 110A, 110B. A slit valve door is then opened and the substrate and substrate carrier 904 then pass through opening 1120 into a processing chamber 110A, 110B. Support structure movement mechanism 1114 actuates to move the lift pin support structure 1116 in the direction shown by arrows "H" whereby the bottom pins 1204 pass through the notches 1112 in the alignment rail 1110 and under the substrate while the support pins engage the backside of the substrate. The lift pin support structure 1116 then actuates vertically to move the support pins 1202 and bottom pins 1204 in the direction shown by arrows "I" to disengage the substrate from the substrate carrier 904. The substrate carrier 904 then retracts from the processing chamber 110A, 110B and the slit valve door closes. The substrate is then sandwiched between the shadow frame 1004 and platen 1008 as the platen 1008, substrate and shadow frame 1008 are moved to a location closer to the microwave antennas 608 for processing. After processing, the sequence is reversed to remove the substrate from the system 100.

Figure 13:
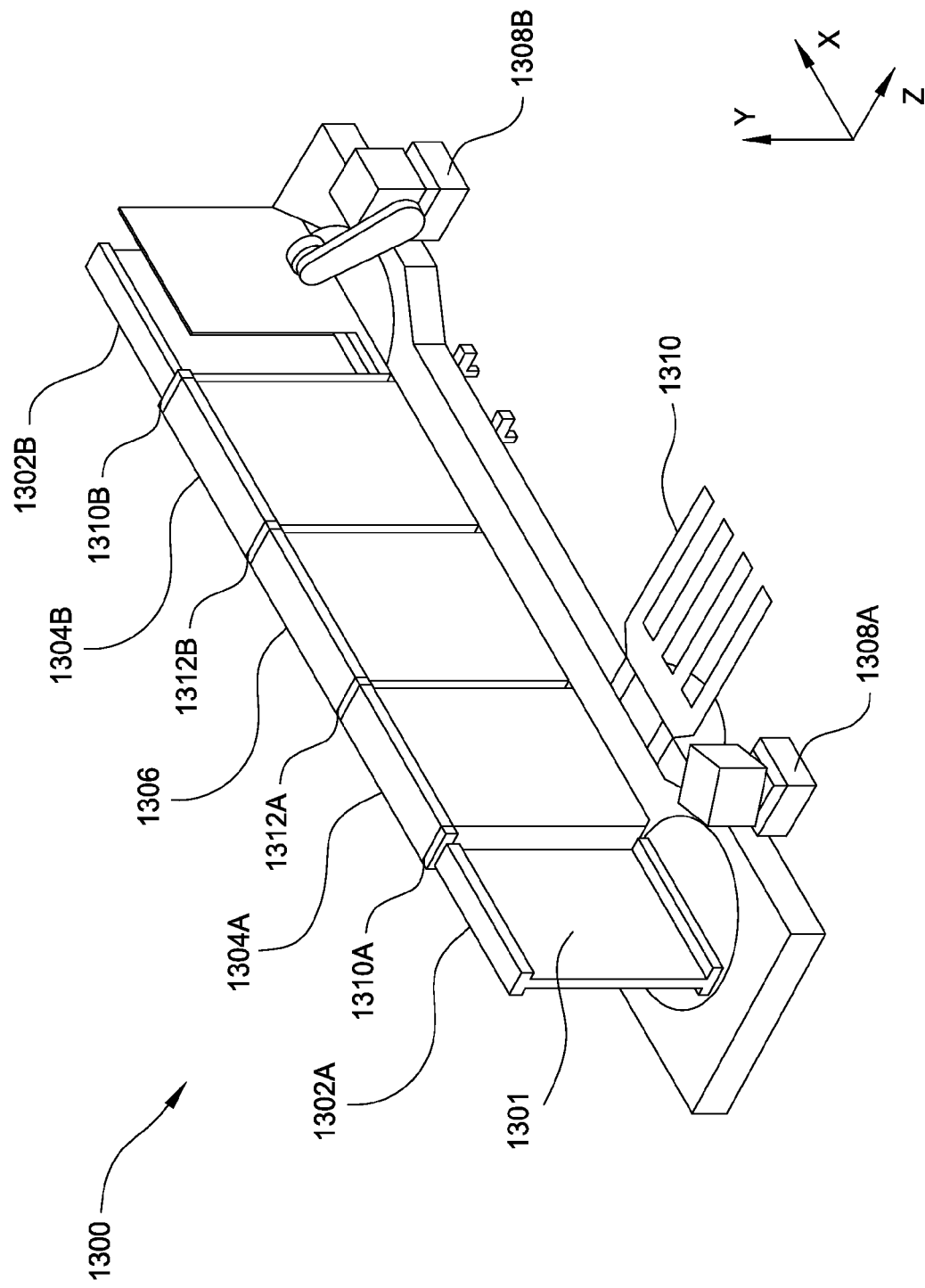
FIG. 13 is a schematic isometric view of a vertical CVD processing system according to another embodiment.

FIG. 13 is a schematic isometric view of a vertical CVD processing system 1300 according to another embodiment. The system 1300 includes glass loading/unloading stations 1302a, 1302b on each end of a processing line. The processing line includes load lock chambers 1304a, 1304b adjacent to each loading/unloading station 1302a, 1302b. A processing chamber 1306 is also present. Loading/unloading robots 1308a, 1308b are also present adjacent the loading/unloading stations 1302a, 1302b. In the embodiment shown in FIG. 13, the system 1300 is a static system which will be discussed below. The system 1300 could easily be modified to be a dynamic system as will be discussed below.

For a static operation, a substrate, which may be horizontal and substantially parallel to the ground, may be coupled to the end effector 1310 of the robot 1308a. The robot 1308a may rotate as necessary to maneuver the substrate into a vertical orientation relative to the previous horizontal position. The substrate is then placed into the loading station 1302a. A substrate carrier (not shown) may clamp the substrate to the vertical position and then transport the substrate through the system 1300. A substrate carrier that may be modified to benefit from the invention and utilized in the system 1300 is commercially available in the above mentioned Aristo system. Other suitable linear motors, actuators or conveying devices may alternatively be utilized.

Once the substrate is properly secured in a vertical orientation to the carrier, a slit valve 1310a on the load lock chamber 1304a opens and the carrier transports the substrate into the load lock chamber 1304a. The substrate is secured to the carrier within the load lock chamber 1304a while the load lock chamber 1304a is environmentally isolated from the processing chamber 1306 by a slit valve 1312a and is environmentally isolated from the loading station 1302a by a slit valve 1310a. While the substrate and carrier are disposed within the load lock chamber 1304a, another substrate may be loaded into another substrate carrier at the loading station 1302a. Once the processing chamber 1306 is ready to receive the substrate, the slit valve 1312a is opened and the carrier moves the substrate into position within the processing chamber 1306. Once inside the processing chamber 1306, the slit valve 1312a closes to environmentally isolate processing chamber 1306. The carrier may be made to oscillate back and forth in the x direction within the processing chamber 1306 to account for non-uniformities in processing conditions within the processing chamber 1306. The processing chamber 1306 may contain a plasma generator that may be powered by any number of sources such as microwave (for example, r&r type), inductively coupled plasma (for example, balanced and unbalanced), capacitively coupled plasma (phase modulated or not), or other suitable plasma generation source. The plasma generator may be a linear plasma source or an array of linear plasma sources, which could be, for example, a plasma generator comprising a linear plasma source or an array of two or more linear plasma sources. Each (individual) linear source consists of metal antenna, solid or hollow, with arbitrary cross-section (circular, rectangular, etc.) and with length much larger than its cross-sectional characteristic dimension(s); the antenna can be directly exposed to plasma or embedded in a dielectric (note: dielectric is understood as solid insulator, or solid insulator plus air/gas gap or gaps), and powered by RF power in frequency range from about 400 kHz to as high as about 8 GHz. The linear source can be powered at one end or at both ends, with one or two RF generators. Also, one generator can power one linear plasma source or several sources in parallel or in series, or in combination of both. The antenna-ends can be driven in phase or out of phase; the phases of driving voltages can be adjustable by passive elements (LC,) or changed actively on the generator side; the phase adjustment can be static or dynamic (varying in time). Additionally, when using two or more RF generators, the generators can be operated at slightly different frequencies, which also changes phases of driving voltages dynamically.

Additionally, the processing chamber 1306 need not be a CVD chamber alone. Because the processing chamber 1306 is environmentally isolated from the load lock chambers 1304a, 1304b by the slit valves 1312a, 1312b, the processing chamber 1306 is capable of performing other plasma processes, such as etching processes, which utilized gases that may damage other portions of the chamber, are expensive, and/or may pose an environmental hazard. During processing, the processing chamber 1306 may be evacuated by one or more vacuum pumps (not shown). Additionally, processing gas may be introduced into the processing chamber 1306 from one or more gas sources.

After completion of processing within the processing chamber 1306, a slit valve 1312b is opened and the carrier with the substrate is transported into the next load lock chamber 1304b. The slit valve 1312b then closes to environmentally isolate the processing chamber 1306 from the load lock chamber 1304b. A slit valve 1310b then opens to permit the carrier and substrate to be transported to another unloading/loading station 1302b.

Once at the unloading/loading station 1302b, the substrate may be removed from the unloading/loading station 1302b by a robot 1308b if desired. Alternatively, the substrate may remain in the carrier in the unloading/loading station 1302b. The unloading/loading station 1302b may rotate and permit the substrate and carrier to progress through the load lock chambers 1304a, 1304b and processing chamber 1306 on the other side of those respective chambers. In passing though the processing chamber 1306, the same surface of the substrate that was processed in the processing chamber 1306 the first time through the processing chamber 1306 is processed a second time. Additionally, the same processing may occur if desired because the same processing source may be utilized for each pass through the processing chamber 1306.

After processing in the processing chamber 1306 for the second pass, the substrate and carrier would then exit the load lock chamber 1304a and be placed in the loading/unloading station 1302a. The substrate and carrier may rotate 180 degrees to a position where the robot 1308 will unload the substrate from the carrier.

The load lock chambers 1304a, 1304b may be equipped with both heating elements or cooling elements as necessary to preheat the substrate prior to entering the processing chamber 1306 or to cool a processed substrate before exiting the load lock chamber 1304a, 1304b to the loading/unloading station 1302a, 1302b. Infrared heating sources may be utilized to preheat the substrates in the load lock chambers 1304a, 1304b.

The carrier that transports the substrate through the system 1300 moves between an atmospheric environment at the loading/unloading stations 1302a, 1302b and a vacuum environment within the load lock chambers 1304a, 1304b and the processing chamber 1306. When within the vacuum environment, the carrier may be heated to the processing temperature, but when it is at atmosphere, there is a possibility that the temperature of the carrier may be reduced. Temperature cycling (i.e., repeatedly changing the temperature of the carrier) may lead to flaking of material from the carrier. The material that flakes may be deposited on the carrier during the course of processing the substrate in the processing chamber 1306. The heating and cooling of the carrier may lead to flaking due to the contraction and expansion of the carrier. To prevent flaking, the carrier may be heated when the carrier is in the atmospheric environment. When the carrier is on the loading/unloading station 1302a, 1302b, the carrier may be heated by heating sources such as infrared heaters or hot plates.

Figure 14:
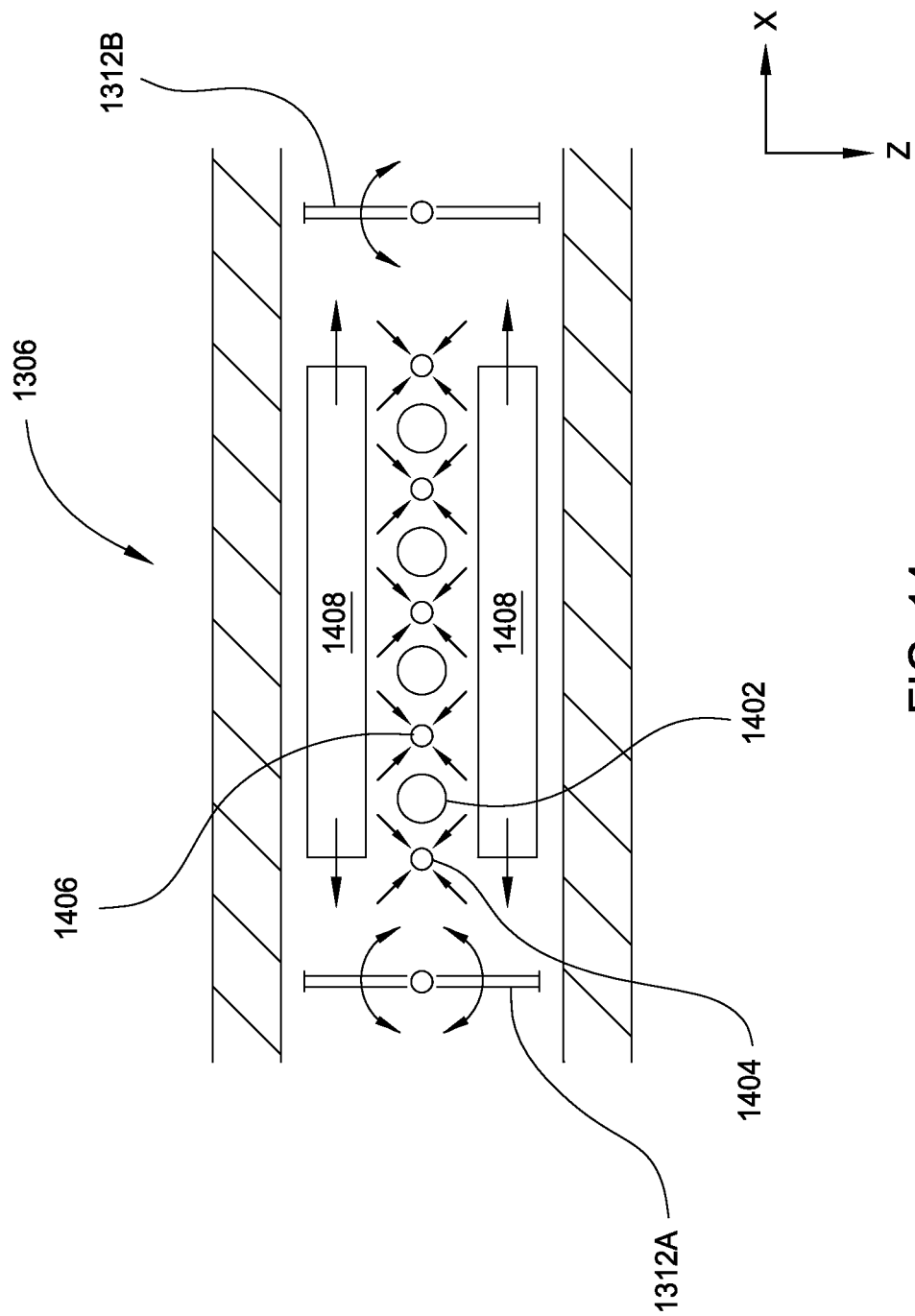
FIG. 14 is a schematic top view of a plasma generator according to one embodiment.

FIG. 14 is a schematic top view of the processing chamber 1306. The processing chamber includes a plasma generator 1402, one or more gas exhausts 1404, and one or more gas distributors 1406 for introducing processing gas. Slit valves 1312a, 1312b are shown for opening and closing to seal the processing chamber 1306 and to permit substrates to enter and exit the processing chamber 1306. During processing, while one substrate is processed, a second substrate is processed at the same time while traveling between the load lock chamber in the opposite direction. Thus, two substrates traveling through the system 1300 in opposite directions may be simultaneously processed within the processing chamber 1306 on opposite sides of the plasma generator 1402.

A few modifications may be made to the system 1300 to permit the system 1300 to function as a dynamic system rather than a static system. In the dynamic operation of the system, the substrates, robots 1308a, 1308b, loading/unloading stations 1302a, 1302b and slit valves 1310a, 1310b be would be the same as the static system, however, other aspects may be slightly different. Because the system is a dynamic system, the carriers will continuously move while within the processing chamber 1306. Thus, the substrates and carriers will need to be accelerated to a substantially constant speed for traversing the processing chamber 1306. In order to properly accelerate the carrier and substrates 1408, the load lock chambers 1304a, 1304b may be lengthened to permit the substrates 1408 and carriers to accelerate to the desired speed. Alternately, the processing chamber 1306 may include staging portions disposed between the processing portion and the load lock chambers 1304a, 1304b to allow for acceleration/deceleration. A baffle or gas curtain may be provided between the processing portion and the staging portion to contain deposition gases and cleaning to the processing portion. The slit valves 1312a, 1312b may be replaced by baffles or a gas curtain that simply permit the substrates 1408 and carriers to pass therethrough into the processing chamber 1306. Once in the processing chamber 1306, the carrier moves at a substantially constant speed to ensure that the portion of the substrate 1408 that first enters the processing chamber 1306 receives substantially the same conditions (i.e., time exposed to the processing conditions) as the portion of the substrate 1408 that is the last to enter the processing chamber 1306. Naturally, because there is sufficient room in the load lock chamber 1304a, 1304b to accelerate the substrate 1408 and carriers, there is sufficient room to decelerate the carrier and substrate 1408 before opening the respective slit valve 1310a, 1310b to move the substrate 1408 and carrier to the loading/unloading station 1302a, 1302b.

Figure 15:
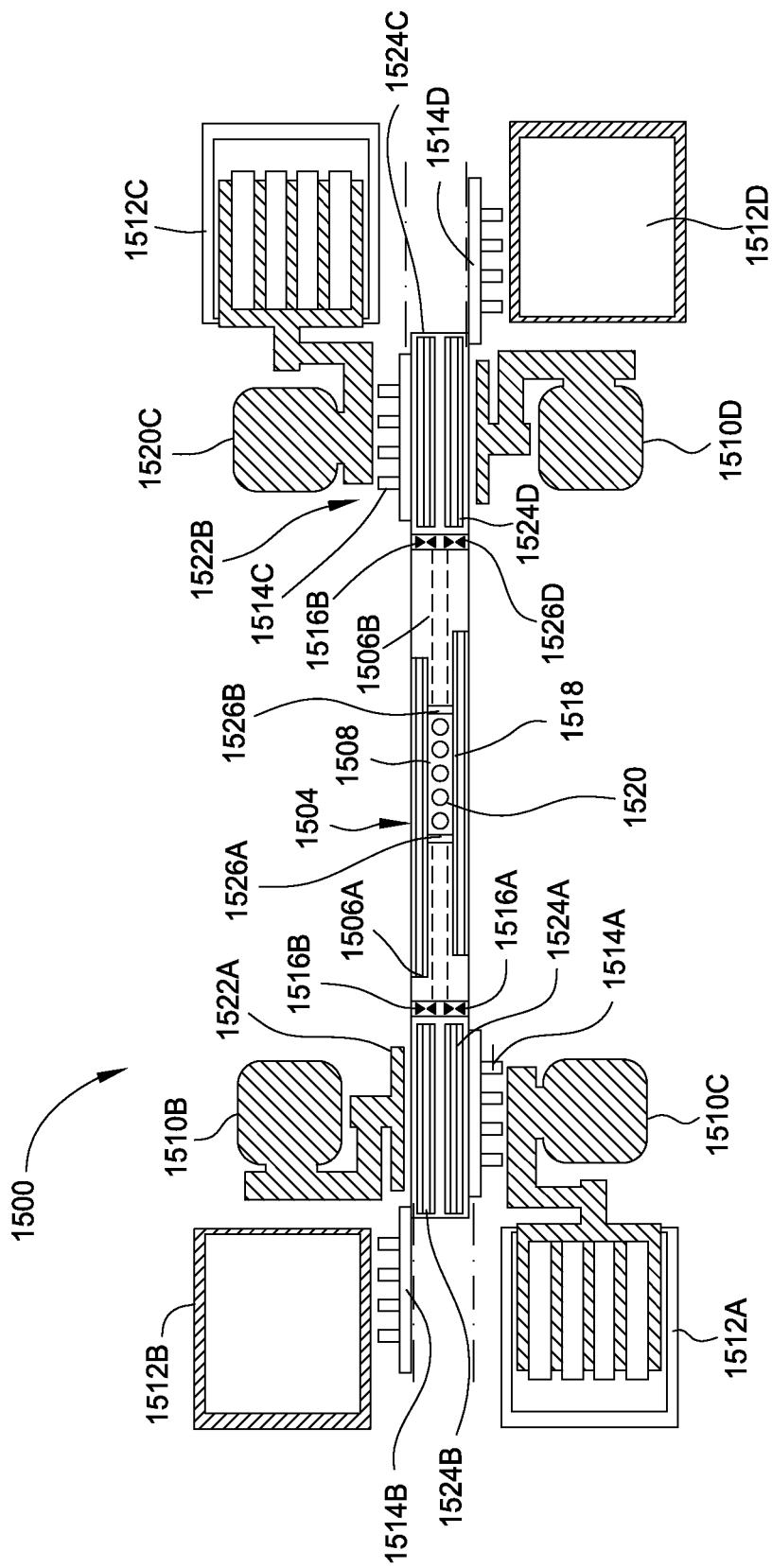
FIG. 15 is a schematic top view of a vertical CVD processing system according to another embodiment.

FIG. 15 is a schematic top view of a vertical CVD processing system 1500 according to another embodiment. The system 1500 includes two dual-track load lock chambers 1522a, 1522b that have environmentally isolated areas 1524a-1524d separated by a wall. Coupled between the load lock chambers 1522a, 1522b is a processing chamber 1504. The processing chamber 1504 has a processing portion 1508 having one or more processing sources 1520 which may be a processing source as discussed above in regards to FIG. 14. On either side of the processing portion 1508 is an acceleration/deceleration portion 1506a, 1506b. Each acceleration/deceleration portion 1506a, 1506b is coupled to a respective load lock chamber 1522a, 1522b. Substrates 1518 may be loaded onto carriers (not shown) in the load lock chambers 1522a, 1522b by opening the doors 1514a-1514d to the respective environmentally isolated area 1524a-1524d and placing a substrate 1518 onto a carrier. The substrates 1518 may be removed from a substrate storage unit 1512a-1512d and placed onto the carrier by a corresponding robot 1510a-1510d. Similarly, after processing the substrates 1518 may be removed from the carrier by a robot 1510a-1510d and placed into a substrate storage unit 1512a-1512d to await further processing. As the load lock chambers 1522a, 1522b handle two substrates at a time, throughput is increased by reducing the number of pumping cycles per substrate.

The system 1500 may operate as a dynamic processing system. A substrate 1518 may be obtained from a substrate storage unit 1512a by a robot 1510a. The door 1514a to the environmentally isolated area 1524a may be opened and two substrates 1518 may be placed on respective carriers that are present in the environmentally isolated area 1524a. The door 1514a then closes. A slit valve door 1516a is then opened and the substrates and carriers move through the slit valve door 1516a. The slit valve door 1516a closes once the substrates 1518 and carriers are entirely within the acceleration/deceleration portion 1506a. The substrate 1518 and carrier on the outer track are then accelerated to a substantially constant speed. Once at the constant speed, the substrate 1518 and carrier pass through the baffle 1526a that defines that boundary between the acceleration/deceleration portion 1506a and the processing portion 1508. Once the carrier on the outer track is clear, the substrate and carrier on the inner track is moved outward onto the outer track. The substrates 1518 and the carriers move through the processing portion 1508 at a substantially constant speed so that the entire substrate 1518 is exposed to the processing conditions for substantially the same amount of time. By permitting the substrate to be exposed to the processing conditions for the substantially same amount of time, uniform processing of the substrate 1518 may be obtained. It is also contemplated that the speed through the portion 1508 may be varied. The substrates 1518 and carriers move out of the processing portion 1508 by passing through the baffle 1526b that defines the boundary between the processing portion 1508 and the acceleration/deceleration area 1506b. Once in the acceleration/deceleration area 1506b, the substrate 1518 and carrier decelerate and may even be stopped. The first substrate and carrier is moved to an inner track to allow the substrates and carriers to return to a parallel orientation to facilitate simultaneous entry into the load lock chamber 1522b. The slit valve 1516d then opens to permit the substrate 1518 and carrier to move into the environmentally isolated area 1524d of the load lock chamber 1522b. The door 1514d of the environmentally isolated area 1524 opens and a robot 1510d retrieves the substrates 1518 from the carriers and places the substrates 1518 into a substrate storage unit 1512d. The carrier may also be removed from the system 1500 and transported back to the environmentally isolated area 1524a of the load lock chamber 1522a. Because the carrier is exposed to atmosphere, the carrier may experience temperature cycling. Thus, the load lock chambers 1522a, 1522b may each be equipped with a heating element may be present. Additionally, cooling means may be present in the load lock chambers 1522a, 1522b to cool the substrate to a desired temperature prior to removal from the load lock chamber 1522a, 1522b.

Simultaneous with the process just described, substrates 1518 may move through the system 1500 in the opposite direction through the opposite side of the processing chamber. Substrates 1518 may be retrieved from a substrate storage unit 1512c by a robot 1510c which placed the substrates 1518 into a carrier present in the environmentally isolated area 1524c of load lock chamber 1522b. The door 1514c to the environmentally isolated area 1524c is then closed. A slit valve door 1516c may be opened to permit the substrates 1518 and carriers to move into the acceleration/deceleration area 1506b. The substrates 1518 and carriers may be accelerated to the desired speed and then pass through the baffle 1526b into the processing portion 1508. The substrates 1518 and carriers may move through the processing portion 1508 at a substantially constant speed as discussed above and then exit the processing portion 1508 through the baffle 1526a into the acceleration/deceleration portion 1506a. The substrates 1518 and carriers may decelerate or even stop before the slit valve door 1516b is opened to permit the carriers and substrates 1518 to enter the environmentally isolated area 1524b of the load lock chamber 1522a. Once in the environmentally isolated area 1524b, the slit valve door 1516b is closed and the load lock door 1514b is opened. The robot 1510b then retrieves the substrates 1518 from the carriers and places the substrates 1518 into a substrate storage unit 1512b for further processing. Thus, system 1500 permits the dynamic processing of multiple substrates 1518 within the same processing portion 1508.

Figure 16:
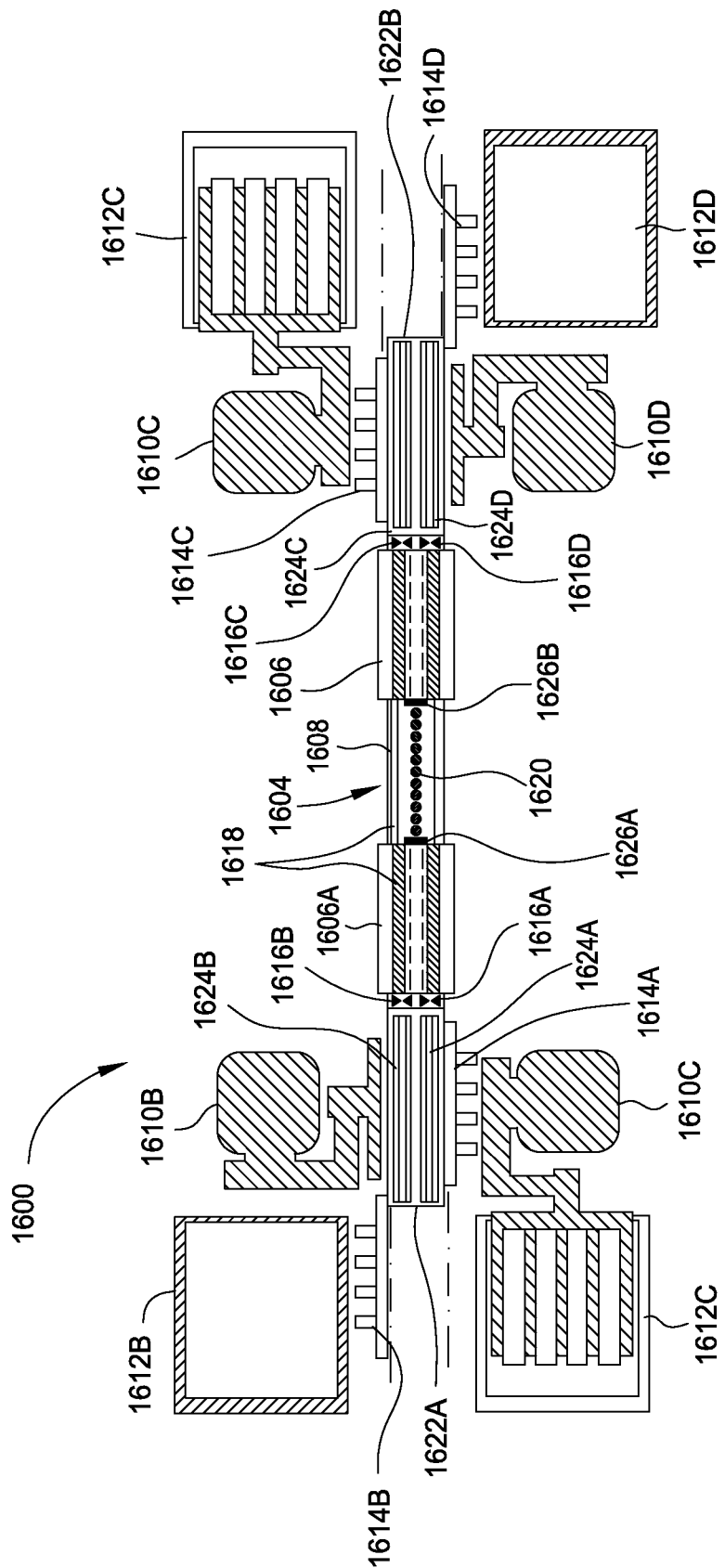
FIG. 16 is a schematic top view of a vertical CVD processing system according to another embodiment.

FIG. 16 is a schematic top view of a vertical CVD processing system 1600 according to another embodiment. The system 1600 includes two dual-track load lock chambers 1622a, 1622b that have environmentally isolated areas 1624a-1624d separated by a wall. Coupled between the load lock chambers 1622a, 1622b is a processing chamber 1604. The processing chamber 1604 has a processing area 1608 having one or more processing sources 1620 which may be a processing source as discussed above in regards to FIG. 14. On either side of the processing area 1608 is an acceleration/deceleration area 1606a, 1606b. Each acceleration/deceleration area 1606a, 1606b is coupled to a respective load lock chamber 1622a, 1622b. Substrates 1618 may be loaded onto a carrier (not shown) in the load lock chambers 1622a, 1622b by opening the doors 1614a-1614d to the respective environmentally isolated area 1624a-1624d and placing a substrate 1618 onto a carrier similar to that described for system 1500 of FIG. 15. The substrates 1618 may be removed from a substrate storage unit 1612a-1612d and placed onto the carrier by a corresponding robot 1610a-1610d. Similarly, after processing the substrate 1618 may be removed from the carrier by a robot 1610a-1610d and placed into a substrate storage unit 1612a-1612d to await further processing.

The system 1600 may operate as a dynamic, reciprocating processing system. A substrate 1618 may be obtained from a substrate storage unit 1612a by a robot 1610a. The door 1614a to the environmentally isolated area 1624a may be opened and the substrate 1618 may be placed on a carrier that is present in the environmentally isolated area 1624a. The door 1614a then closes. A slit valve door 1616a is then opened and the substrate 1618 and carrier move through the slit valve door 1616a. The slit valve door 1616a closes once the substrate 1618 and carrier are entirely within the acceleration/deceleration area 1606a. The substrate 1618 and carrier are then accelerated to a substantially constant speed. Once at the constant speed, the substrate 1618 and carrier pass through the baffle 1626a that defines that boundary between the acceleration/deceleration area 1606a and the processing area 1608. The substrate 1618 and carrier move through the processing area 1608 at a substantially constant speed so that the entire substrate 1618 is exposed to the processing conditions for substantially the same amount of time. By permitting the substrate to be exposed to the processing conditions for the substantially same amount of time, uniform processing of the substrate 1618 may be obtained. The substrate 1618 and carrier move out of the processing area 1608 by passing through the baffle 1626b that defines the boundary between the processing area 1608 and the acceleration/deceleration area 1606b. Once in the acceleration/deceleration area 1606b, the substrate 1618 and carrier decelerate to a stop. The substrate 1618 and carrier then reverse direction. The substrate 1618 and carrier are accelerated to a substantially constant speed and then permitted to pass through the baffle 1626b again into the processing area 1608 so that the same side of the substrate 1618 is processed a second time. The substrate 1618 and carrier pass through baffle 1626b back into the acceleration/deceleration area 1606a where the substrate 1618 and carrier decelerate and may even stop. Slit valve door 1616a is opened and the carrier and substrate 1618 move into the environmentally isolated area 1624a of the load lock chamber 1622a. The door 1614a is opened and the substrate 1618 is retrieved by the robot 1610a and placed in the substrate storage unit 1612a. A substrate 1618 may then be removed from the substrate storage unit 1612a and placed into the carrier by the robot 1610b to repeat the same process by moving the substrate 1618 and carrier though the system 1600.

The load lock chambers 1622a, 1622b may each be equipped with a heating element. Additionally, cooling means may be present in the load lock chambers 1622a, 1622b to cool the substrate 1618 to a desired temperature prior to removal from the load lock chamber 1622a, 1622b.

Simultaneous with the process just described, a substrate 1618 may move through the system 1600 from the opposite side of the system 1600. A substrate 1618 may be retrieved from a substrate storage unit 1612c by a robot 1610c which places the substrate 1618 into a carrier present in the environmentally isolated area 1624c of load lock chamber 1622b. The door 1614c to the environmentally isolated area 1624c is then closed. A slit valve door 1616c may be opened to permit the substrate 1618 and carrier to move into the acceleration/deceleration area 1606b. The substrate 1618 and carrier may be accelerated to the desired speed and then pass through the baffle 1626b into the processing area 1608. The substrate 1618 and carrier may move through the processing area 1608 at a substantially constant speed as discussed above and then exit the processing area 1608 through the baffle 1626a into the acceleration/deceleration area 1606a. The substrate 1618 and carrier may decelerate or even stop. The substrate 1618 and carrier may then reverse direction so that the same side of the substrate may be processed a second time within the acceleration/deceleration area 1606a. The substrate 1618 and carrier accelerate to a substantially constant speed and then pass through the baffle 1626a into the processing area 1608. The substrate 1618 and carrier exit the processing area 1608 by passing through the baffle 1626b into the acceleration/deceleration area 1606b. The substrate 1618 and carrier then pass through the slit valve door 1616c into the environmentally isolated area 1624c of load lock chamber 1622b. Door 1614c is opened and robot 1610c retrieves the substrate 1618 and places the substrate 1618 into substrate storage unit 1612c. A substrate 1618 may then be removed from the substrate storage unit 1612c and placed into the carrier by the robot 1610c to repeat the same process by moving the substrate 1618 and carrier though the system 1600. Simultaneously, substrates from the storage units 1612a-1612d are processed on the opposite side of the plasma processing sources 1620.

Figure 17:
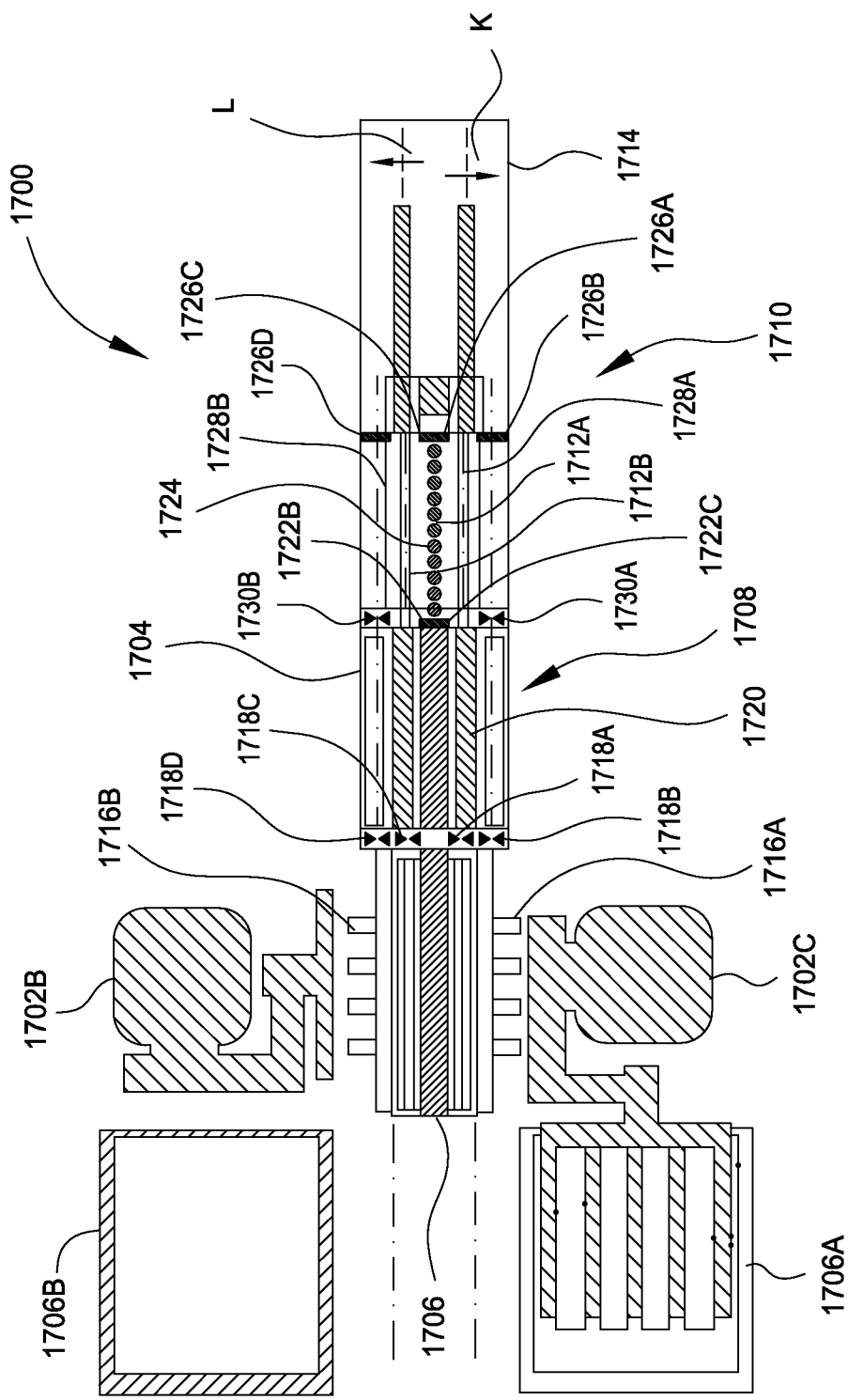
FIG. 17 is a schematic top view of a vertical CVD processing system according to another embodiment.

FIG. 17 is a schematic top view of a vertical CVD processing system 1700 according to another embodiment. Robots 1702a, 1702b are present for loading/unloading substrates 1704 from/to substrate storage units 1706a, 1706b and placing the substrates 1704 into or removing the substrates 1704 from carriers that move the substrates 1704 through the processing system 1700. The processing system 1700 also includes a substrate loading/unloading station 1706 which serves as an input load lock chamber that is disposed adjacent to a load lock chamber 1708. The load lock chamber 1708 is coupled to a processing chamber 1710. The processing chamber 1710 has processing areas 1712a, 1712b and a substrate shifting area 1714. The processing chamber 1710 may be configured as described with reference to FIG. 14 above.

In operation, a substrate 1704 is retrieved from a substrate storage unit 1706a by robot 1702a. The door 1716a to the loading/unloading station 1706 is opened and the substrate 1704 is placed on the carrier. The door 1716a is closed and the loading/unloading station 1706 is pumped down. Slit valve door 1718a then opens and the substrate 1704 and carrier move into a first portion 1720 of the processing chamber 1710. While in the first portion 1720, the substrate 1704 and carrier are accelerated to a substantially constant speed. The substrate 1704 and carrier then pass through a baffle 1722a to enter the processing area 1712a of the processing chamber 1710. Processing area 1712 includes a processing source 1724 as discussed above in regards to FIG. 14. The substrate 1704 is processed as the substrate 1704 and carrier move through the processing area 1712a. The substrate 1704 and carrier pass through a baffle 1726a into the substrate shifting area 1714. Once in the substrate shifting area 1714, the substrate 1704 and carrier are shifted in the direction shown by arrow K to an outer return track. The substrate 1704 and carrier then pass outside of the processing area 1712a through an optional baffle 1726b. The substrate 1704 and carrier are separated from the processing source 1724 by a wall 1728a. A slit valve door 1730a then opens to permit the substrate 1704 and carrier to enter the load lock chamber 1708. A slit valve door 1718b may then open to permit the substrate 1704 and carrier may exit the load lock chamber 1708 where the substrate 1704 may be retrieved by the robot 1702a and placed into the substrate storage unit 1706a. Note that in the embodiment shown in FIG. 17, the load lock chamber 1708 is staggered relative to the loading/unloading station 1706 so that the carrier exiting the chamber 1708 may directly enter the station 1706 to minimize heat loss from the carrier. The carrier may also be heated while in an area adjacent to the station 1706 by infrared lamps or other suitable heater to minimize thermal cycling of the carrier.

Simultaneous with the just described process, a substrate 1704 is retrieved from a substrate storage unit 1706*b* by robot 1702*b*. The door 1716*b* to the loading/unloading station 1706 is opened and the substrate 1704 is placed on the carrier. The door 1716*b* is closed and the station 1706 is pumped down. Slit valve door 1718*c* then opens and the substrate 1704 and carrier move into the first portion 1720 of the processing chamber 1710. While in the first portion 1720, the substrate 1704 and carrier are accelerated to a substantially constant speed. The substrate 1704 and carrier then pass through a baffle 1722*b* to enter the processing area 1712*b* of the processing chamber 1710. The substrate 1704 is processed as the substrate 1704 and carrier move through the processing area 1712. The substrate 1704 and carrier pass through a baffle 1726*c* into the substrate shifting area 1714. Once in the substrate shifting area 1714, the substrate 1704 and carrier are shifted in the direction shown by arrow L to an outer return track. The substrate 1704 and carrier then pass by the outside of the processing area 1712*b* through a baffle 1726*d*. The substrate 1704 and carrier are separated from the processing source 1724 by a wall 1728*b*. A slit valve door 1730*b* then opens to permit the substrate 1704 and carrier to enter the load lock chamber 1708. A slit valve door 1718*d* may then open to permit the substrate 1704 and carrier to exit the load lock chamber 1708 where the substrate 1704 may be retrieved by the robot 1702*b* and placed into the substrate storage unit 1706*b*. The carrier is then returned to the station 1706 similar to as described above to process another substrate.

It is to be understood that while system 1700 has been described as a dynamic system, the system 1700 could operate as a static system whereby the baffles are replaced with slit valves and the substrate and carrier oscillate within the processing area. A heating element or infrared heating source may be present within the loading/unloading station 1706 to maintain the carrier at an acceptable temperature and prevent thermal cycling.

Figure 18:
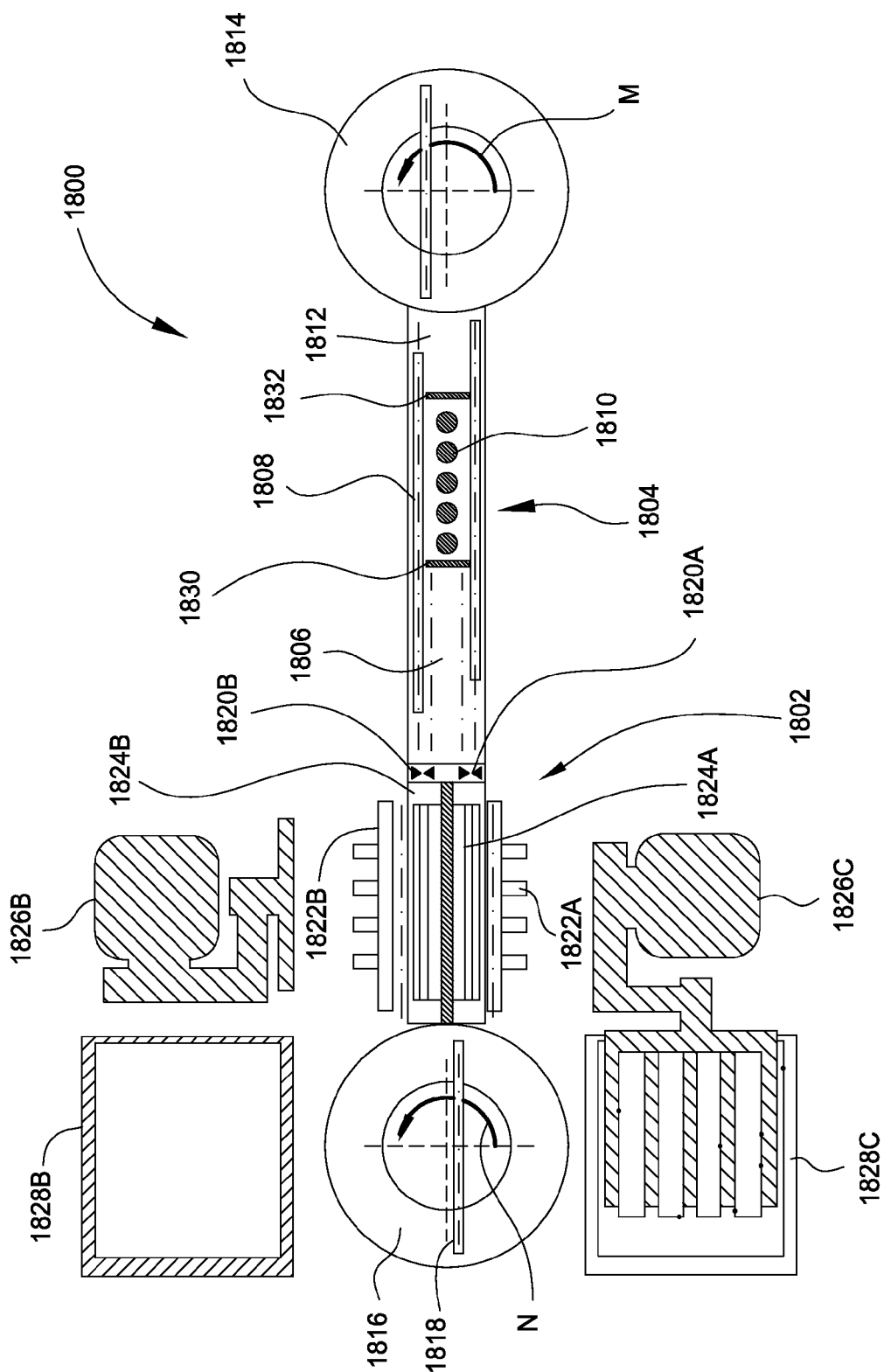
FIG. 18 is a schematic top view of a vertical CVD processing system according to another embodiment.

FIG. 18 is a schematic top view of a vertical CVD processing system 1800 according to another embodiment. The processing system 1800 includes a load lock chamber 1802 and a processing chamber 1804. The processing chamber 1804 includes an acceleration/deceleration area 1806, a processing area 1808 having a processing source 1810, and another acceleration/deceleration area 1812.

In operation, a substrate is retrieved from a substrate storage unit 1828*a* by a robot 1826*a*. A door to a first environmentally isolated area 1824*a* of the load lock chamber 1802 opens and the robot 1826*a* places the substrate onto a carrier 1818 that is in the load lock chamber 1802. In one embodiment, two substrates are loaded onto a respective carrier disposed in the load lock chamber 1802. It is also contemplated that the single substrate batch type load lock chambers may be utilized. The door 1822*a* closes and the environmentally isolated area 1824*a* is evacuated. If necessary, the substrate may be heated. The substrate and carrier 1818 are then ready to move into the processing chamber 1804. A slit valve door 1820*a* opens and the carrier 1818 and substrate move into an acceleration/deceleration area 1806 of the processing chamber 1804. When in the acceleration/deceleration area 1806 of the processing chamber 1804, the carrier 1818 and substrate on the track which extends through the processing chamber 1804 are accelerated to a substantially constant speed. The other carrier and substrate is shifted sideways to follow the substrate linearly through the processing chamber 1804. The substrate and carrier 1818 then pass through a baffle 1830 to the processing area 1808 where the substrate is processed. The substrate and carrier 1818 then pass through another baffle 1832 into the acceleration/deceleration area 1812 of the processing chamber 1804. The substrate and carrier 1818 then move onto the turntable 1814 which rotates both the substrate and carrier 1818 in the direction shown by arrow M. The substrate and carrier 1818 then re-enter the acceleration/deceleration area 1812 where the substrate and carrier 1818 accelerate to a substantially constant speed before passing through baffle 1832 into the processing area 1808. The substrate is then processed again on the same side of the substrate that was previously processed when passing through the processing area 1808. The substrate and carrier 1818 then pass through the baffle 1830 again into the acceleration/deceleration area 1806 where the carrier 1818 and substrate decelerate and may even stop. The substrate is moved sideways to allow the following substrate and carrier to move into a parallel orientation for entry into the load lock chamber. The slit valve door 1820*b* then opens and the substrates and carriers 1818 move into the environmentally isolated area 1824*b* of the load lock chamber 1802. The slit valve door 1820*b* closes and the load lock door 1822*b* opens. The robot 1826*b* retrieves the substrate from the carrier 1818 and places the substrate in a substrate storage unit 1828*b*. The carrier 1818 moves onto a turntable 1816 where the carrier 1818 is rotated as shown by arrow N so that the carrier 1818 can enter the environmentally isolated area 1824*a* of the load lock chamber 1802 to receive another substrate. The second empty carrier is then routed to the turntable 1816 for positioning a second substrate in the area 1824*a* as described above.

Figure 19:
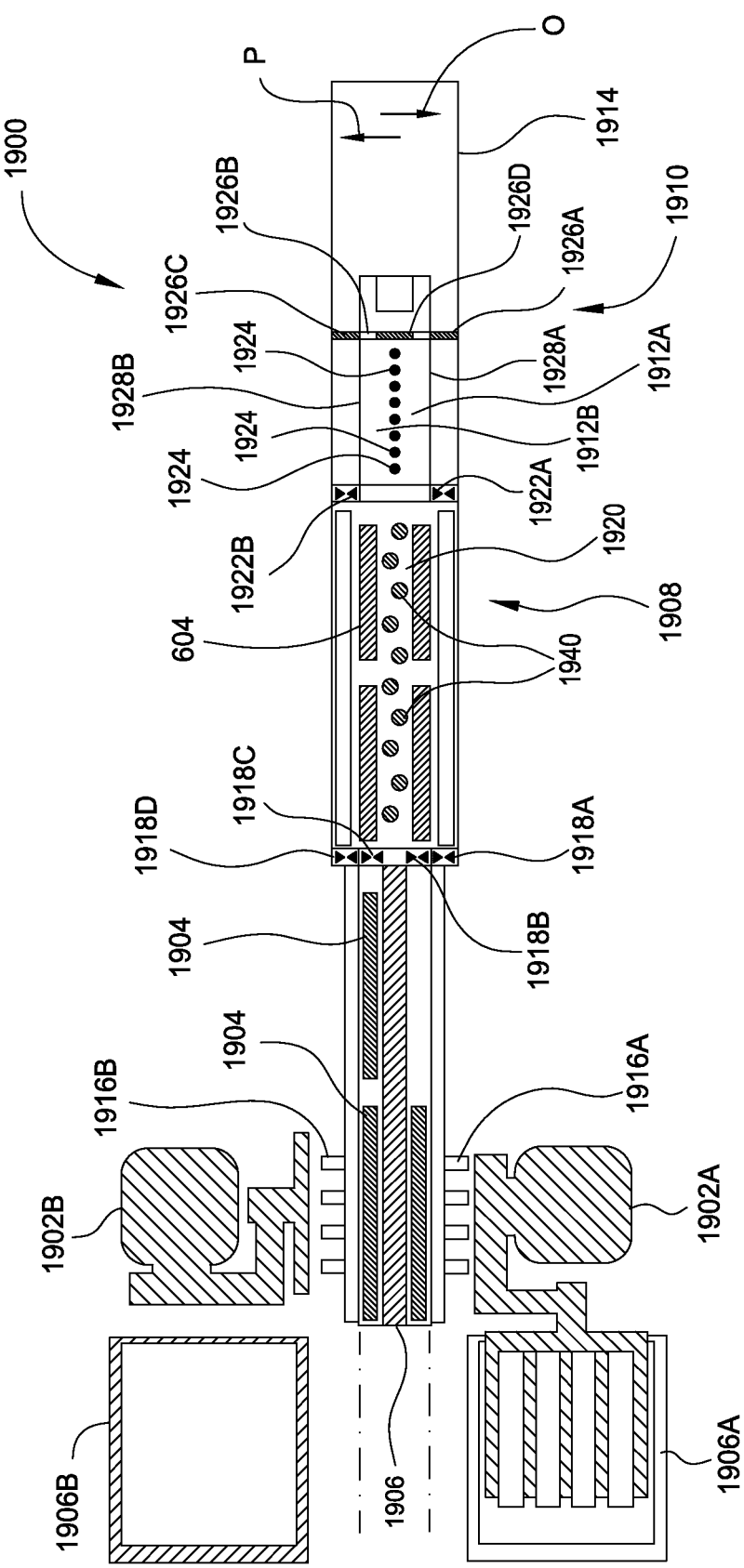
FIG. 19 is a schematic top view of a vertical CVD processing system according to another embodiment.

FIG. 19 is a schematic top view of a vertical CVD processing system 1900 according to another embodiment. Robots 1902*a*, 1902*b* are present for loading/unloading substrates 1904 from/to substrate storage units 1906*a*, 1906*b* and placing the substrates 1904 into or removing the substrates 1904 from carriers that move the substrates 1904 through the processing system 1900. The processing system 1900 also includes a substrate loading/unloading station 1906 that is disposed adjacent to a load lock chamber 1908. The loading/unloading station 1906 and the load lock chamber 1908 are long enough to accommodate two substrates end to end on a single or on separate carriers. The load lock chamber 1908 is coupled to a processing chamber 1910. The processing chamber 1910 has processing areas 1912*a*, 1912*b* and a substrate shifting area 1914.

In operation, a substrate 1904 is retrieved from a substrate storage unit 1906*a* by robot 1902*a*. The door 1916*a* to the loading/unloading station 1906 is opened and the substrate 1904 is placed on a first carrier. Another substrate 1904 is retrieved by the robot 1902*a* and placed on a second carrier. The door 1916*a* is closed and the loading/unloading station 1906 is pumped down. Slit valve door 1918*a* then opens and the substrates 1904 and carrier move into a first portion 1920 of the processing chamber 1910. While in the first portion 1920, the substrates 1904 and carriers are accelerated to a substantially constant speed. Preheaters 1940 may be present in the first portion 1920. The substrates 1904 and carriers then pass through a baffle 1922*a* to enter the processing area 1912*a* of the processing chamber 1910. Processing area 1912*a* includes a processing source 1924 as discussed above in regards to FIG. 14. The processing area 1912*a* also includes openings 1926 for introducing or evacuating processing gases from the processing area 1912*a*. The substrates 1904 are processed as the substrates 1904 and carriers move through the processing area 1912*a*. The substrates 1904 and carriers pass through a baffle 1926*a* into the substrate shifting area 1914. Once in the substrate shifting area 1914, the substrates 1904 and carrier are shifted in the direction shown by arrow O to an outer return track. The substrates 1904 and carriers then reverse direction and pass outward of the processing area 1912a through a baffle 1926b. The substrates 1904 and carrier are separated from the processing source 1924 by a wall 1928a. A slit valve door 1930a then opens to permit the substrates 1904 and carrier to enter the load lock chamber 1908. After the load lock chamber 1908 has vented, a slit valve door 1918b may then open to permit the substrates 1904 and carriers to exit the load lock chamber 1908 where the substrates 1904 may be retrieved by the robot 1902a and placed into the substrate storage unit 1906a. Note that in the embodiment shown in FIG. 19, the load lock chamber 1908 is staggered relative to the loading/unloading station 1906. It is to be understood that the load lock chamber 1908 and loading/unloading station 1906 need not be staggered and may comprise separate or unitary load lock chambers.

Simultaneous with the just described process, a substrate 1904 is retrieved from a substrate storage unit 1906b by robot 1902b. The door 1916b to the loading/unloading station 1906 is opened and the substrate 1904 is placed on a third carrier. Another substrate 1904 is retrieved by the robot 1902b and placed on a fourth carrier. The door 1916b is closed and the loading/unloading station 1906 is pumped down. Slit valve door 1918c then opens and the substrates 1904 and carriers move into a first portion 1920 of the processing chamber 1910. While in the first portion 1920, the substrates 1904 and carriers are accelerated to a substantially constant speed. The preheaters 1940 may be present in the first portion 1920 as discussed above. The substrates 1904 and carriers then pass through a baffle 1922b to enter the processing area 1912b of the processing chamber 1910. The substrates 1904 are processed as the substrates 1904 and carrier move through the processing area 1912b. The substrates 1904 and carriers pass through a baffle 1926c into the substrate shifting area 1914. Once in the substrate shifting area 1914, the substrates 1904 and carriers are shifted in the direction shown by arrow H. The substrates 1904 and carriers then reverse direction and pass outward of the processing area 1912b through a baffle 1926d. The substrates 1904 and carriers are separated from the processing source 1924 by a wall 1928b. A slit valve door 1930b then opens to permit the substrates 1904 and carrier to enter the load lock chamber 1908. After the load lock chamber 1908 has vented, a slit valve door 1918d may then open to permit the substrates 1904 and carriers to exit the load lock chamber 1908 where the substrates 1904 may be retrieved by the robot 1902b and placed into the substrate storage unit 1906b.

It is to be understood that while system 1900 has been described as dynamic system, the system 1900 could operate as a static system whereby the baffles are replaced with slit valves and the substrate and carrier oscillate within the processing area. A heating element or infrared heating source may be present within the loading/unloading station 1906 to maintain the carrier at an acceptable temperature and prevent thermal cycling as described above.

Figure 20:
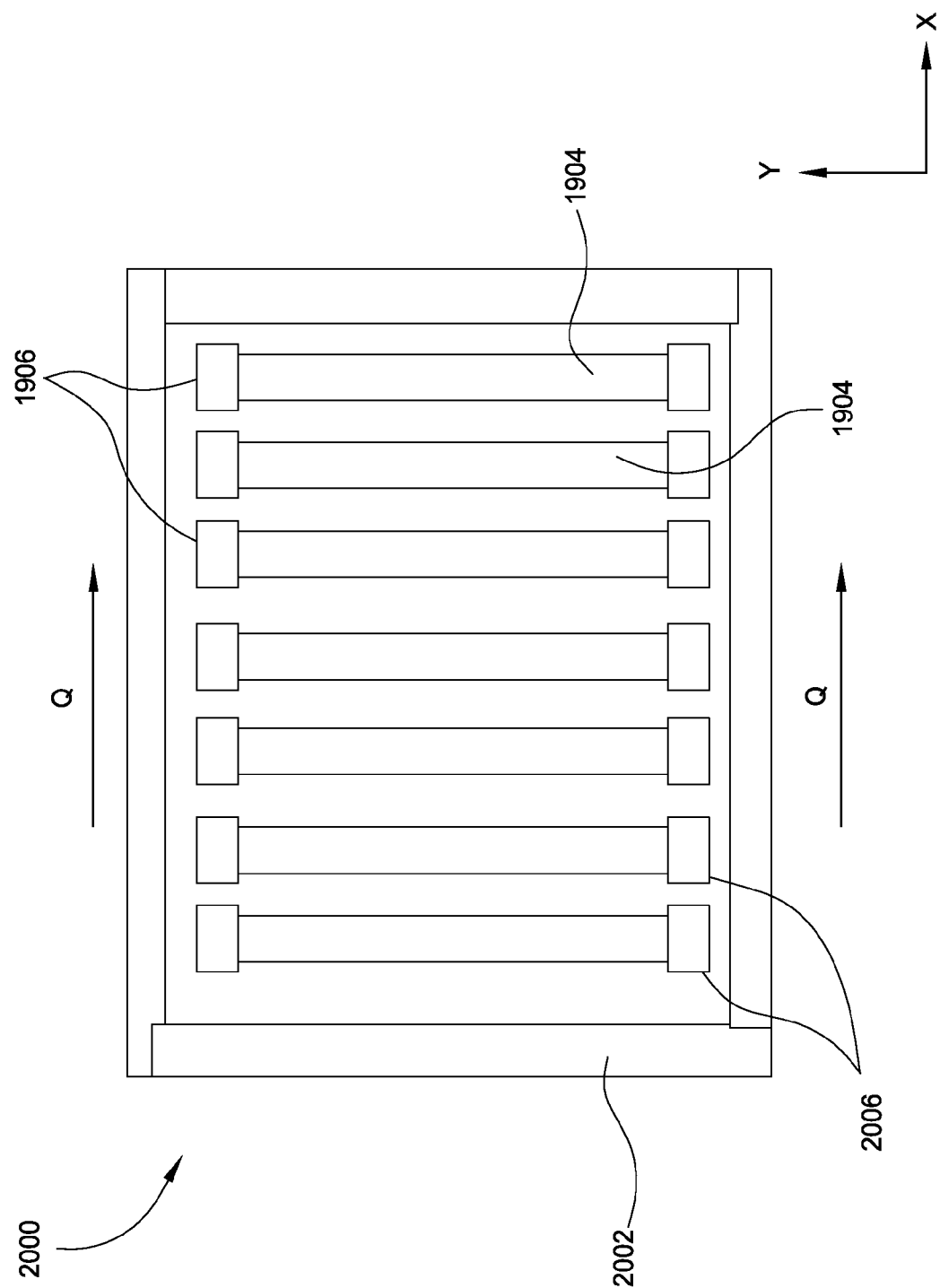
FIG. 20 is a schematic illustration of a vertical substrate batch load lock system according to one embodiment.

FIG. 20 is a schematic illustration of a vertical substrate batch load lock system 2000 according to one embodiment. The load lock system 2000 includes a load lock chamber body 2002 that may contain a batch of substrates 2004 therein. The substrates 2002 may each be coupled to an indexing mechanism 706 that linearly actuates the substrates 2002 in the direction shown by arrows Q to permit the substrates 2004 to be retrieved by a robot for insertion onto a carrier and passage through the processing chamber. It is to be understood that the vertical substrate batch load lock system 2000 may be utilized in any of the embodiments discussed above. Additionally, the load lock system 2000 may accommodate two substrates disposed within the body 2002 in an end to end fashion.

Figure 21:
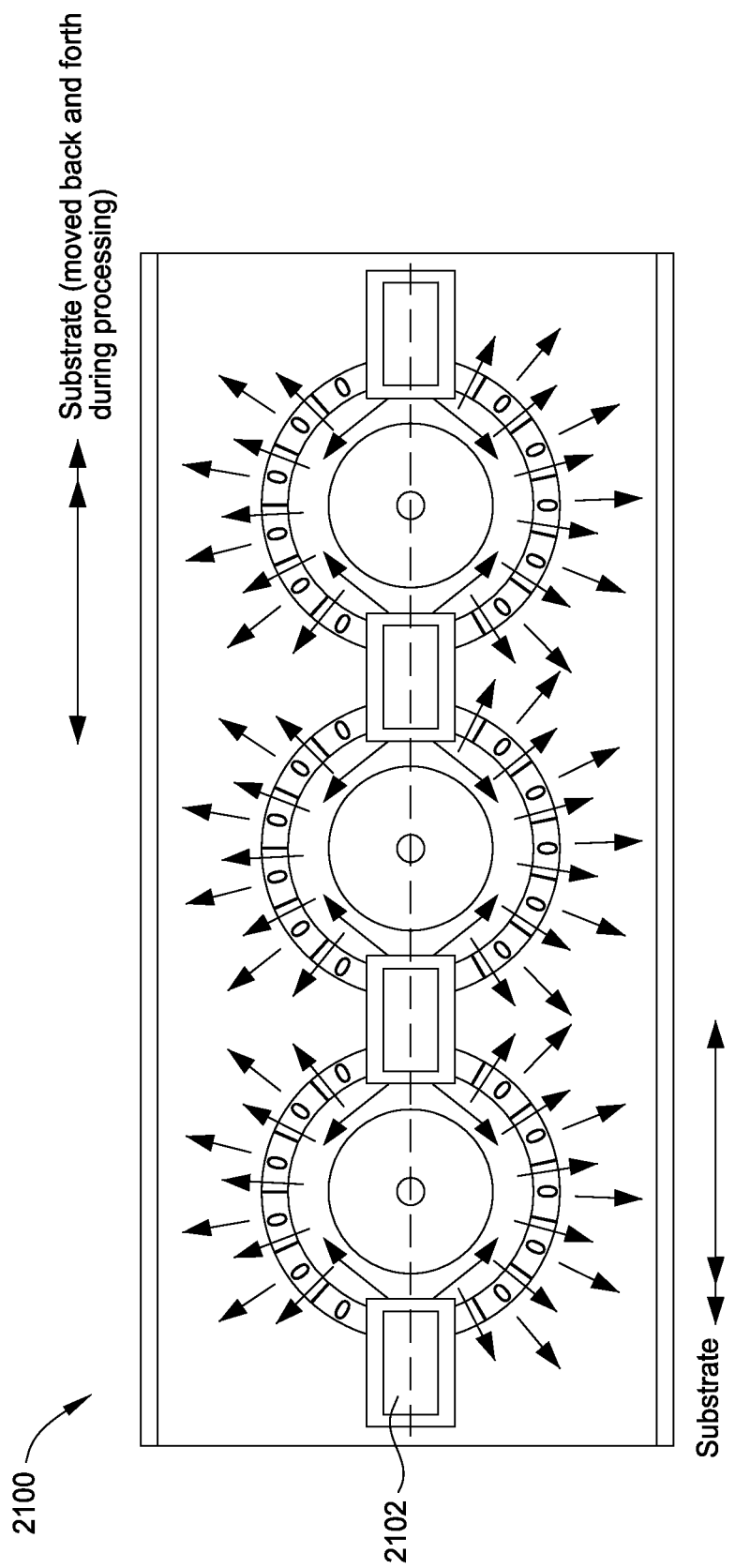
FIGS. 21-22 are schematic illustrations of another embodiment of a plasma generator.
Figure 22:
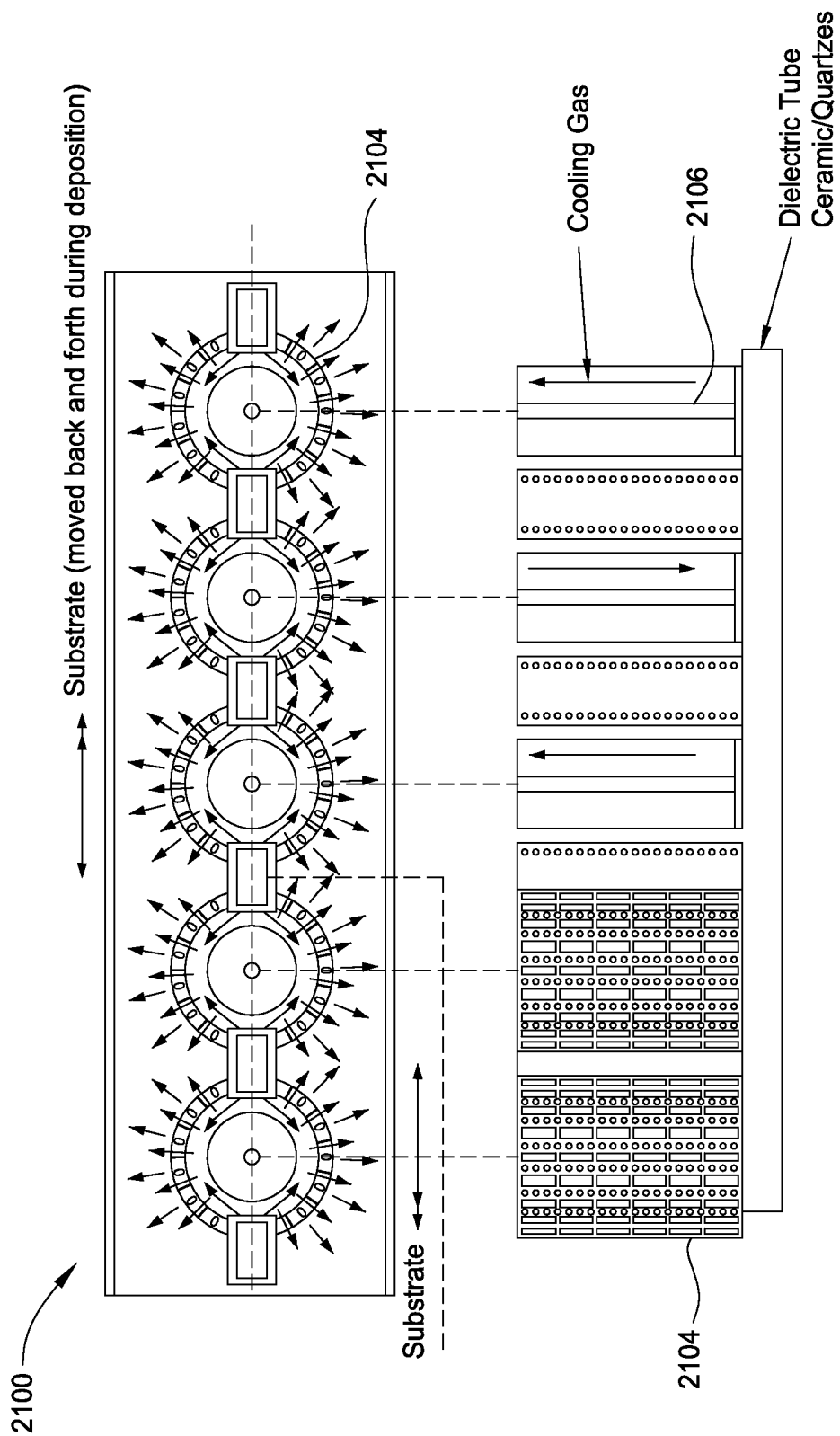

FIGS. 21-22 are schematic illustration of another embodiment of a plasma generator 2100. The plasma generator 2100 includes a supply conduit 2102 for providing an excitation gas such as Ar, Xe and/or Kr. A quartz tube 2104 surrounds the plasma generator 2106. The quartz tube 2104 includes window for allowing plasma formed from the excitation gas to enter a diffusion plasma region defined on either side of the plasma generator 2106 where each substrate is processed. The quartz tube 2104 also includes a plurality of holes for allowing process gases, for example such as $SiH_4$, $Si_2H_6$ and $NH_3$ for SiN deposition, to enter the diffusion plasma region.

Figure 23:
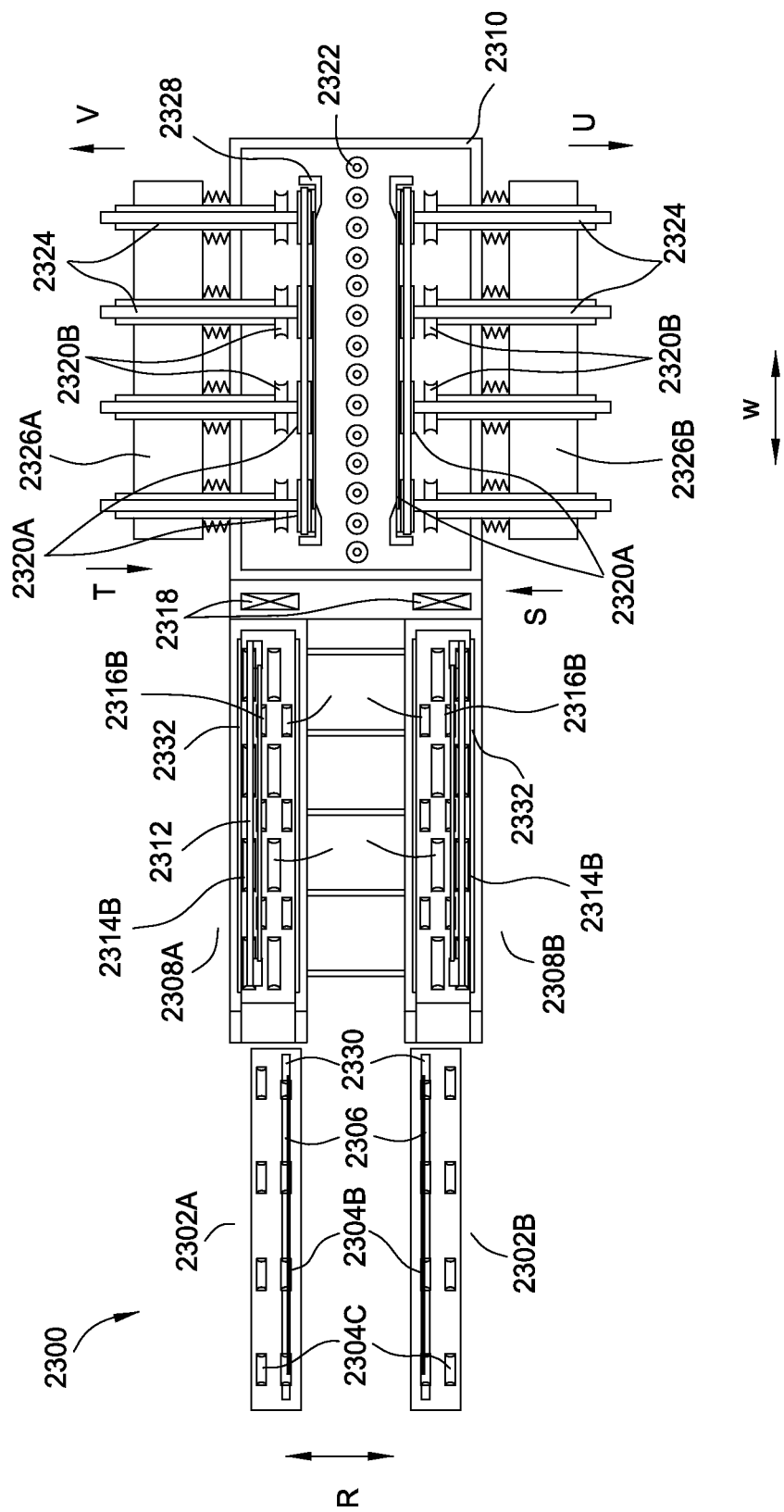
FIG. 23 is a schematic system layout for a static PECVD system according to another embodiment.

FIG. 23 is a schematic system layout for a static PECVD system 2300 according to one embodiment. The system 2300 utilizes a sub-frame loader/unloader mechanism in the load lock chambers and two sets of roller drivers. The processing chamber has a shuttle mechanism to move the substrates into processing position. The atmospheric loader/unloader has a shuttle mechanism as well.

The system 2300 includes two loader/unloader carriages 2302A, 2302B, two load lock chambers 2308A, 2308B, and a dual processing chamber 2310. The loader/unloader carriages 2302A, 2302B are movable laterally as shown by arrows "R" to retrieve/deliver substrates 2306 to/from the load lock chambers 2308A, 2308B. While not shown, it is contemplated that a single loader/unloader carriage 2302A, 2302B may be used to move laterally as shown by arrows "R" to retrieve/deliver substrates 23406 to/from the load lock chambers 2308A, 2308B. The substrates 2306 are held within a substrate frame 2330 that is supported on drive rollers 2304. Each substrate 2306 will stay with a substrate frame 2330 as it travels from the atmospheric loader/unloader carriages 2302A, 2302B through the load lock chambers 2308A, 2308B and into the processing chamber 2310. The substrate frames 2330 are moved in and out of the load lock chambers 2308A, 2308B by the drive rollers 2304 that remain in atmosphere.

The loader/unloader carriages 2302A, 2302B each have a set of linearly aligned inside rollers 2304A and a set of linearly aligned outside rollers 2304B. Both the inside rollers 2304A and outside rollers 2304B will be used for substrates 2306 entering and exiting the system 2300. For example, when a processed substrate 2306 and frame 2330 enter a loader/unloader carriage 2302A, 2302B from a load lock chamber 2308A, 2308B onto the inside rollers 2304A, the processed substrate 2306 will be removed from the frame 2330. A new substrate 2306 will then be placed into the frame 2330 on the inside rollers 2304A to then enter a load lock chamber 2308A, 2308B. The next processed substrate 2306 and frame 2330 that exits a load lock chamber 2308A, 2308B will then enter a loader/unloader carriage 2302A, 2302B on the outside rollers 2304B where the substrate 2306 will be removed and a new substrate placed into the frame 2330. Thus, the substrates 2306 alternate between the inside rollers 2304A and the outside rollers 2304B. The substrates 2306 on each set of rollers 2304A, 2304B have a "deposition" surface that faces a center line of the system 2300 when within the loader/unloader carriages 2302A, 2302B.

The load lock chambers 2308A, 2308B may have a carrier plate 2312 that carries the substrate 2306 and the substrate frame 2330. Similar to the loader/unloader carriages 2302A, 2302B, the load lock chambers 2308A, 2308B each have a set of linearly aligned inside rollers 2314A upon which the carrier plate 2312 will move, a set of linearly aligned inside rollers 2316A upon which the substrate 2306 and frame 2330 will move in from and out to atmosphere from the load lock, a set of linearly aligned outside rollers 2314B upon which the carrier plate 2312 will move, and a set of linearly aligned outside rollers 2316B upon which the substrate 2306 and frame 2330 will move in from and out to atmosphere from the load lock. Both the inside rollers 2314A, 2316A and outside rollers 2314B, 2316B will be used for substrates 2306 passing through the load lock chambers 2308A, 2308B from atmosphere. Once a substrate 2306 enters a load lock chamber 2308A, 2308B on a substrate frame 2330, it is then transfers from the drive roller set 2316A, 2316B onto a carrier plate 2312. For example, when a processed substrate 2306, frame 2330 and carrier 2312 enter a load lock chamber 2308A, 2308B from the processing chamber 2310 onto the inside rollers 2314A, a new substrate 2306, frame 2330 and carrier 2312 will then enter the processing chamber 2310 from the load lock on the outside rollers 2314B. The processed substrate 2306, frame 2330 and carrier 2312 enter a load lock chamber 2308A, 2308B from the processing chamber 2310 along the same rollers 2314A, 2314B, upon which they entered the processing chamber 2310. Thus, the frame 2330 and carrier 2312 will always travel along the same set of rollers 2314A, 2314B. However, the substrates, both processed and unprocessed, may travel along any of the rollers 2314A, 2314B, 2316A, 2316B, 2304A, 2304B.

Each set of rollers 2304A, 2304B, 2316A, 2316B, imparts movement to the substrate frame 2330. Each set of rollers 2314A, 2314B, 2320A, 2320B, imparts movement to the carrier 2312. The load lock chambers 2308A, 2308B may additionally include one or more wall heaters 2332. The load lock chambers 2308A, 2308B are environmentally isolated from the processing chamber 2310 by slit valve doors 2318. The processing chamber 2310 includes processing chamber carriages 2326A, 2326B that laterally move as shown by arrows "S", "T", "U" and "V" to move the substrate 2306 frame 2330 and carrier 2312 into and out of a processing position. Within the processing chamber 2310, the substrate 2306, substrate carrier 2330, and carrier plate 2312 may all be disposed on one or more rollers 2320A, 2320B that are coupled to a corresponding roller drive 2324. The roller drives 2324 are actuated by the process chamber carriage 2326A, 2326B to move the substrates 2306 into position adjacent the antenna sources 2322 by moving in the direction of arrows "S" and "T". The roller drives 2324 are actuated by the process chamber carriage 2326A, 2326B to move the substrates 2306 out of position further away from the antenna sources 2322 by moving in the direction of arrows "U" and "V". The inside rollers 2320A and outside rollers 2320B receive the carrier 2312 from a load lock chamber 2308A, 2308B. The roller drives 2324 position the carrier 2312, substrate 2306 and frame 2330 the same distance from the microwave antenna sources 2322. Thus, the roller drives 2324 are controlled to move the rollers 2320A, 2320B based upon which rollers 2320A, 2320B a carrier 2312, substrate 2306 and frame 2330 are disposed. A shadow frame 2328 may also be present to prevent deposition on the substrate carrier 2330 and perimeter of the substrate 2306.

Utilizing system 2300, a CVD process may proceed as follows. Substrates 2306 may be loaded into empty substrate frames 2330 in the loader/unloader carriages 2302A, 2302B. The substrates 2306 are clamped to the frames 2330 with clips (not shown) to hold the substrates 2306 in a predetermined position on the frame 2330. Simultaneously, the substrates that have just been processed may be received in the load lock chambers 2308A, 2308B from the processing chamber 2310. The load lock chambers 2308A, 2308B may then be vented to atmosphere. Simultaneously, new substrates that have just been received from the load lock chambers 2308A, 2308B into the processing chamber 2310 may be moved into the processing position by moving the rollers 2320A, 2320B in the direction shown by arrows "S" and "T" to begin being processed in the processing chamber 2310. Within the processing chamber 2310, the substrate 2306 may oscillate in front of the antenna sources 2322 as shown by arrows "W" to account for the pitch of the microwave antenna sources 2322 and thereby enhance deposition uniformity.

While the substrates 2306 are processed within the processing chamber 2310, doors that are between the loader/unloader carriages 2302A, 2302B and the load lock chambers 2308A, 2308B may be opened so that the finished substrates 2306 may unload from the load lock chambers 2308A, 2308B. The just loaded substrates 2306 may then enter the load lock chambers 2308A, 2308B from the loader/unloader carriages 2302A, 2302B. The loader/unloader carriages 2302A, 2302B then index by moving laterally in the direction shown by arrows "R" to be ready to receive new substrates. The new substrates 2306 are alternately placed on the outside rollers 2304B and inside rollers 2304A. For example, a processed substrate 2306 and carrier 2312 enter a loader/unloader carriage 2302A, 2302B along the inside rollers 2304A. The processed substrate 2306 will be unloaded and a new, unprocessed substrate 2306 will be placed into the carrier 2312 to then enter a load lock chamber 2308A, 2308B along its inner rollers 2316A. The very next processed substrate 2306 and carrier 2312 that enters the loader/unloader carriage 2302A, 2302B will enter along the outside rollers 2304B. The doors to the load lock chambers 2308A, 2308B may the close and the load lock chambers 2308A, 2308B may then begin to pump down to the appropriate vacuum level.

Next, the finished substrates 2306 now contained within the loader/unloader carriages 2302A, 2302B may be unloaded while the load lock chambers 2308A, 2308B finish pumping down to the appropriate vacuum level. Simultaneously, the substrates 2306 within the processing chamber 2301 may complete processing and then be moved back to the substrate exchange position by actuating the roller drives 2324 in the direction shown by arrows "U" and "V".

Next, slit valve doors 2318 may be opened between the load lock chambers 2308A, 2308B and the processing chamber 2310. New substrates 2306 may be loaded into the loader/unloader carriages 2302A, 2302B while the finished substrates 2306 are retrieved from the processing chamber 2310 into the load lock chambers 2308A, 2308B. Then, new substrates 2306 may be placed into the processing chamber 2310 from the load lock chambers 2308A, 2308B. The slit valves 2318 may be closed and the substrates 2306 may be moved into the processing position as shown by arrows "S" and "T". The load lock chambers 2308A, 2308B may begin to be vented. The cycle may then continuously repeat until a desired number of substrates 2306 have been processed.

Figure 24:
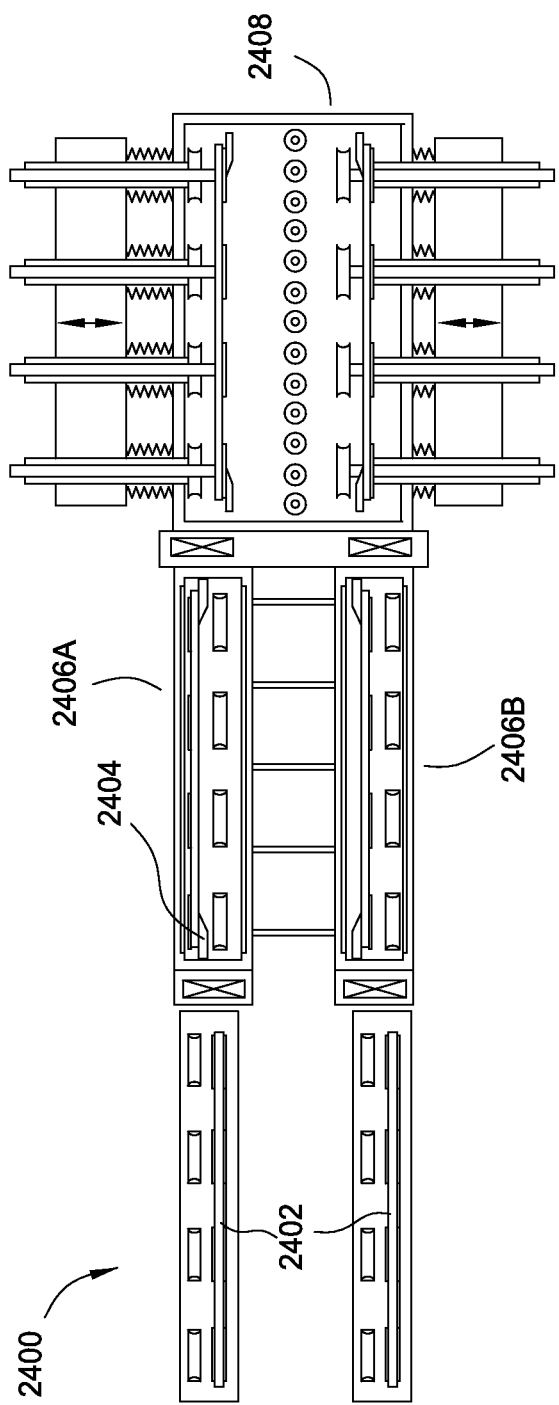
FIG. 24 is a schematic system layout for a static PECVD system according to another embodiment.

FIG. 24 is a schematic system layout for a static PECVD system 2400 according to another embodiment. The system is similar to system 2300 except that the carrier 2402 moves throughout the system 2400 and a shadow frame 2404 moves within both the load lock chambers 2406A, 2406B and the processing chamber 2408 rather than simply being utilized within the processing chamber only. The shadow frame 2404 may engage the carrier 2402 are shown and described in FIGS. 27A-27D. The processing steps performed utilizing system 2400 would be substantially the same as the processing steps performed utilizing system 2300.

Figure 25:
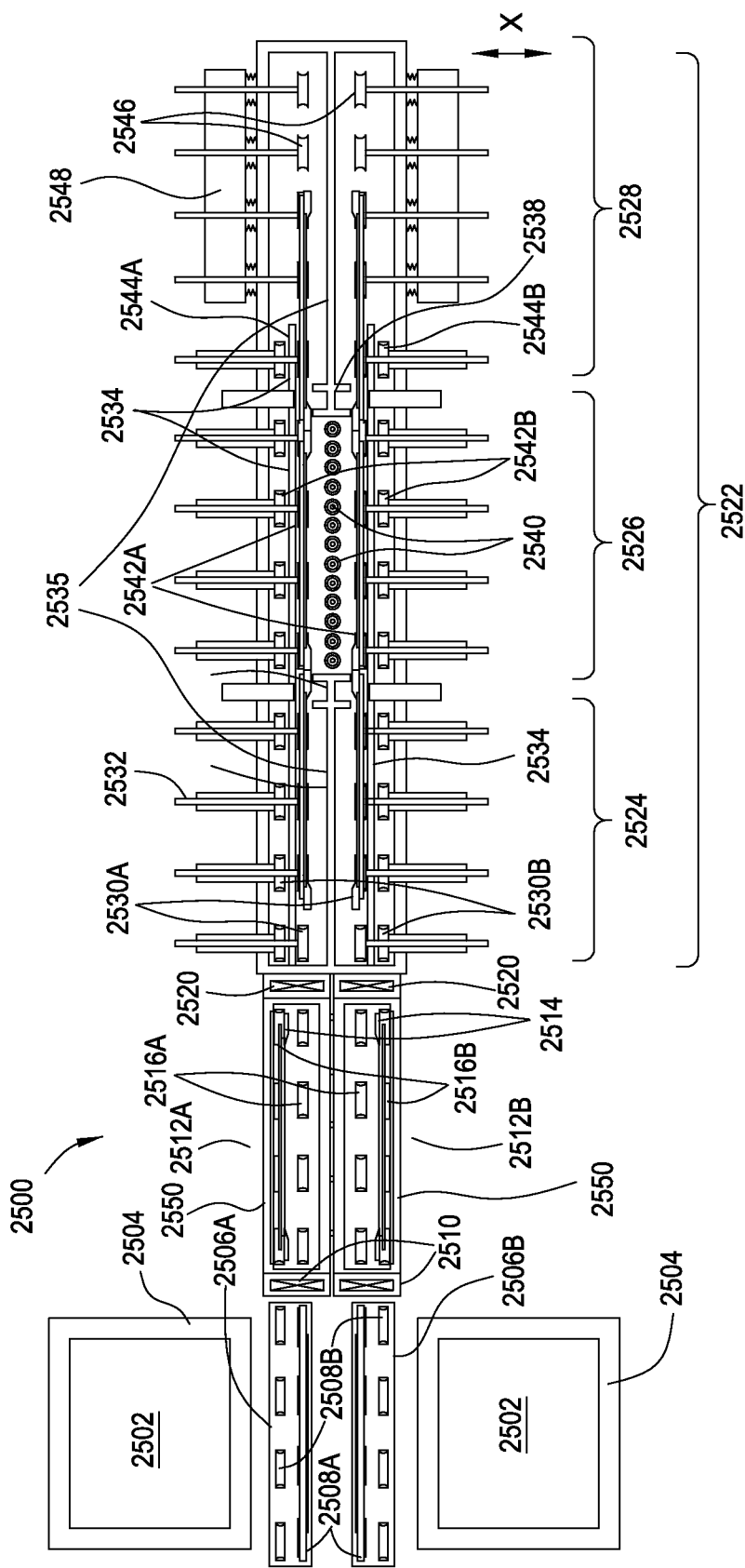
FIG. 25 is a schematic system layout for a dynamic PECVD system 2500 according to another embodiment.

FIG. 25 is a schematic system layout for a dynamic PECVD system 2500 according to another embodiment. The system 2500 includes substrate loading/unloading stations 2506A, 2506B where substrates 2502 and carriers 2504 are loaded/unloaded to/from the system 2500. The loading/unloading stations 2506A, 2506B each have inner rollers 2508A and outer rollers 2508B. The substrates 2502 are loaded into carriers 2504 and placed onto the inner rollers 2508A before entering a load lock chamber 2512A, 2512B. The processed substrates 2502 enter the loading/unloading stations 2506A, 2506B from a load lock chamber 2512A, 2512B on the outer rollers 2508B. Slit valves 2510 environmentally isolate the loading/unloading stations 2506A, 2506B from the load lock chambers 2512A, 2512B.

The substrates 2502 and carriers 2504 enter the load lock chambers 2512A, 2512B on inside rollers 2516A that are present in the load lock chambers 2512A, 2512B. Within the load lock chambers 2512A, 2512B, a shadow frame 2514 is disposed over the substrate 2502 and carrier 2504 to protect the carrier 2504 from deposition as will be discussed below in regards to FIGS. 27A-27D. The load lock chambers 2512A, 2512B, which were vented to atmosphere to permit the substrate 2502 and carrier 2504 to enter, may now be evacuated. The shadow frame 2514 will travel with the substrate 2502 and carrier 2504 throughout the remainder of the process until the substrate 2502 and carrier 2504 return to a load lock chamber 2512A, 2512B along the outer rollers 2516B. The load lock chambers 2512A, 2512B each may have a wall heater 2550 that may preheat the substrate 2502 and carrier 2504 before processing. The substrate 2502, carrier 2504 and shadow frame 2514 may then enter the processing chamber 2522 for processing through a slit valve 2520.

The processing chamber 2522 includes a staging area 2524, a processing area 2526 and a shuffle chamber area 2528. Each area 2524, 2526, 2528 are partially isolated from the adjacent area 2524, 2526, 2528 by an intra-chamber barrier 2536, 2538. In the embodiment shown in FIG. 25, the chamber barriers 2536, 2538 are shutters, but it is to be understood that other chamber barriers may be utilized as well such as slit valves or gas curtains. The substrates 2502, carrier 2504 and shadow frame 2514 enter the staging area 2524 along inner rollers 2530A. The substrates 2502, carrier 2504 and shadow frame 2514 pass by the intra-chamber barrier 2536 and into the processing area 2526 where one or more microwave antennas 2540 are disposed. The substrates 2502, carrier 2504 and shadow frame 2514 pass through the processing area 2526 along inner rollers 2542A. The substrates 2502, carrier 2504 and shadow frame 2514 then pass by the intra-chamber barrier 2538 and into the shuffle chamber area 2528. The substrates 2502, carrier 2504 and shadow frame 2514 enter the shuffle chamber area 2528 along inner rollers 2544A before stopping on rollers 2546. Once on rollers 2546, rollers drives 2548 actuate to move the rollers in the direction shown by arrows "X" so that the rollers 1646 are not linearly aligned with the inner rollers 2530A, 2542A, 2544A, but rather, are linearly aligned with outer rollers 2530B, 2542B, 2544B. The processing chamber 2522 may be evacuated through a pumping port that is disposed between the wall 2534 and wall 2535 and may also be disposed in shuffle chamber 2528. Gas may be introduced to the processing chamber 2522 in an area between the microwave antennas 2540 and/or between the microwave antennas 2540 and the substrate 2502. During the deposition process, the substrate 2502 moves past the microwave antennas 2540 at a substantially constant velocity. More specifically, the substrate 2502 moves through the processing area 2526 at a substantially constant velocity. It is to be understood that while a shuffle chamber area 2528 has been described, a turn-around chamber as discussed above is also contemplated.

The substrates 2502, carrier 2504 and shadow frame 2514 will now begin to travel back towards a loading/unloading station 2506A, 2506B along the outer rollers 2530B, 2542B, 2544B. The substrates 2502, carrier 2504 and shadow frame 2514 begin their journey by rolling onto the outer rollers 2544B that are within the shuffle chamber area 2528, then onto the outer rollers 2542B which are separated from the processing area 2526 by wall 2534 and finally onto the outer rollers 2530B of the staging area 2524 which is separated from the carrier entry area also by wall 2534. The outer rollers 2530B, 2542B, 2544B are all disposed behind a wall 2534 that separates the outer rollers 2530B, 2542B, 2544B from the inner rollers 2530A, 2542A, 2544A and isolates the substrates 2502, carrier 2504 and shadow frame 2514 from the microwave antennas 2540 to prevent deposition thereon. A slit valve 2520 is then opened between the staging area 2524 and a load lock chamber 2512A, 2512B and the substrates 2502, carrier 2504 and shadow frame 2514 roll onto the outer rollers 2516B of a load lock chamber 2512A, 2512B. Within the load lock chamber 2512A, 2512B, the shadow frame 2514 will disengage from the substrate 2502 and carrier 2504. The load lock chamber 2512A, 2512B will vent and a slit valve door 2510 will open to permit the substrate 2502 and carrier 2504 to enter the loading/unloading station 2506A, 2506B along the outer rollers 2508B. The substrate 2502 may then be removed from the system.

When a process is running in system 2500, substrates 2502 may be loaded from substrate cassettes to the carriers 2504 and placed into a loading/unloading station 2506A, 2506B. The substrates 2502 are clamped to the carriers 2504 with clips (not shown) to hold the substrates 2502 in a predetermined position on the carrier 2504. Simultaneously, within the load lock chambers 2512A, 2512B, carriers 2504 have just completed a vacuum exchange to receive processing substrates 2502 from the processing chamber 2522. The load lock chambers 2512A, 2512B begin to vent to atmosphere while the shadow frames 2514 are moved to opposite sides of the load lock chambers 2512A, 2512B adjacent the inner rollers 2516A. Simultaneously, substrates 2502, carriers 2504 and shadow frames 2514 pass through the plasma within the processing area 2526. As the substrate 2502, carrier 2504 and shadow frame 2514 exits the plasma, the substrate 2502, carrier 2504 and shadow frame 2514 accelerate into the shuffle chamber area 2528 onto rollers 2546. The roller drives 2548 then actuate to move the substrate 2502, carrier 2504 and shadow frame 2514 to align with the outside rollers 2530B, 2542B, 2544B. The substrate 2502, carrier 2504 and shadow frame 2514 will then move to the staging area 2524 to await the next vacuum exchange with the load lock chambers 2512A, 2512B. Meanwhile, processing will continue on at a slow, steady pass with other substrates 2502 and the roller drives 2548 will actuate back into alignment with the inner rollers 2530A, 2542A, 2544A.

Next, the substrate 2502 and carrier 2504 just loaded into a loading/unloading station 2506A, 2506B enter into a corresponding load lock chamber 2512A, 2512B along inner rollers 2516A from inner rollers 2508A while a processing substrate 2502 and carrier 2504 exit a load lock chamber 2512A, 2512B along outer rollers 2516B onto outer rollers 2508B. The processed substrates may then be unloaded from the carrier 2504 and back into a storage cassette. After the substrate 2502 and carrier 2504 have entered a load lock chamber 2512A, 2512B, the load lock chamber 2512A, 2512B may be evacuated and shadow frames 2514 may be moved into place as will be discussed below in regards to FIGS. 27A-27D. Within the processing chamber, processing continues as described above.

Next, new substrates 2502 and carriers 2504 are reloaded into a loading/unloading station 2506A, 2506B. Within the load lock chambers 2512A, 2512B, a substrate 2502, carrier 2504 and shadow frame 2514 enter the load lock chamber 2512A, 2512B from the processing chamber from outer rollers 2530B onto outer rollers 2516B. Simultaneously, a substrate 2502, carrier 2504 and shadow frame 2514 enter the processing chamber 2522 along inner rollers 2530A from inner rollers 2516A. The slit valve 2520 may then close to permit the load lock chamber 2512A, 2512B to vent to atmosphere. Within the processing chamber 2522, the substrate 2502, carrier 2504 and shadow frame 2514 accelerate to catch up with a substrate 2502, carrier 2504 and shadow frame 2514 that are being processing in the processing area 2526.

One element to note about the processing chamber 2522 is the different speeds with which the substrates 2502, carriers 2504 and shadow frames 2514 move within the different areas 2524, 2526, 2528. The substrates 2502, carriers 2504 and shadow frames 2514 move within the staging area 2524 and shuffle chamber area 2528 at a greater speed than through the processing area 2526. The staging area 2524 and shuffle chamber area 2528 permit substrate throughput to be high even though the substrates 2502, carriers 2504 and shadow frames 2514 will move quite slow through the processing area 2526. In general, the time period that a substrate 2502 is within a load lock chamber 2512A, 2512B shall be approximately equal to the time period that a substrate 2502 is passing through the processing area 2526 and staging area 2524 collectively and also equal to the time period that a substrate 2502 is passing into and through the shuffle chamber area and along the outside rollers 2544B, 2542B, 2530B. The substrate 2502 passes through the processing area 2526 at a substantially constant velocity to enhance deposition uniformity.

One of the benefits of the dynamic system 2500 is that the carriers that come out and thermally cycle with each substrate are protected from extraneous deposits and shadow frames 2514 that collect those deposits remain hot and inside the system 2500 at all times. The throughput for the system 2500 may be as much as 130 substrates per hour. Unlike the static system, the number of individual microwave line sources and thus the total plasma power is not dependent upon the source to source spacing required to achieve the desired uniformity. The system 2500 utilizes a shadow frame load/unload mechanism within the load lock chamber. The system also utilizes a mechanism in atmosphere that removes the substrate carrier from the outer track and replaces it onto the inner track after unloading a processed substrate from and loading an unprocessed substrate onto the carrier.

FIGS. 26A-26G are schematic representations of an atmospheric loading/unloading station 2600 that may be used in system 2500. The atmospheric loading/unloading station 2600 includes a roller drive carriage 2602 that may move vertically as shown by arrows "Y" to move the inner and outer rollers 2508A, 2508B so that the substrate 2502 and carrier 2504 may be removed. Once a processed substrate 2502 and carrier 2504 have entered the atmospheric loading/unloading station 2600 on outer rollers 2508B, the substrate 2502 and carrier 2504 may be removed. The substrate carrier 2504 may be magnetized and held by magnetic repulsive forces within a magnetic yoke of the top bearing 2604 in such a way that it does not actually touch any portion of the top bearing 2604 during transport within the system 2500. In the embodiment shown, the top bearing 2604 comprises permanent magnets, however, it is contemplated that electromagnetics may be used as well.

The substrate carrier 2504 has a plurality of substrate carrier capture pins 2608. The capture pins 2608 are utilized for placing and removing the carrier 2504 onto/from the loading/unloading station 2600. The carrier 2504 is engaged by a substrate carrier carriage 2610 that has a plurality of hook elements 2612 that engage the capture pins 2608 from the bottom when the substrate 2502 and carrier 2504 are lowered from the top bearing 2604 as the roller drive carriage 2602 lowers. The carrier 2504 and substrate 2502 would then rest on the hook elements 2612. The substrate carrier carriage 2610 may then move vertically on rollers 2614 as shown by arrows "Z" to lower the carrier 2504 away from and clear of the top bearing 2604. The substrate carrier carriage 2610 is coupled to a carrier holder/rotation assembly 2616 that may then pivot about axis 2618 from a position where the carrier 2504 is substantially vertical to a position where the carrier 2504 is substantially horizontal. When the carrier holder/rotation assembly 2616 pivots, the substrate 2502 encounters lift pins 2624 that extend from a lift pin plate 2622 to remove the substrate 2502 from the carrier 2504. Alternatively, once the carrier holder/rotation assembly 2616 has rotated to a substantially horizontal position, the lift pin plate 2622 may move vertically on rollers 2626 to raise the lift pins 2624 and remove the substrate 2502 from the carrier 2504. The substrate 2502 is clamped to the carrier 2504 with clips (not shown) to hold the substrate 502 in a predetermined position on the carrier 2504. It is contemplated that the lift pin plate 2622 may be coupled to the substrate carrier carriage 2610 rather than being spaced therefrom as shown. The processed substrate 2502 may then be removed to a cassette and a fresh, unprocessed substrate 2502 may be placed on the lift pins 2624. The carrier holder/rotation assembly 2616 may then pivot back up to the vertical position. The rotation assembly carriage 2620 may then move laterally as shown by arrows "AA" to move the carrier 2504 to the inner rollers 25608A. The substrate carrier carriage 2610 may then move vertically as shown by arrows "Z" to at last partially engage the top bearing 2604. The roller drive carriage 2602 may then move vertically as shown by arrows "Y" to disengage the carrier 2504 from the hook elements 2612. The rotational assembly carriage 2620 may then move laterally as shown by arrows "AA" and the process may begin again.

Figure 26A:
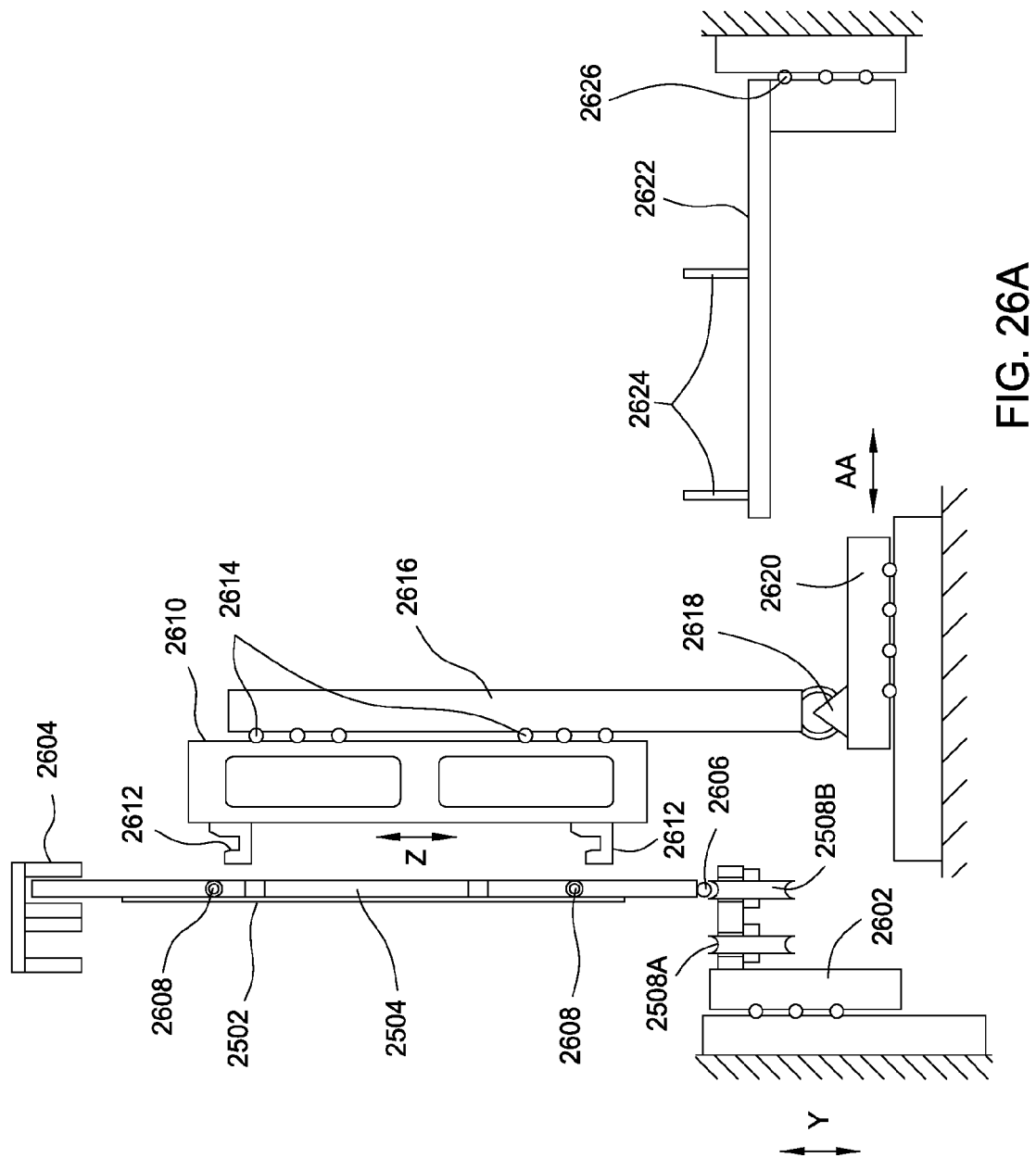
Figure 26C:
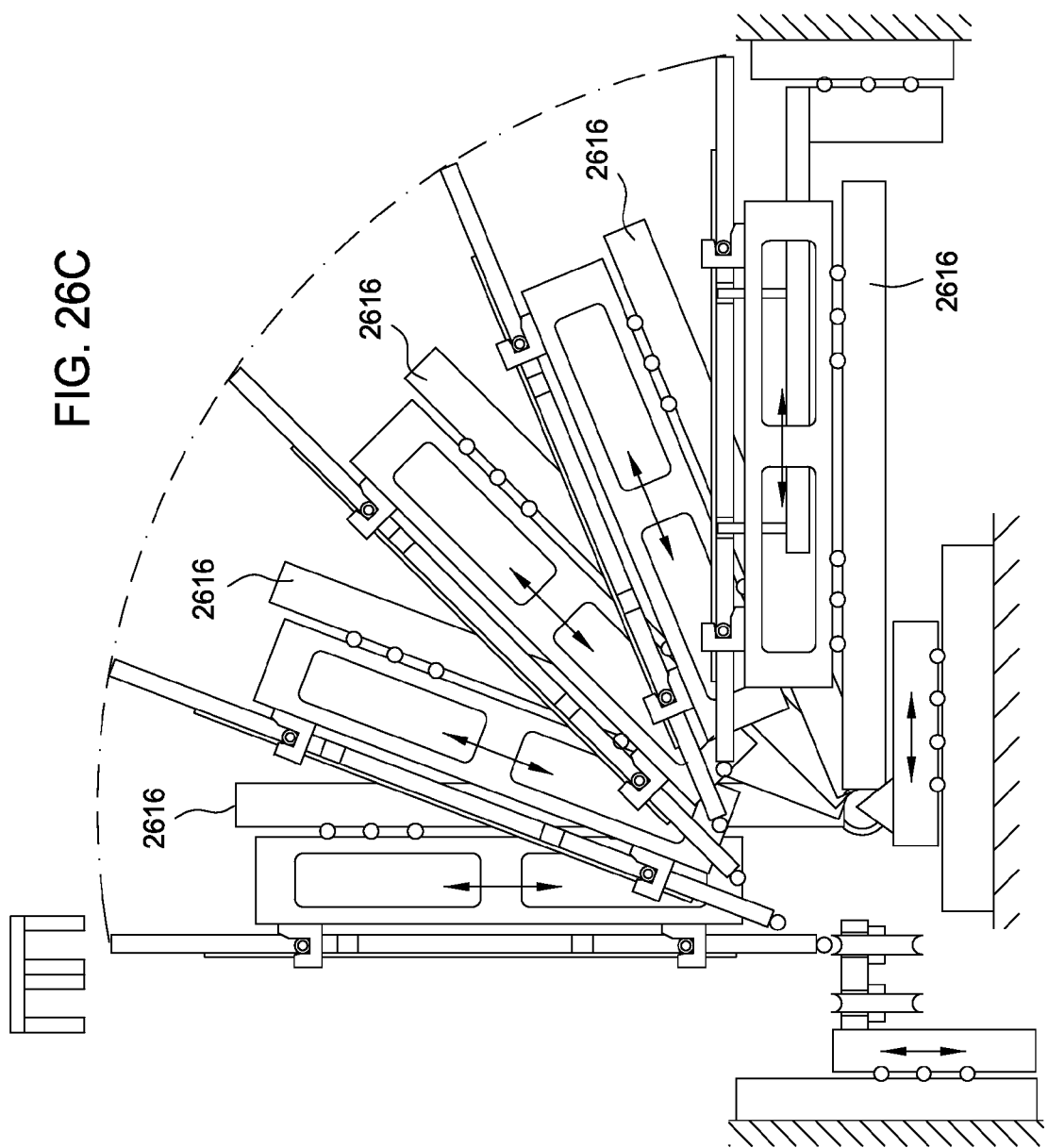
Figure 26D:
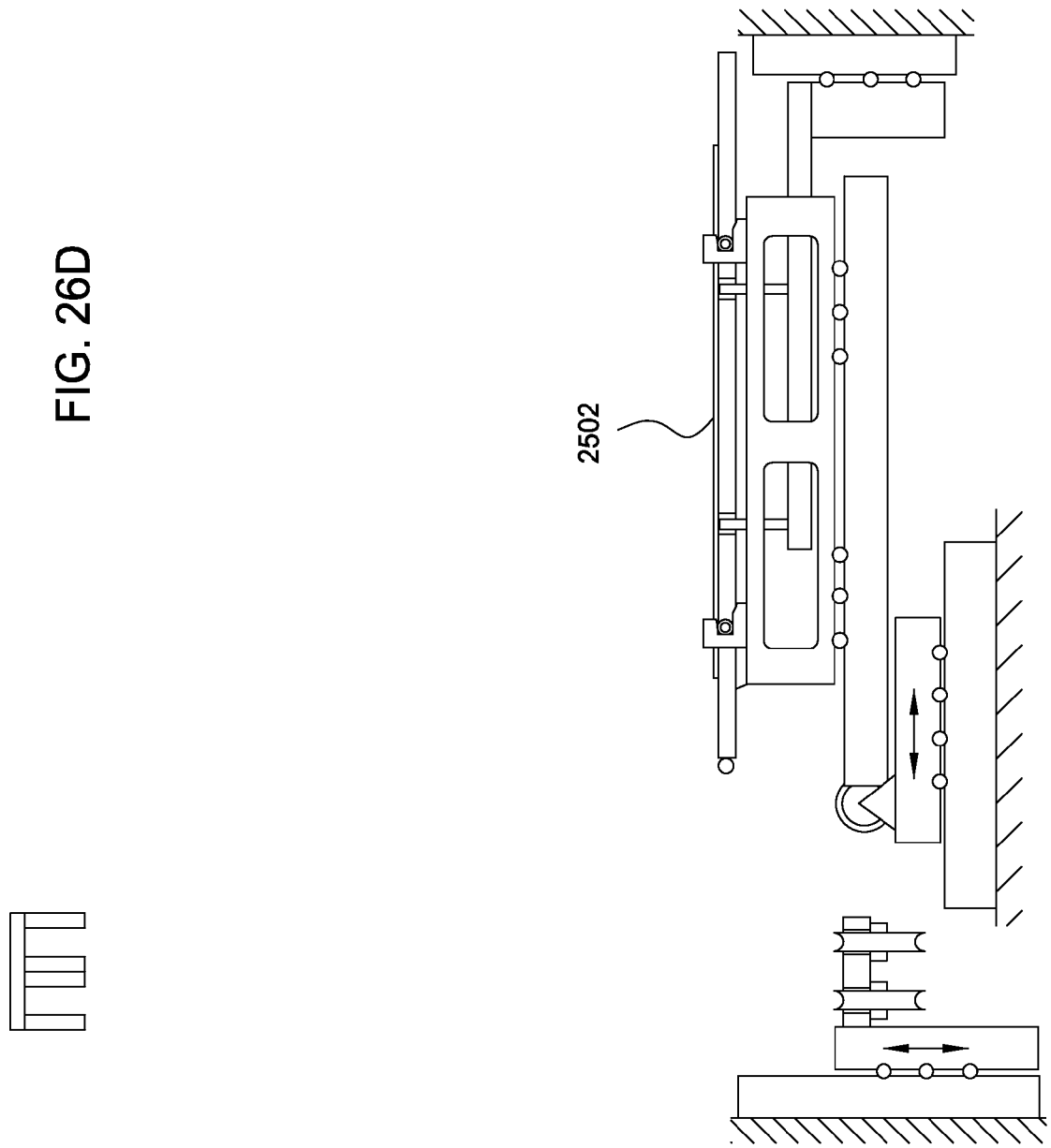
Figure 26G:
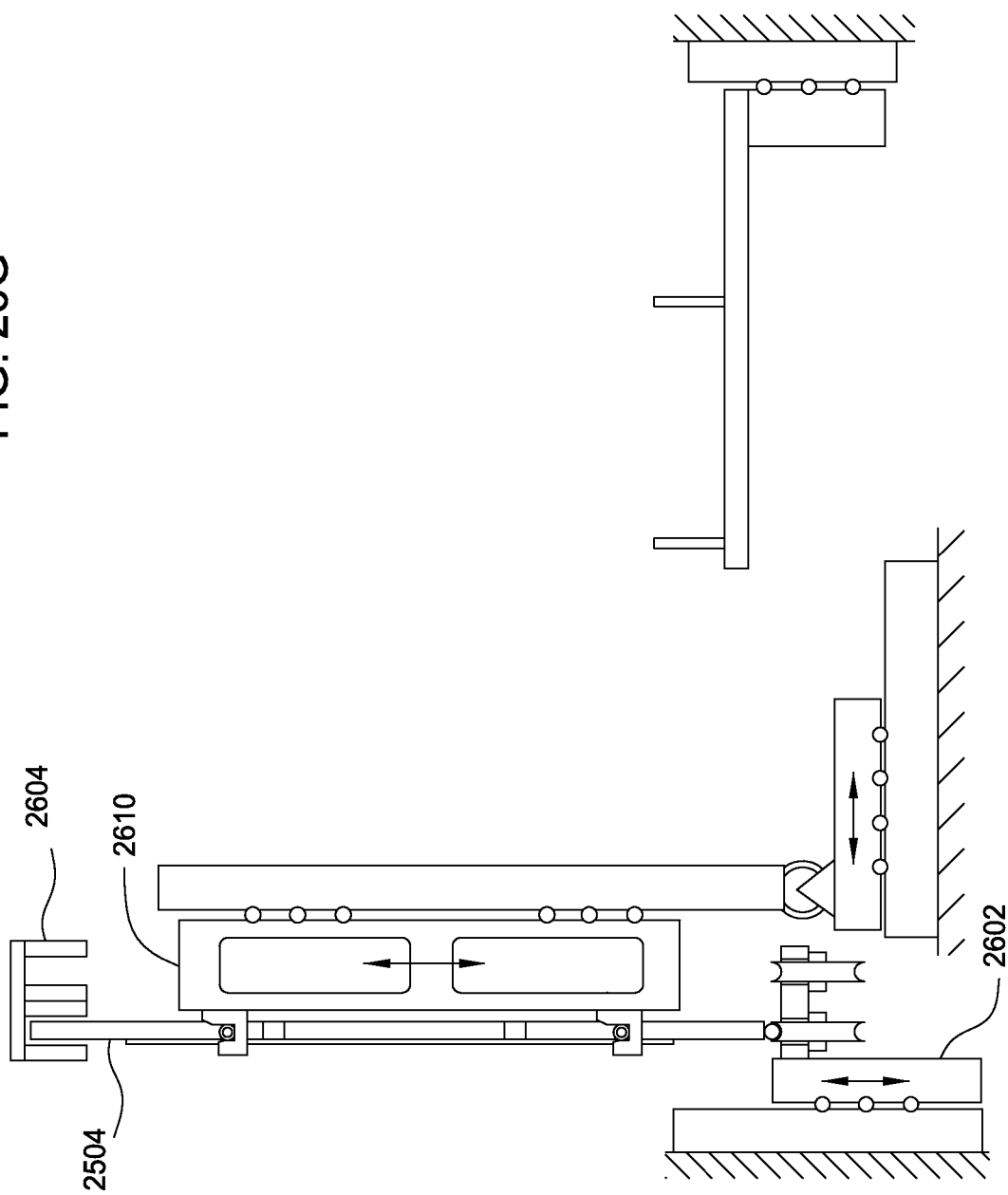

The substrate may be processed as follows. A substrate 2502 and carrier 2504 has just entered the station 2600 on the outer rollers 2508B. The carrier holder/rotation assembly 2616 moves into position to capture the carrier 2504 as shown in FIG. 26A. The roller drive carriage 2602 drops the carrier 2504 onto the hook elements 2612. The substrate carrier carriage 2610 clamps the carrier 2504 securely and extracts the carrier 2504 from the top bearing 2604 as shown in FIG. 26B. The carrier holder/rotation assembly 2616 then rotates down to the exchange-substrate position as shown in FIG. 26C. A processed substrate 2502 is then exchanged for an unprocessed substrate as shown in FIG. 26D. The carrier holder/rotation assembly 2616 then rotates back to vertical as shown in FIG. 26E. The carrier holder/rotation assembly 2616 moves the carrier 2504 into position above the inner rollers 2508A as shown in FIG. 26F. The carrier carriage 2610 lifts and re-engages the top bearing 2604 while the roller drive carriage raises to hold the carrier 2504 in position. The substrate carrier carriage 2610 unclamps and drops to release the carrier 2504 as shown in FIG. 26G. The carrier 2504 and substrate 2502 are then ready to enter a load lock chamber to prepare for processing.

FIGS. 27A-27D are schematic illustrations of the load lock shifter mechanism 2700. The load lock shifter mechanism 2700 includes a frame assembly 2704 that may be at atmospheric pressure. Within the frame assembly 2704 is a vertically extending support beam 2716, multiple horizontally extending support beams 2706 that extend from the support beam 2716, and a shadow frame engaging beam 2712. The beams 2716, 2706, 2712 are all under vacuum and therefore bellows 2708, 2710 may be used to seal the beams 2716, 2706, 2712 within the vacuum environment while permitting movement of the beams 2716, 2706, 2712. The beams 2716, 2706, 2712 are movable in the vertical direction as shown by arrows "BB" along rollers 2702 that move along the inside of the frame assembly 2704. The entire load lock shifter mechanism 2700 may move laterally as shown by arrows "CC".

Figure 27B:
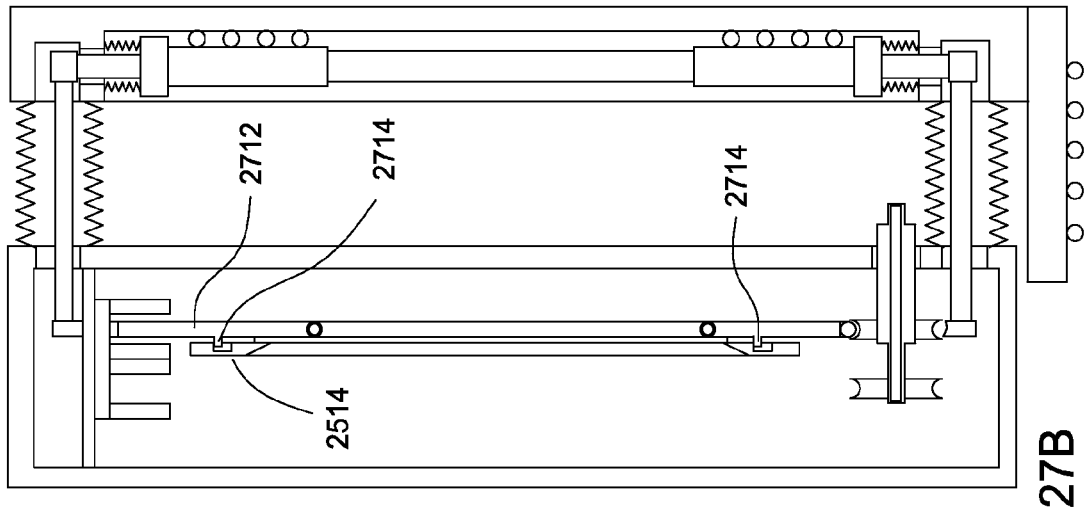
FIGS. 27A-D are schematic illustrations of the load lock shifter mechanism.
Figure 27A:
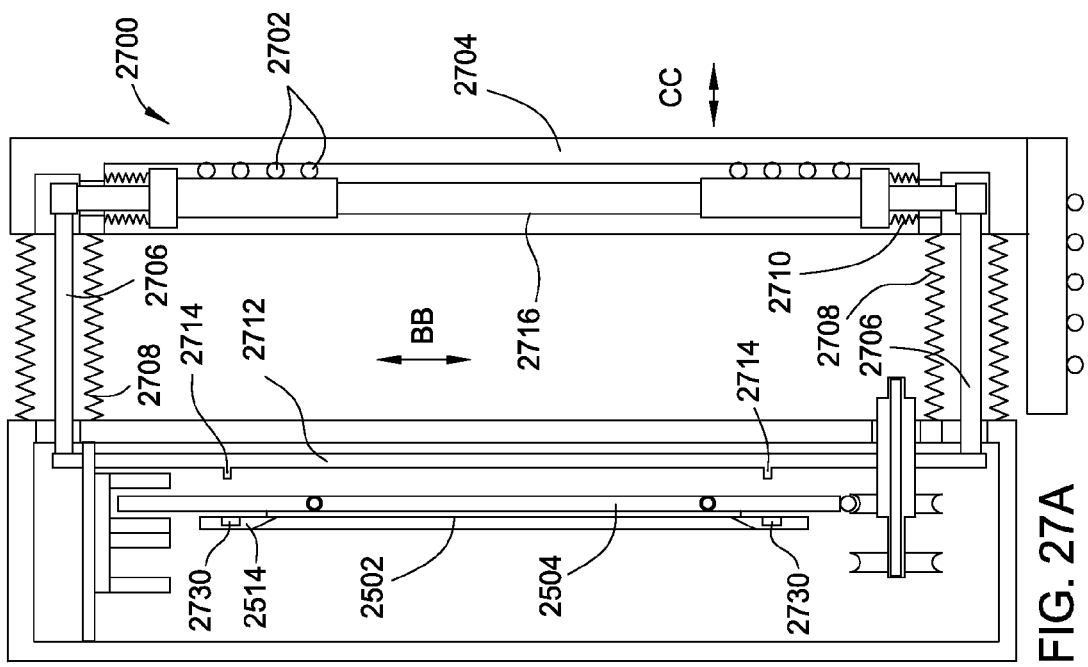
Figure 27D:
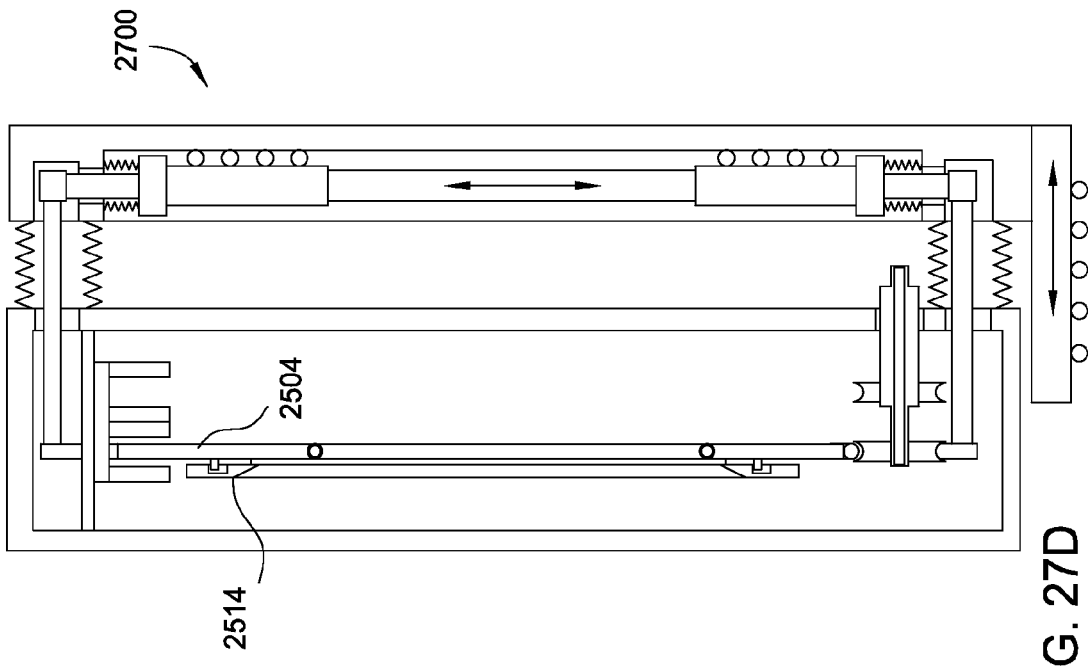
Figure 27C:
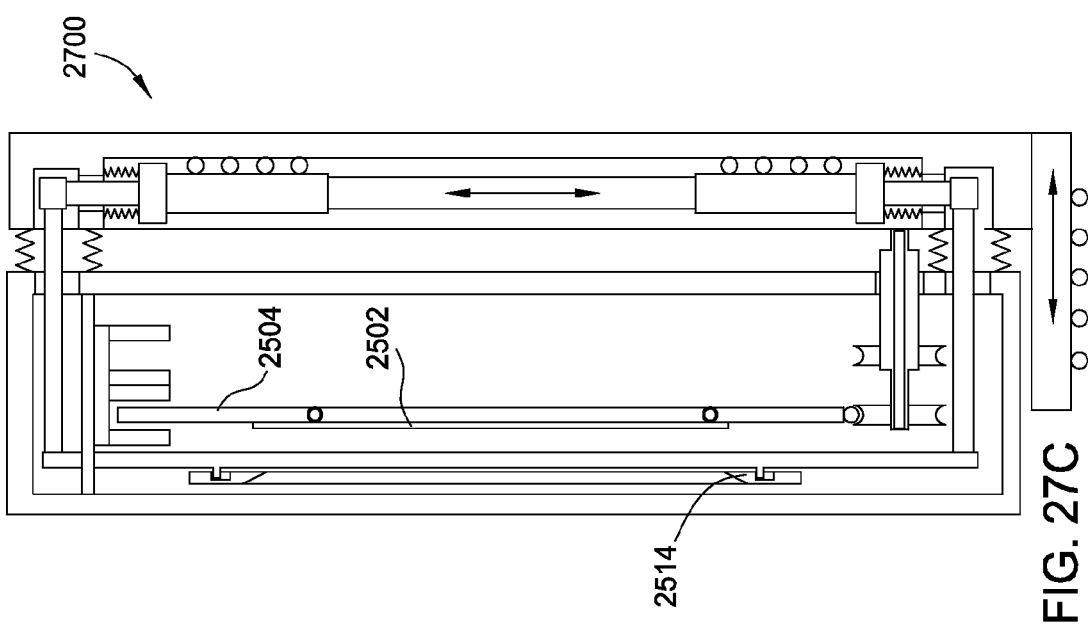

The load lock shifter mechanism 2700 operates as follows. A processed substrate 2502, carrier 2504 and shadow frame 2514 enter the load lock chamber from the processing chamber as shown in FIG. 27A. The load lock shifter mechanism 2700 then moves laterally such that the pins 2714 that extend from beam 2712 engage slots 2730 in the shadow frame 2514 as shown in FIG. 27B. While not shown, the carrier 2504 may have a plurality of pins (not shown) as well that each engage a corresponding slot (not shown) in the shadow frame 2514 to hold the shadow frame in a position coupled with the carrier 2504. The beams 2716, 2706, 2712 then move vertically as shown by arrows "BB" to lift the shadow frame 2514 from the plurality of pins (not shown) in the carrier 2504 that couple the shadow frame 2514 to the carrier 2504. The shifter mechanism 2700 then moves laterally as shown by arrows "CC" to disengage the shadow frame 2514 from the carrier 2504. The shadow frame 2514 is then moved to the opposite side of the load lock chamber. The load lock chamber may then vent to atmosphere. The substrate 2502 and carrier 2504 may then exit the load lock chamber. A new, unprocessed substrate 2502 and carrier 2504 may then enter the load lock chamber. While the load lock chamber is evacuated, the shifter mechanism 2700 moves laterally to place the shadow frame 2514 into position to drop the shadow frame 2514 onto the carrier 2504 that just entered the load lock chamber as shown in FIG. 27C. The shifter mechanism 2700 may then drop the shadow frame 2514 onto the carrier 2504 and retract to the waiting position as shown in FIG. 27D. A slit valve may then be opened to permit a processed substrate to enter the load lock chamber while the unprocessed substrate enters the processing chamber.

Figure 28:
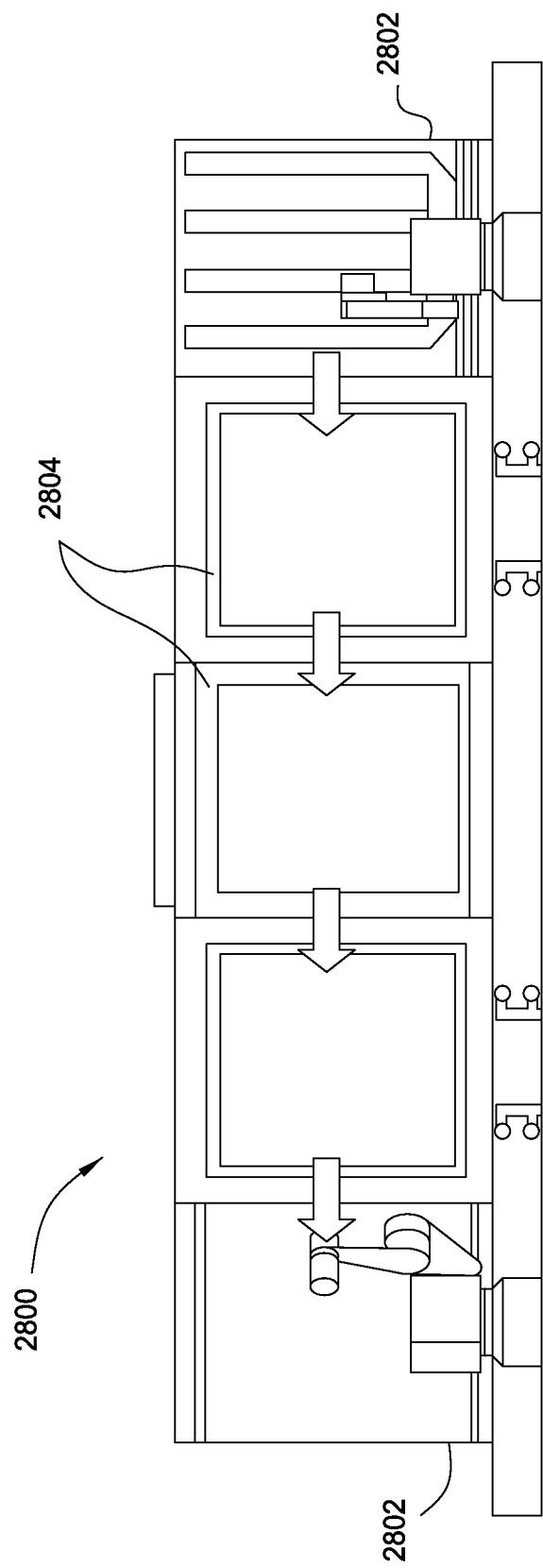
FIGS. 28-33 illustrate additional configurations for a processing system and plasma source.

FIG. 28 is a schematic cross sectional illustration of a vertical CVD system according to another embodiment. The system 2800 includes substrate unloading and loading stations 2802 and a substrate transferring shuttle 2804.

Figure 29:
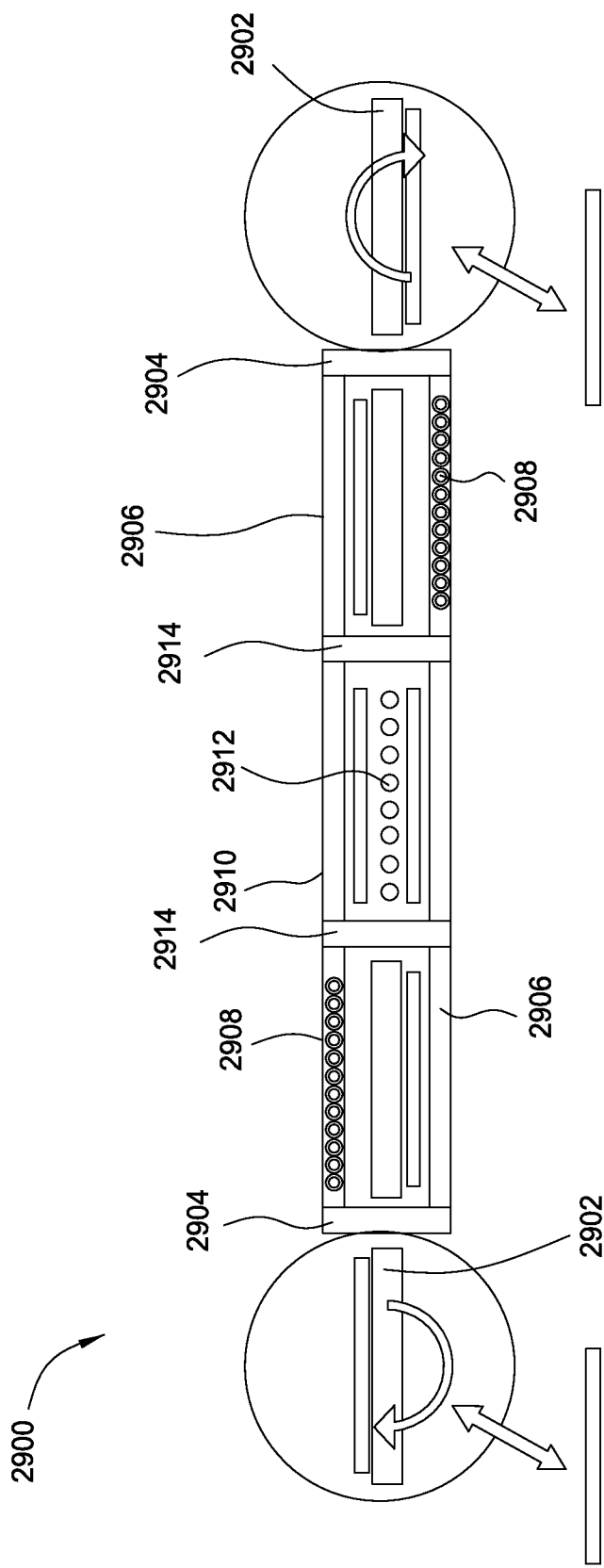

FIG. 29 is a schematic top illustration of a vertical CVD system 2900 according to another embodiment. The system 2900 includes loading/unloading robots 2902 separated from load lock chambers 2906 by doors 2904. The load lock chambers 2906 include heater transfer elements 2908, such as infrared heaters, to heat the substrates prior to entering the processing chamber 2910 through slit valve openings 2914. Within the processing chamber 2910 is one or more plasma generators 2912.

Figure 30:
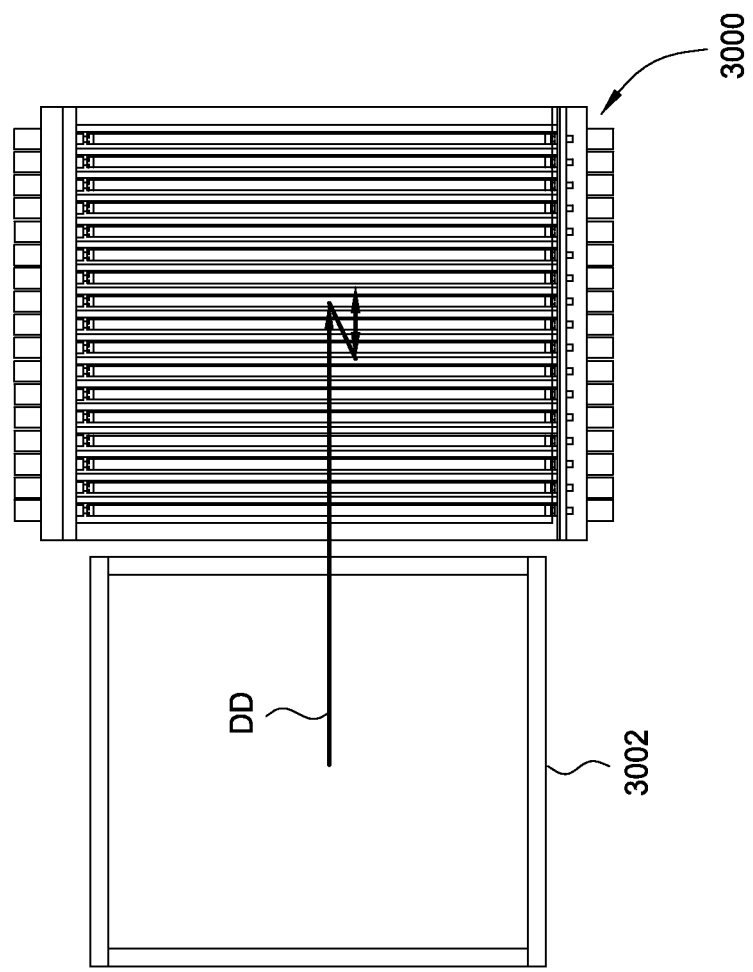

FIG. 30 is a schematic cross-sectional view of a processing chamber 3000 having a substrate carrier 3002 that passes in front thereof as shown by arrows "DD".

Figure 31:
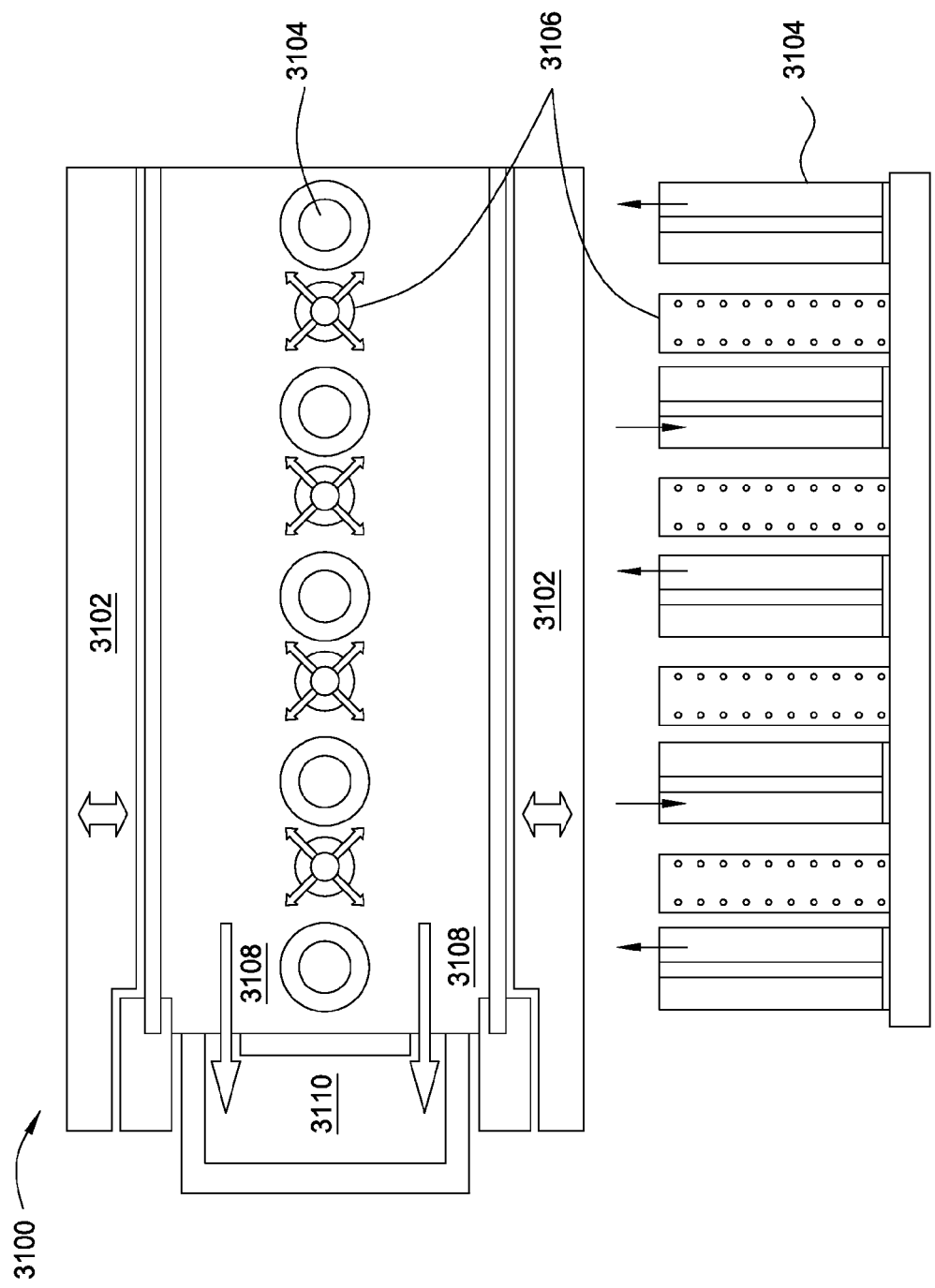
Figure 32:
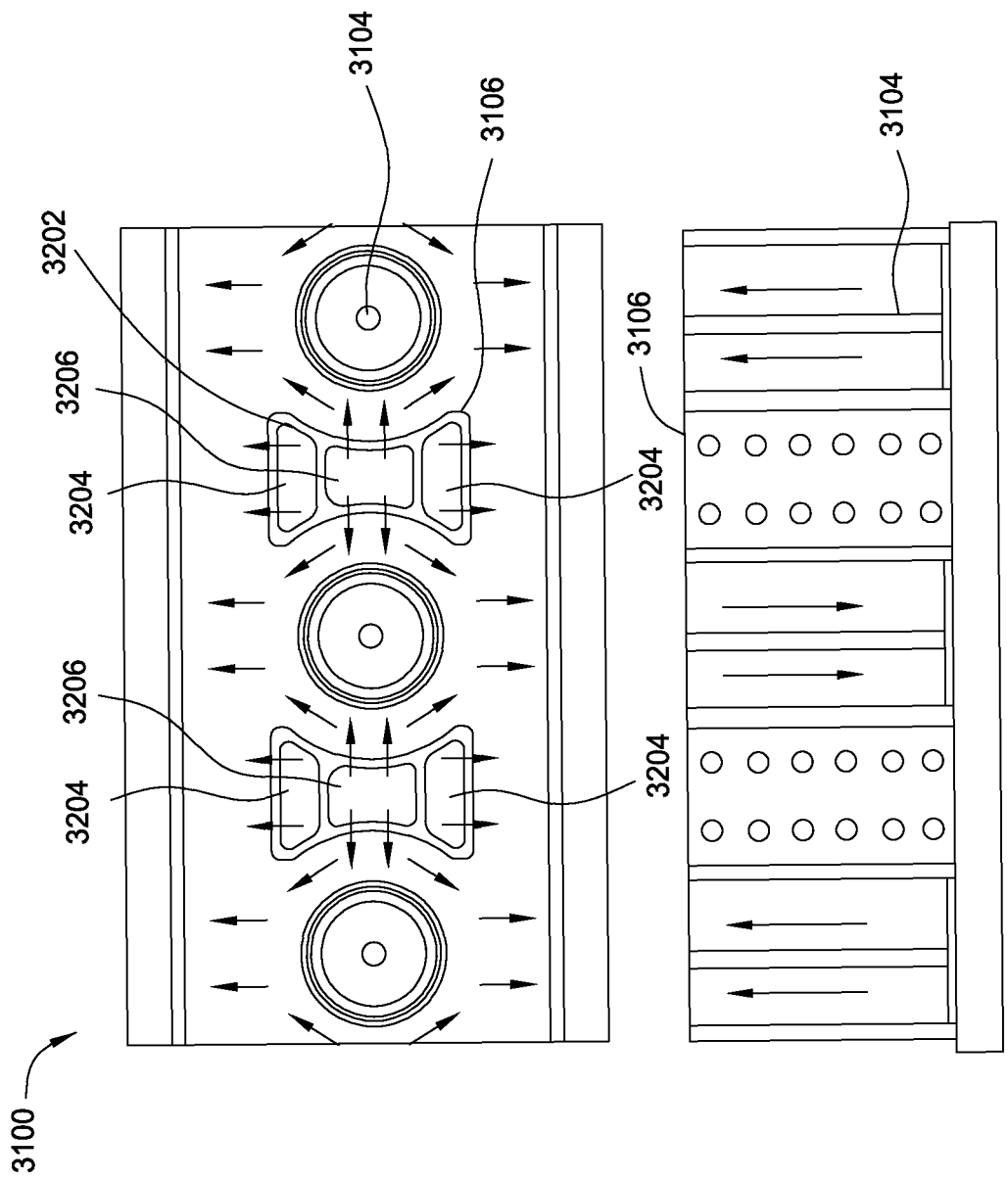

FIG. 31 is a schematic illustration of a processing chamber 3100 according to another embodiment. The processing chamber includes a substrate temperature stabilizer 3102 (i.e., a heater or cooler plate), one or more plasma generators 3104, process gas tubes 3106 that may comprise ceramic material, pumping ports 3108 and a pumping channel 3110. Cooling gas is delivered around the plasma generator 3104, which may be surrounded by a dielectric tube or a ceramic tube or quartz. FIG. 32 is a schematic illustration of the processing chamber 3100 showing the precursor gas delivered through ends 3204 gas introduction elements 3202 disposed between plasma generators 3104 and other precursor gas delivered through the center 3206 of the gas introduction elements.

Figure 33:
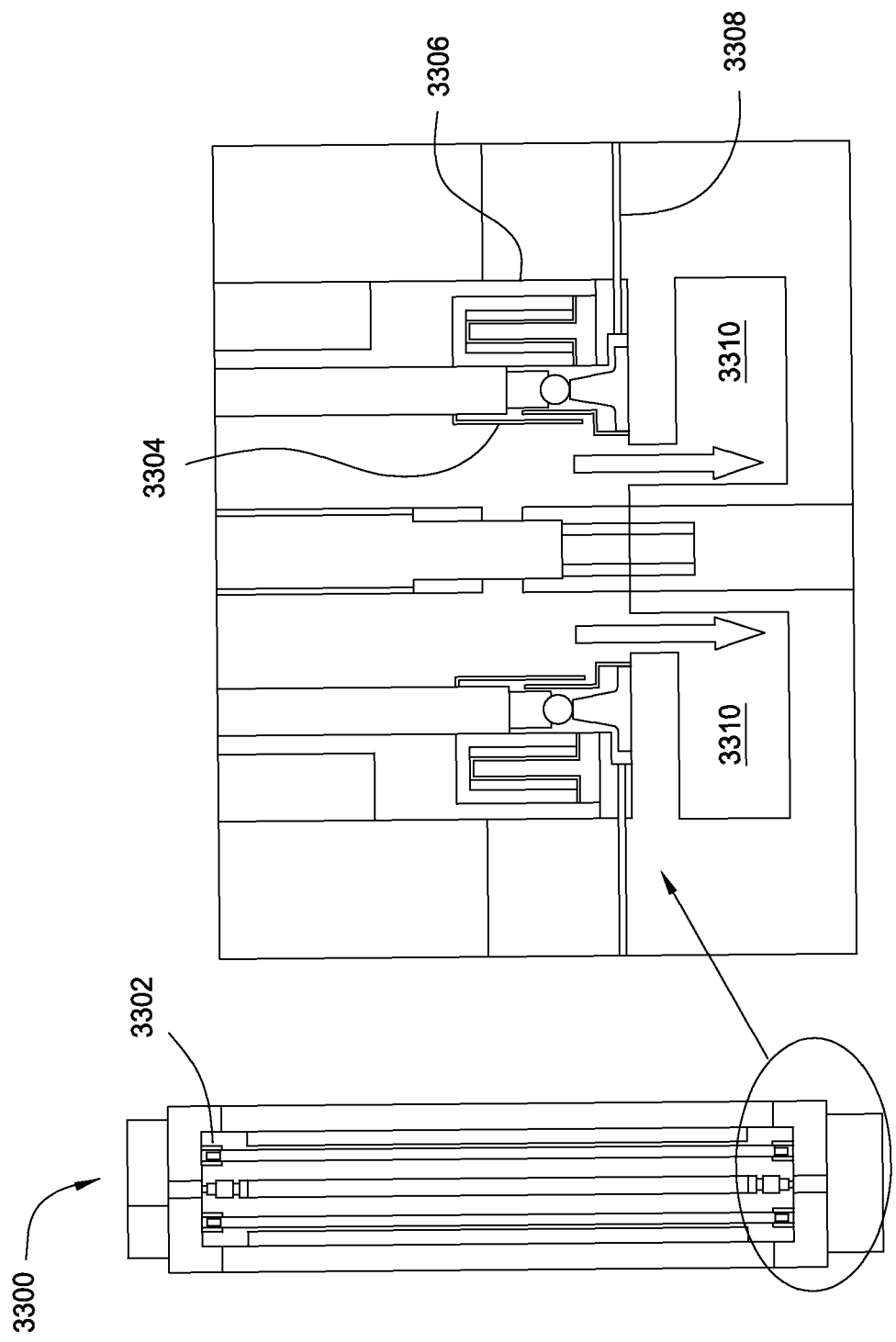

FIG. 33 is a schematic illustration of the bottom of a processing chamber 3300 according to one embodiment. The chamber 3300 includes a non-contact magnetic support for holding the substrate in place during processing, a processing gas seal 3304 to prevent introduction of processing gas into undesired areas of the chamber, a liner actuator stepping driving mechanism 3306, a purge gas line 3308 for introducing purge gas, and a pumping channel 3310 for evacuating the processing chamber 3300.

By utilizing a vertical CVD system, multiple substrates may be processed simultaneously. Processing multiple substrates simultaneously reduces the cost of manufacturing which may increase the manufacturer's profits.

While the foregoing is directed to embodiments of the present invention, other and further embodiments of the invention may be devised without departing from the basic scope thereof, and the scope thereof is determined by the claims that follow.

The invention claimed is:

1. An apparatus, comprising:
   a substrate loading station having a center wall, the substrate loading station having two substrate loading locations that are disposed on opposite sides of the center wall;
   a robot disposed directly adjacent to the substrate loading locations and operable to retrieve a horizontally oriented substrate from a substrate stacking module and to place the substrate into the substrate loading locations in a vertical orientation relative to the horizontal orientation;
   a load lock chamber coupled to the substrate loading station, the load lock chamber having two substrate locations that are disposed on opposite sides of the center wall;
   a processing chamber capable of high temperature processing coupled to the load lock chamber, the processing chamber having two substrate loading locations that are disposed on opposite sides of one or more processing sources;
   a substrate carrier service station coupled to the processing chamber; and
   a substrate carrier moveable between the substrate loading station, the load lock chamber, the processing chamber, and the substrate carrier service station, wherein in order to compensate for thermal expansion due to high temperature processing, each of the load lock chamber and the processing chamber comprises a fixed point and a foot portion slidable along a piece of low friction material and each of the loading station and the substrate carrier service station comprise a foot portion movable along a piece of low friction material, and wherein the foot portions of the loading station and the load lock chamber allow for movement of the loading station and the load lock chamber in a first direction and the foot portions of the processing chamber and the substrate carrier service station allow for movement of the processing chamber and the substrate carrier service station in a second direction opposite the first direction.

2. The apparatus of claim 1, wherein the one or more processing sources comprises a plurality of microwave sources.

3. The apparatus of claim 1, wherein the processing chamber has two lids, one corresponding to each opposite side of the center wall, and each lid is coupled to a vacuum source at four separate locations.

4. The apparatus of claim 3, wherein the two lids are each movable away from the center wall to expose the inside of the processing chamber and wherein tubes that couple the processing chamber to the vacuum source are movable with the lids.

5. The apparatus of claim 1, wherein the substrate loading station is an atmospheric station and wherein the load lock chamber and the processing chamber are vacuum chambers.

6. An apparatus, comprising:
two substrate loading stations, each station having a center wall, wherein each substrate loading station has two substrate loading locations that are disposed on opposite sides of the center wall;
two robots, wherein each robot is disposed directly adjacent the two substrate loading locations of each respective substrate loading station, each robot being operable to retrieve a horizontally oriented substrate from a substrate stacking module and place a substrate into each substrate loading location in a vertical orientation relative to the horizontal orientation;
two load lock chambers, each load lock chamber coupled to a corresponding substrate loading station, each load lock chamber having two substrate locations that are disposed on opposite sides of the center wall;
two processing chambers, each processing chamber coupled to a corresponding load lock chamber, each processing chamber having two substrate loading locations that are disposed on opposite sides of one or more processing sources;
two substrate carrier service stations, each substrate carrier service station coupled to a corresponding processing chamber; and
a plurality of substrate carriers moveable between the substrate loading stations, the load lock chambers, the processing chambers, and the substrate carrier service stations, wherein in order to compensate for thermal expansion due to high temperature processing, each of the load lock chambers and the processing chambers comprise a fixed point and a foot portion slidable along a piece of low friction material and each of the loading stations and the substrate carrier service stations comprise a foot portion movable along a piece of low friction material, and wherein the foot portions of the loading stations and the load lock chambers allow for movement of the loading stations and the load lock chambers in a first direction and the foot portions of the processing chambers and the substrate carrier service stations allow for movement of the processing chambers and the substrate carrier service stations in a second direction opposite the first direction.

7. The apparatus of claim 6, wherein the one or more processing sources comprises a plurality of microwave sources.

8. The apparatus of claim 6, wherein each processing chamber has two lids, one corresponding to each opposite side of the center wall, and each lid is coupled to a vacuum source at four separate locations.

9. The apparatus of claim 8, wherein the two lids are each movable away from the center wall to expose the inside of the processing chamber and wherein tubes that couple the processing chamber to the vacuum source are movable with the lids.

10. The apparatus of claim 6, wherein each substrate loading station is an atmospheric station and wherein each load lock chamber and each processing chamber are vacuum chambers.

* * * * *